(12) United States Patent
Sato et al.

(10) Patent No.: US 12,525,543 B1
(45) Date of Patent: *Jan. 13, 2026

(54) INTEGRATION PROCESS FOR FABRICATING EMBEDDED MEMORY

(71) Applicant: Kepler Computing Inc., San Francisco, CA (US)

(72) Inventors: Noriyuki Sato, Hillsboro, OR (US); Debraj Guhabiswas, Berkeley, CA (US); Tanay Gosavi, Portland, OR (US); Niloy Mukherjee, San Ramon, CA (US); Amrita Mathuriya, Portland, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 1055 days.

This patent is subject to a terminal disclaimer.

(21) Appl. No.: 17/449,796

(22) Filed: Oct. 1, 2021

Related U.S. Application Data

(63) Continuation of application No. 17/449,750, filed on Oct. 1, 2021.

(51) Int. Cl.
*H01L 23/538* (2006.01)
*H01L 23/00* (2006.01)
(Continued)

(52) U.S. Cl.
CPC ...... *H01L 23/5389* (2013.01); *H01L 23/5384* (2013.01); *H01L 24/82* (2013.01);
(Continued)

(58) Field of Classification Search
CPC . H01L 23/5389; H01L 24/82; H01L 25/0652; H01L 2225/06544; H10B 53/20; G11C 11/221
See application file for complete search history.

(56) References Cited

U.S. PATENT DOCUMENTS 5,471,363 A  11/1995 Mihara
5,705,414 A   1/1998 Lustig
(Continued)

FOREIGN PATENT DOCUMENTS

DE   102015015854 A1   6/2017
JP       2006352005 A  12/2006
(Continued)

OTHER PUBLICATIONS

Coll et al., "Nanocrystalline Ferroelectric BiFeO3 Thin Films by Low-Temperature Atomic Layer Deposition," Chem. Mater. 2015, 27, 18, 6322-6328Publication Date: Aug. 20, 2015. https://doi.org/10.1021/acs.chemmater.5b02093.
(Continued)

*Primary Examiner* — Davienne N Monbleau
*Assistant Examiner* — John Patrick Cornely
(74) *Attorney, Agent, or Firm* — MUGHAL GAUDRY & FRANKLIN PC

(57) ABSTRACT

An integration process including an etch stop layer for high density memory and logic applications and methods of fabrication are described. While various examples are described with reference to FeRAM, capacitive structures formed herein can be used for any application where a capacitor is desired. For instance, the capacitive structure can be used for fabricating ferroelectric based or paraelectric based majority gate, minority gate, and/or threshold gate.

17 Claims, 35 Drawing Sheets

(51) Int. Cl.
   *H01L 25/065* (2023.01)
   *H10B 53/20* (2023.01)
   *G11C 11/22* (2006.01)
(52) U.S. Cl.
   CPC ......... *H01L 25/0652* (2013.01); *H10B 53/20* (2023.02); *G11C 11/221* (2013.01); *H01L 2225/06544* (2013.01)

(56) References Cited

U.S. PATENT DOCUMENTS

| | | | |
|---|---|---|---|
| 5,739,563 | A | 4/1998 | Kawakubo et al. |
| 6,165,864 | A | 12/2000 | Shen et al. |
| 6,177,351 | B1 | 1/2001 | Beratan et al. |
| 6,211,035 | B1 | 4/2001 | Moise et al. |
| 6,365,927 | B1 | 4/2002 | Cuchiaro et al. |
| 6,368,910 | B1 | 4/2002 | Sheu et al. |
| 6,548,343 | B1 | 4/2003 | Summerfelt et al. |
| 6,613,586 | B2 | 9/2003 | Bailey |
| 6,699,725 | B2 | 3/2004 | Lee |
| 6,753,193 | B2 | 6/2004 | Kim |
| 7,075,134 | B2 | 7/2006 | Araujo et al. |
| 7,754,501 | B2 | 7/2010 | Urushido |
| 7,977,720 | B2 | 7/2011 | Fukada |
| 8,440,508 | B2 | 5/2013 | Udayakumar et al. |
| 8,916,872 | B1 | 12/2014 | Tran et al. |
| 9,847,338 | B2 | 12/2017 | Nakao |
| 9,875,784 | B1 | 1/2018 | Li et al. |
| 10,847,201 | B2 | 11/2020 | Manipatruni et al. |
| 11,043,472 | B1 | 6/2021 | Dokania et al. |
| 11,063,131 | B2 | 7/2021 | Haratipour et al. |
| 11,139,270 | B2 | 10/2021 | Manipatruni et al. |
| 11,164,976 | B2 | 11/2021 | Ramamoorthy et al. |
| 11,659,714 | B1 | 5/2023 | Mukherjee et al. |
| 2001/0013614 | A1 | 8/2001 | Joshi et al. |
| 2002/0045279 | A1 | 4/2002 | Kwon et al. |
| 2002/0098645 | A1* | 7/2002 | Jung ............... H10B 53/30 257/E21.664 |
| 2003/0030084 | A1 | 2/2003 | Moise et al. |
| 2005/0020054 | A1 | 1/2005 | Hilliger et al. |
| 2006/0133129 | A1 | 6/2006 | Rodriguez et al. |
| 2007/0045690 | A1 | 3/2007 | Fukada |
| 2007/0232016 | A1 | 10/2007 | Hayashi et al. |
| 2008/0057641 | A1 | 3/2008 | Wang |
| 2008/0121956 | A1 | 5/2008 | Kanaya |
| 2008/0121959 | A1 | 5/2008 | Izumi |
| 2008/0197502 | A1 | 8/2008 | Kikuchi et al. |
| 2009/0026514 | A1 | 1/2009 | Wang |
| 2009/0032978 | A1 | 2/2009 | Bucchignano et al. |
| 2010/0102404 | A1 | 4/2010 | Li et al. |
| 2010/0224961 | A1 | 9/2010 | Summerfelt et al. |
| 2010/0320518 | A1 | 12/2010 | Ozaki |
| 2011/0062550 | A1 | 3/2011 | Udayakumar et al. |
| 2013/0149794 | A1 | 6/2013 | Wang |
| 2013/0264620 | A1 | 10/2013 | Yu et al. |
| 2020/0051833 | A1 | 2/2020 | Chen et al. |
| 2020/0075857 | A1* | 3/2020 | Chou ............... H10N 70/8833 |
| 2020/0235111 | A1 | 7/2020 | Calderoni et al. |
| 2020/0395460 | A1 | 12/2020 | Haratipour et al. |
| 2021/0082928 | A1 | 3/2021 | Chen et al. |
| 2021/0202510 | A1 | 7/2021 | Thareja et al. |
| 2021/0202511 | A1 | 7/2021 | Yeong et al. |
| 2021/0202689 | A1 | 7/2021 | Thareja et al. |
| 2021/0233920 | A1 | 7/2021 | Sukekawa |
| 2021/0272896 | A1 | 9/2021 | Lin et al. |
| 2021/0343731 | A1 | 11/2021 | Chen et al. |
| 2021/0398991 | A1 | 12/2021 | Manfrini et al. |
| 2021/0398992 | A1 | 12/2021 | Wu et al. |
| 2022/0199634 | A1 | 6/2022 | Calderoni et al. |
| 2022/0285376 | A1* | 9/2022 | Chen ............... H10B 53/40 |
| 2022/0344338 | A1 | 10/2022 | Yang et al. |
| 2022/0376075 | A1 | 11/2022 | Manfrini et al. |
| 2022/0399352 | A1 | 12/2022 | Leng |
| 2023/0067555 | A1 | 3/2023 | Sato et al. |
| 2023/0187476 | A1 | 6/2023 | Sato et al. |
| 2023/0189532 | A1 | 6/2023 | Müller |

FOREIGN PATENT DOCUMENTS

| | | |
|---|---|---|
| JP | 4428500 B2 | 3/2010 |
| KR | 100481867 B1 | 4/2005 |
| KR | 100601953 B1 | 7/2006 |
| KR | 100791074 B1 | 1/2008 |
| KR | 100901950 B1 | 6/2009 |
| WO | 2004076166 A2 | 9/2004 |

OTHER PUBLICATIONS

Chowdhury et al., "Alumina as a Hydrogen Barrier Layer for FeRAM Devices," 2007 Non-Volatile Memory Technology Symposium, 2007, pp. 49-52, doi: 10.1109/NVMT.2007.4389944.

Mauersberger et al., "Single-Step Reactive Ion Etching Process for Device integration of Hafnium-Zirconium-Oxide (HZO)/Titanium Nitride (TiN) Stacks." 2021 Semicond. Sci. Technol. 36 095025, https://doi.org/10.1088/1361-6641/ac1827 (7 pages).

Walters, "Scaling and Design of Thin Film Ferroelectric Hafnium Oxide for Memory and Logic Devices," Dissertation for PhD Philosophy, University of Florida, 2020 (170 pages).

Yeh et al., "Fabrication and Investigation of Three-Dimensional Ferroelectric Capacitors for the Application of FeRAM," AIP Advances, 6 035128(2016); doi: 10.1063/1.4945405. 13 pages.

Yu et al., "Atomic layer deposited ultrathin metal nitride barrier layers for ruthenium interconnect applications" Journal of Vacuum Science & Technology A 35, 03E109 (2017); https://doi.org/10.1116/1.4979709.

U.S. Appl. No. 17/396,609, filed Aug. 6, 2021, Debraj Guhabiswas.

U.S. Appl. No. 17/449,750, filed Oct. 1, 2021, Noriyuki Sato.

Final Office Action notified Apr. 6, 2023 for U.S. Appl. No. 17/396,609.

Final Office Action notified Jul. 19, 2023 for U.S. Appl. No. 17/478,849.

Final Office Action notified Sep. 14, 2023 for U.S. Appl. No. 17/465,792.

First Office Action mailed Nov. 3, 2023 for TW Patent Application No. 111132919 Office Action recalled for typographical errors.

First Office Action mailed Nov. 14, 2023 for TW Patent Application No. 111132919 Office Action issued on Nov. 3, 2023 recalled for typographical errors.

Non-Final Office Action notified Apr. 25, 2023 for U.S. Appl. No. 17/478,850.

Non-Final Office Action notified Aug. 3, 2023 for U.S. Appl. No. 17/552,293.

Non-Final Office Action notified Aug. 3, 2023 for U.S. Appl. No. 17/552,323.

Non-Final Office Action notified Aug. 3, 2023 for U.S. Appl. No. 17/552,345.

Non-Final Office Action notified Aug. 15, 2023 for U.S. Appl. No. 17/552,269.

Non-Final Office Action notified Dec. 8, 2022 for U.S. Appl. No. 17/396,609.

Non-Final Office Action notified Dec. 21, 2023 for U.S. Appl. No. 17/465,792.

Non-Final Office Action notified Jul. 20, 2023 for U.S. Appl. No. 17/50,899.

Non-Final Office Action notified Jul. 20, 2023 for U.S. Appl. No. 17/552,266.

Non-Final Office Action notified Jul. 20, 2023 for U.S. Appl. No. 17/552,330.

Non-Final Office Action notified Mar. 31, 2023 for U.S. Appl. No. 17/465,792.

Non-Final Office Action notified Mar. 31, 2023 for U.S. Appl. No. 17/478,849.

Notice of Allowance notified Aug. 7, 2023 for U.S. Appl. No. 17/,85850.

Notice of Allowance notified Aug. 7, 2023 for U.S. Appl. No. 17/553,486.

Notice of Allowance notified Aug. 7, 2023 for U.S. Appl. No. 17/553,496.

(56) References Cited

OTHER PUBLICATIONS

Notice of Allowance notified Aug. 10, 2023 for U.S. Appl. No. 17/553,475.
Notice of Allowance notified Aug. 11, 2023 for U.S. Appl. No. 17/478,849.
Notice of Allowance notified Dec. 7, 2023 for U.S. Appl. No. 17/552,330.
Notice of Allowance notified Dec. 12, 2023 for U.S. Appl. No. 17/552,321.
Notice of Allowance notified Dec. 28, 2023 for U.S. Appl. No. 17/552,269.
Notice of Allowance notified Dec. 28, 2023 for U.S. Appl. No. 17/552,293.
Notice of Allowance notified Jul. 3, 2023 for U.S. Appl. No. 17/550,904.
Notice of Allowance notified Jul. 17, 2023 for U.S. Appl. No. 17/553,480.
Notice of Allowance notified Jul. 19, 2023 for U.S. Appl. No. 17/553,508.
Notice of Allowance notified Jul. 20, 2023 for U.S. Appl. No. 17/553,469.
Notice of Allowance notified Jul. 24, 2023 for U.S. Appl. No. 17/553,472.
Notice of Allowance notified Jul. 26, 2023 for U.S. Appl. No. 17/553,511.
Notice of Allowance notified Jun. 15, 2023 for U.S. Appl. No. 17/396,609.
Notice of Allowance notified Nov. 13, 2023 for U.S. Appl. No. 17/465,796.
Notice of Allowance notified Nov. 22, 2023 for U.S. Appl. No. 17/550,899.
Notice of Allowance notified Nov. 29, 2023 for U.S. Appl. No. 17/552,266.
Office Action notified May 16, 2023 for Taiwan Patent Application No. 111132920.
Restriction Requirement notified Apr. 26, 2023 for U.S. Appl. No. 17/550,899.
Restriction Requirement notified Apr. 26, 2023 for U.S. Appl. No. 17/552,266.
Restriction Requirement notified Apr. 26, 2023 for U.S. Appl. No. 17/552,321.
Restriction Requirement notified Aug. 22, 2022 for U.S. Appl. No. 17/396,609.
Restriction Requirement notified Dec. 30, 2022 for U.S. Appl. No. 17/465,92.
Restriction Requirement notified Jan. 11, 2023 for U.S. Appl. No. 17/478,849.
Restriction Requirement notified Jul. 13, 2023 for U.S. Appl. No. 17/552,269.
Restriction Requirement notified May 1, 2023 for U.S. Appl. No. 17/552,330.
Restriction Requirement notified May 1, 2023 for U.S. Appl. No. 17/552,345.
Restriction Requirement notified Sep. 14, 2023 for U.S. Appl. No. 17/465,796.
Non-Final Office Action notified Aug. 1, 2024 for U.S. Appl. No. 18/450,499.
Non-Final Office Action notified Jan. 18, 2024 for U.S. Appl. No. 17/502,942.
Non-Final Office Action notified Jan. 19, 2024 for U.S. Appl. No. 17/503,009.
Non-Final Office Action notified Mar. 15, 2024 for U.S. Appl. No. 17/485,161.
Notice of Allowance notified Apr. 3, 2024 for U.S. Appl. No. 17/465,792.
Notice of Allowance notified Feb. 16, 2024 for Taiwan Patent Application No. 111132919.
Notice of Allowance notified Jan. 18, 2024 for U.S. Appl. No. 17/552,323.
Notice of Allowance notified Jan. 24, 2024 for U.S. Appl. No. 17/552,345.
Notice of Allowance notified Jul. 10, 2024 for U.S. Appl. No. 17/485,161.
Notice of Allowance notified May 6, 2024 for U.S. Appl. No. 17/503,009.
Notice of Allowance notified May 8, 2024 for U.S. Appl. No. 17/502,942.
Office Action—Written Primary Examination Decision—notified Jan. 10, 2024 for Taiwan Patent Application No. 111132920.
Restriction Requirement notified Apr. 18, 2024 for U.S. Appl. No. 18/450,499.
Restriction Requirement notified Jun. 4, 2024 for U.S. Appl. No. 17/485,147.
Restriction Requirement notified May 17, 2024 for U.S. Appl. No. 17/449,750.
Desu et al., "Reactive ion etching of ferroelectric SrBi2TaxNb2—xO9 thin films," Appl. Phys. Lett. 68, 566 (1996); https://doi.org/10.1063/1.116402. (3 pages).
Lee et al., "Plasma-Assisted Dry Etching of Ferroelectric Capacitor Modules and Application to a 32M Ferroelectric Random Access Memory Devices with Submicron Feature Size," Japanese Journal of Applied Physics, vol. 41, No. 11S, 2002. pp. 6749-6753. (5 pages).
News Release Jun. 22, 2021, "Perovskite memory devices with ultra-fast switching speed," Pohang University of Science & Technology (POSTech), Downloaded on Oct. 19, 2021 from https://www.eurekalert.org/news-releases/603724. (2 pages).
Schneider et al., "Dry-etching of barium-strontium-titanate thin films," Proceedings of the 11th IEEE International Symposium on Applications of Ferroelectrics (Cat. No. 98CH36245) (pp. 51-54). IEEE. Aug. 1998. DOI: 10.1109/ISAF.1998.786634. (4 pages).
Shi et al., "Reactive ion etching of sol-gel-derived BST thin film," Ceramics International vol. 30, Iss. 7, 2004, pp. 1513-1516. (4 pages).
Ueda et al., "Plasma etching of PZT capacitor using ISM plasma source for ferroelectric memory application," Integrated Ferroelectrics, 39:1-4, 23-30, DOI: 10.1080/10584580108011924. (8 pages).
Wang et al., "Ferroelectric Devices and Circuits for Neuro-Inspired Computing," MRS Communications (2020), 10, 538-548, doi: 10.1557/mrc.2020.71, (11 pages).

* cited by examiner

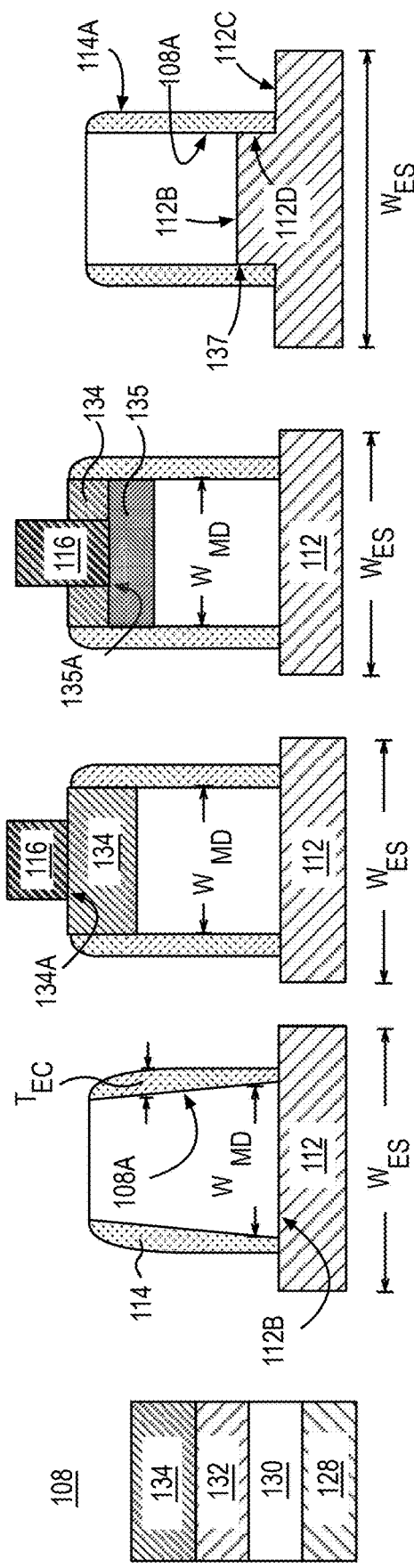

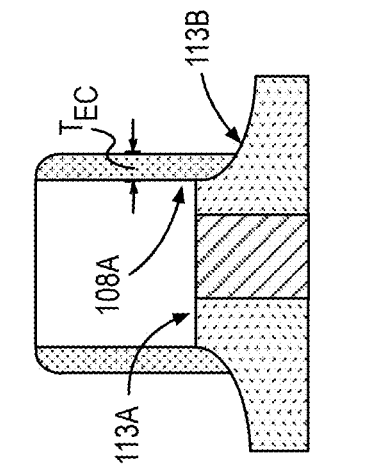
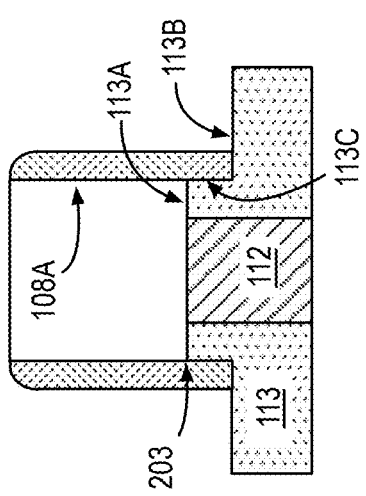
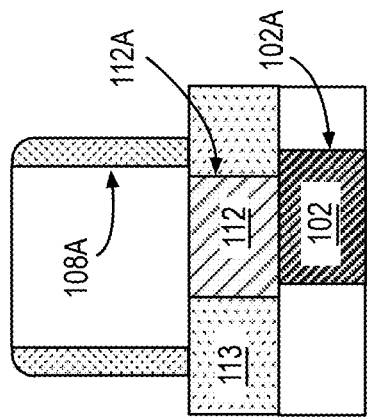
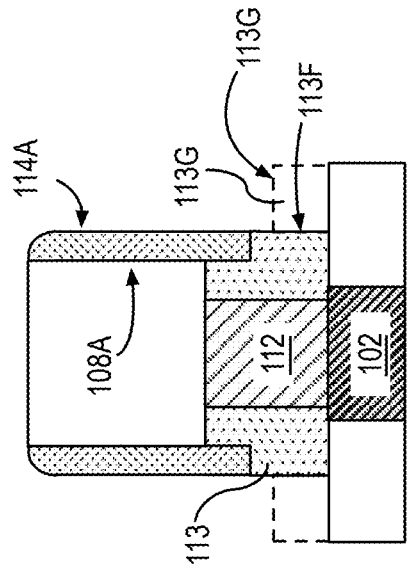
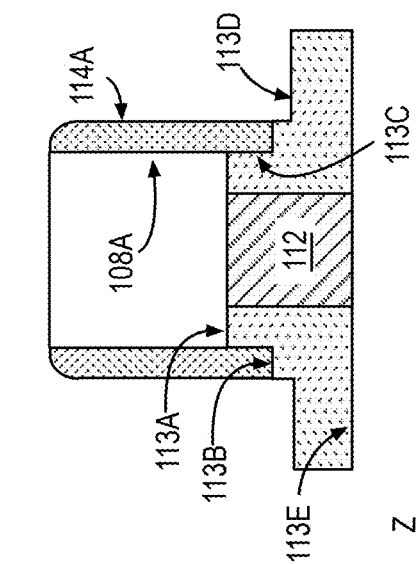

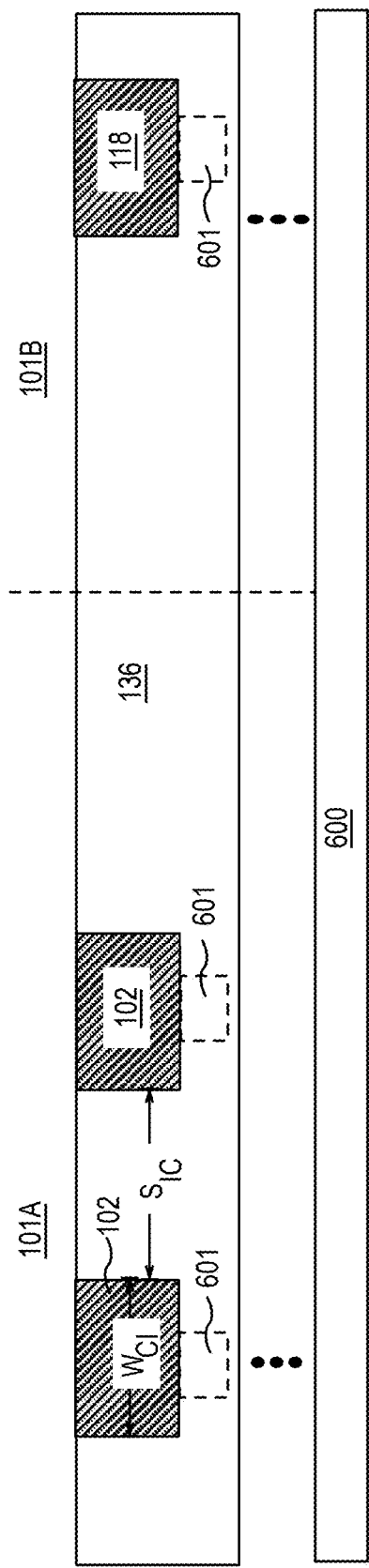
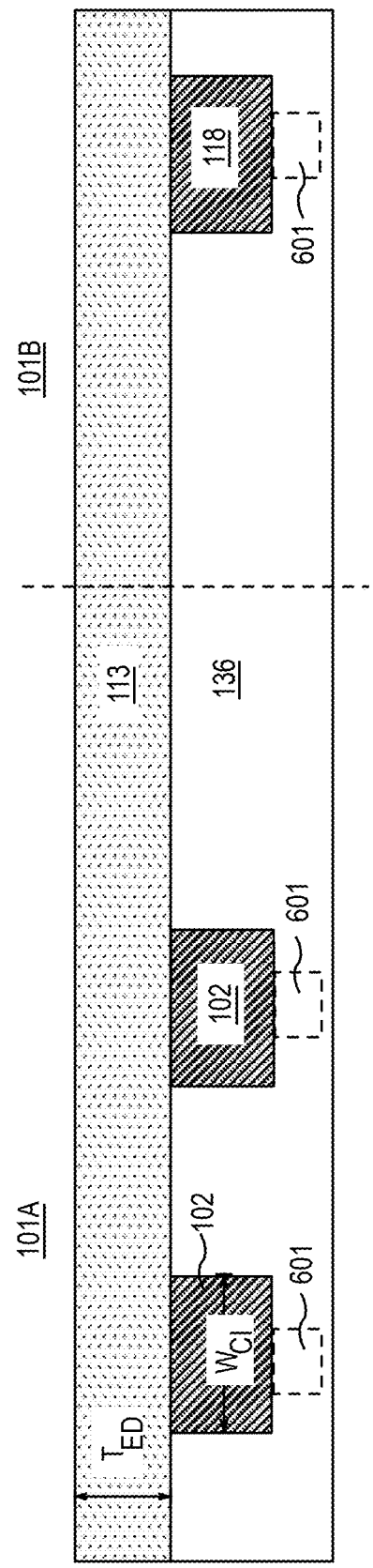
FIG. 6A
FIG. 6B

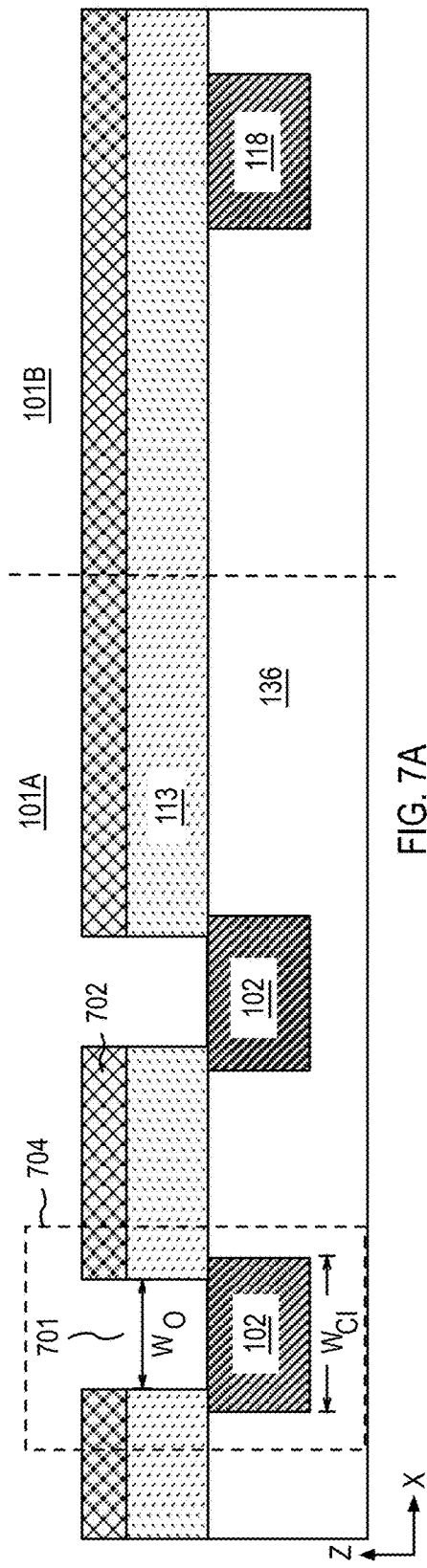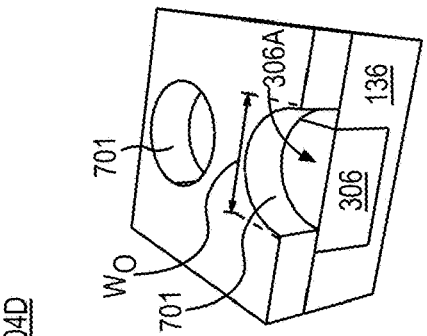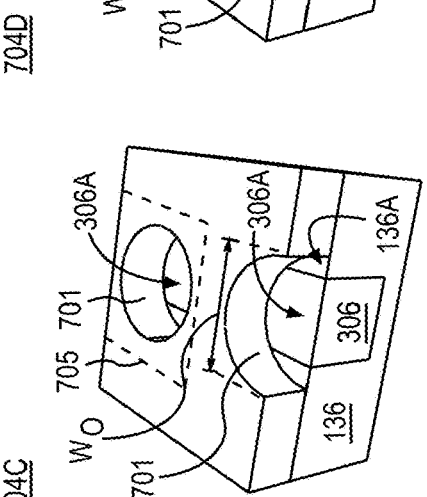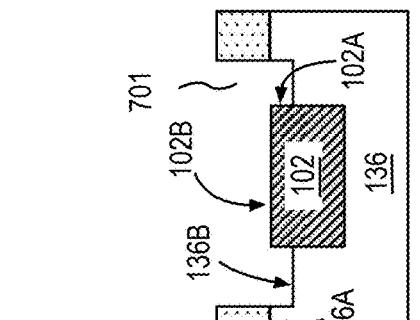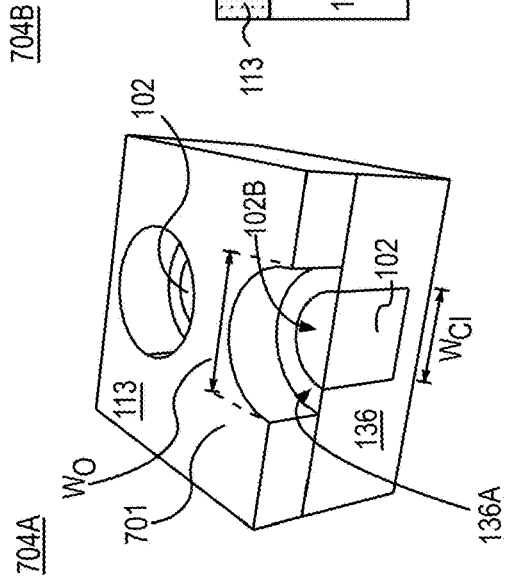

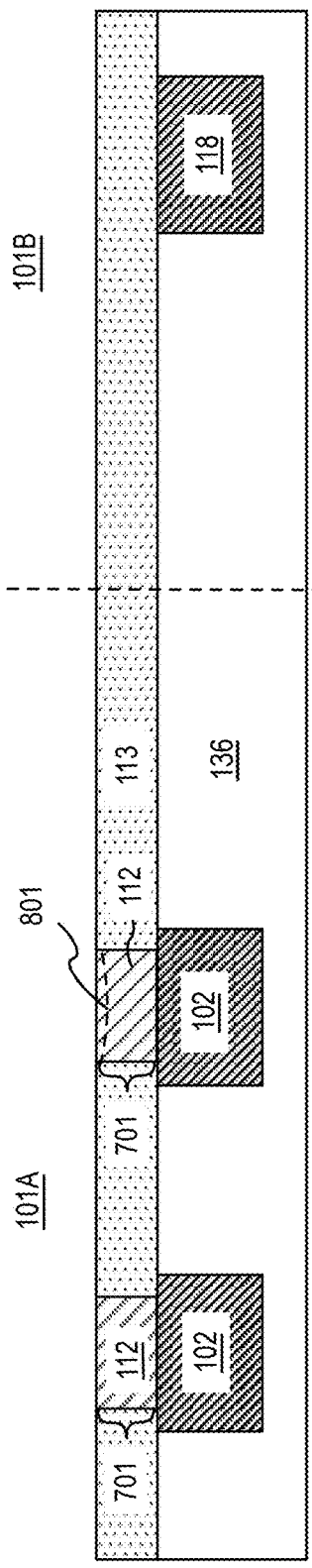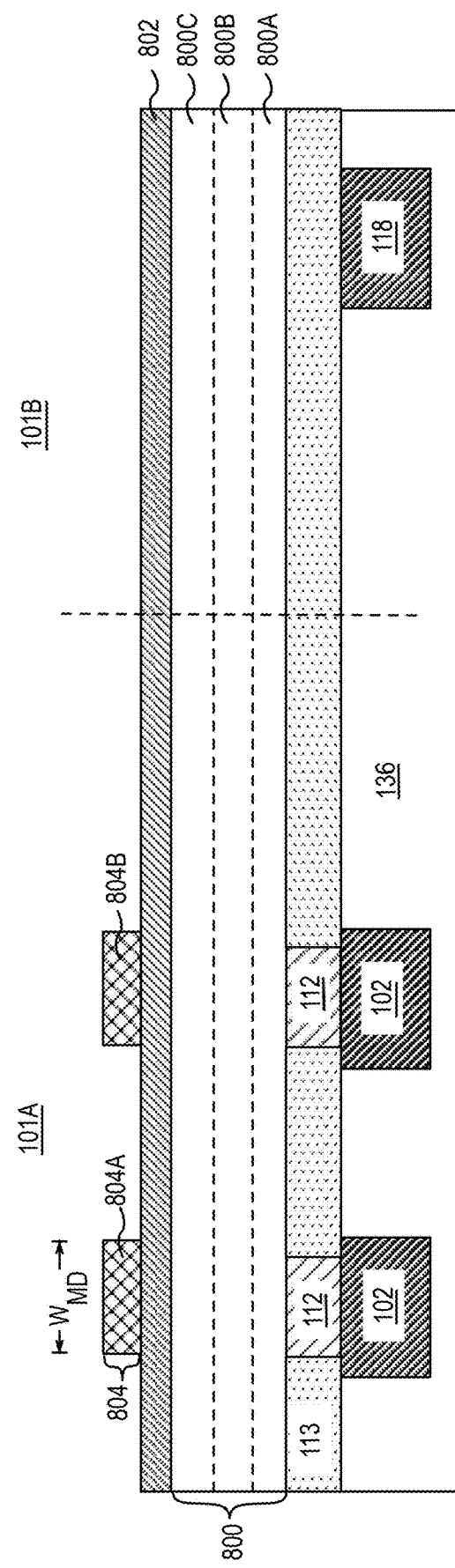

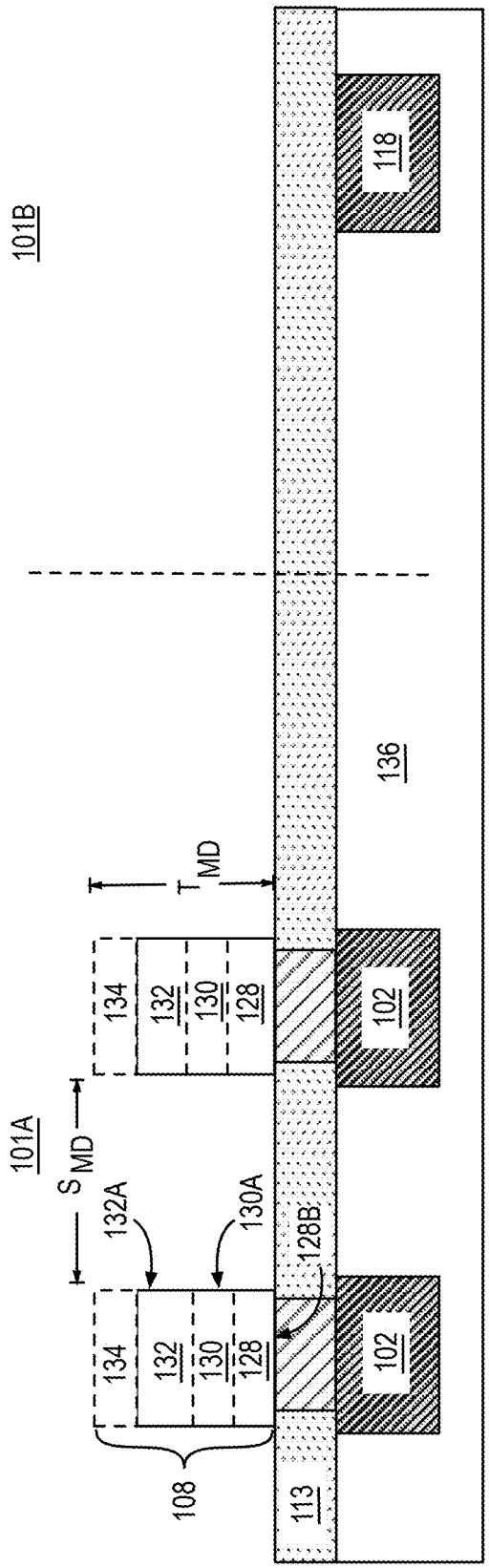
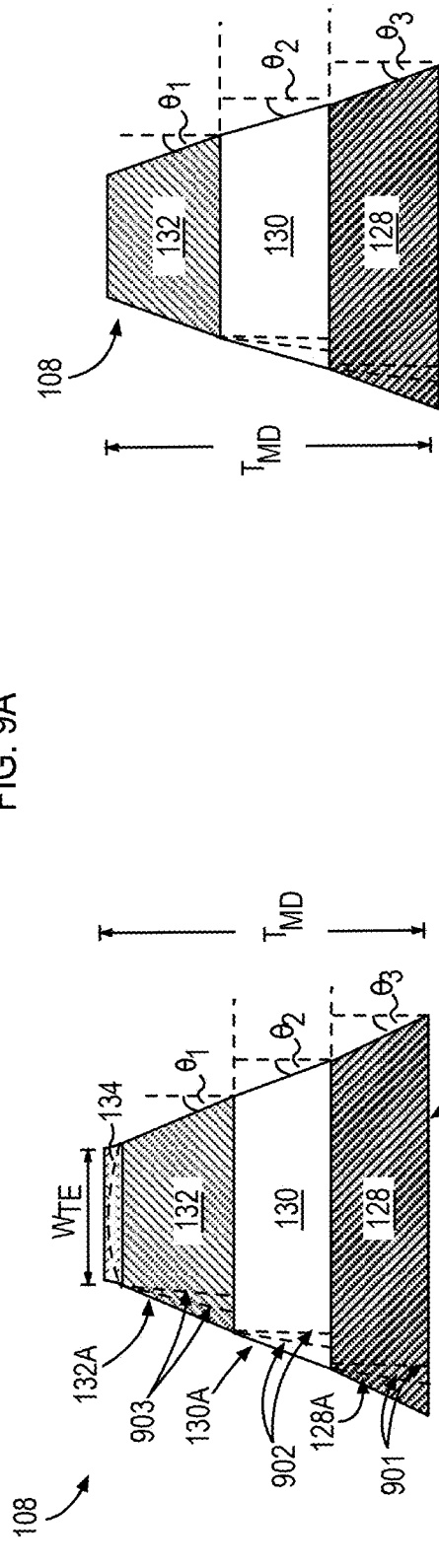
FIG. 9A
FIG. 9B
FIG. 9C

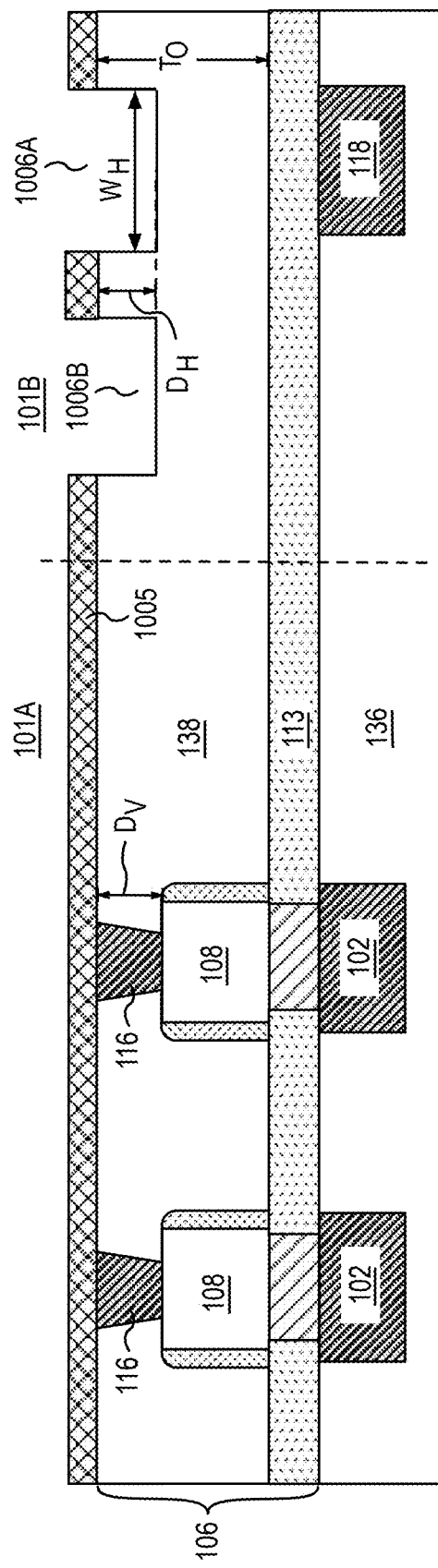
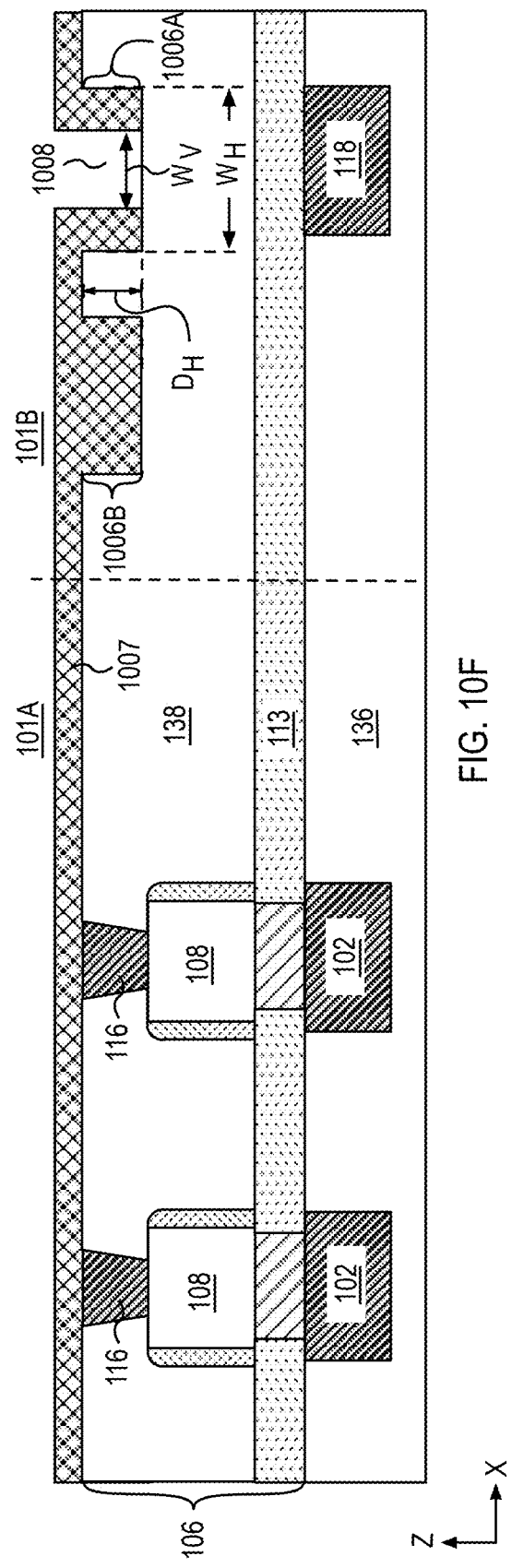
FIG. 10E
FIG. 10F

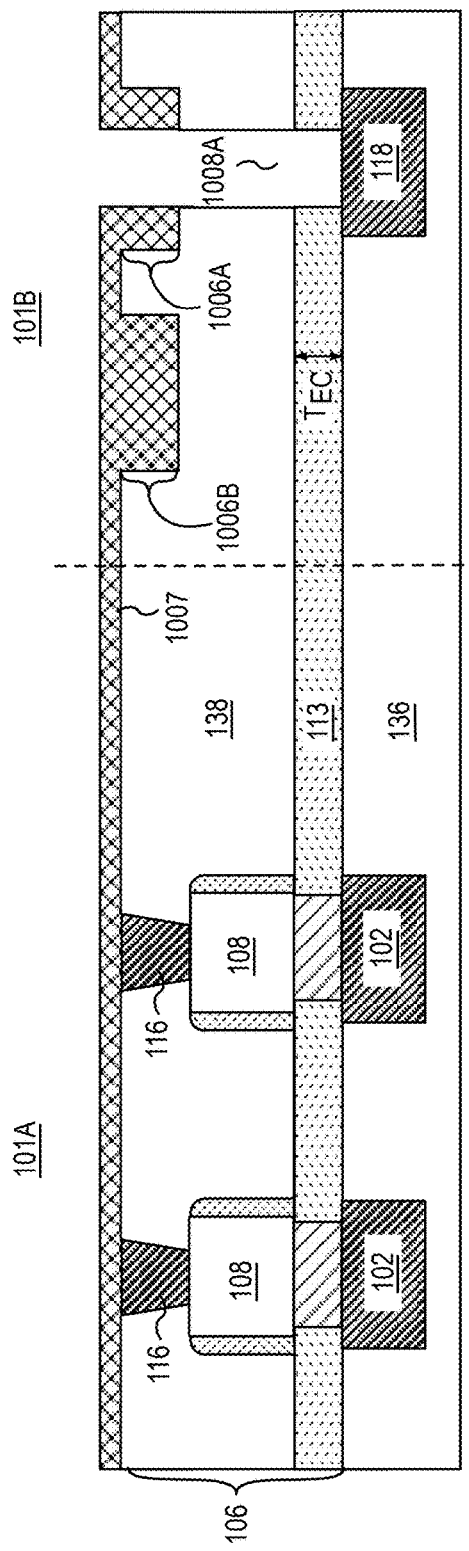
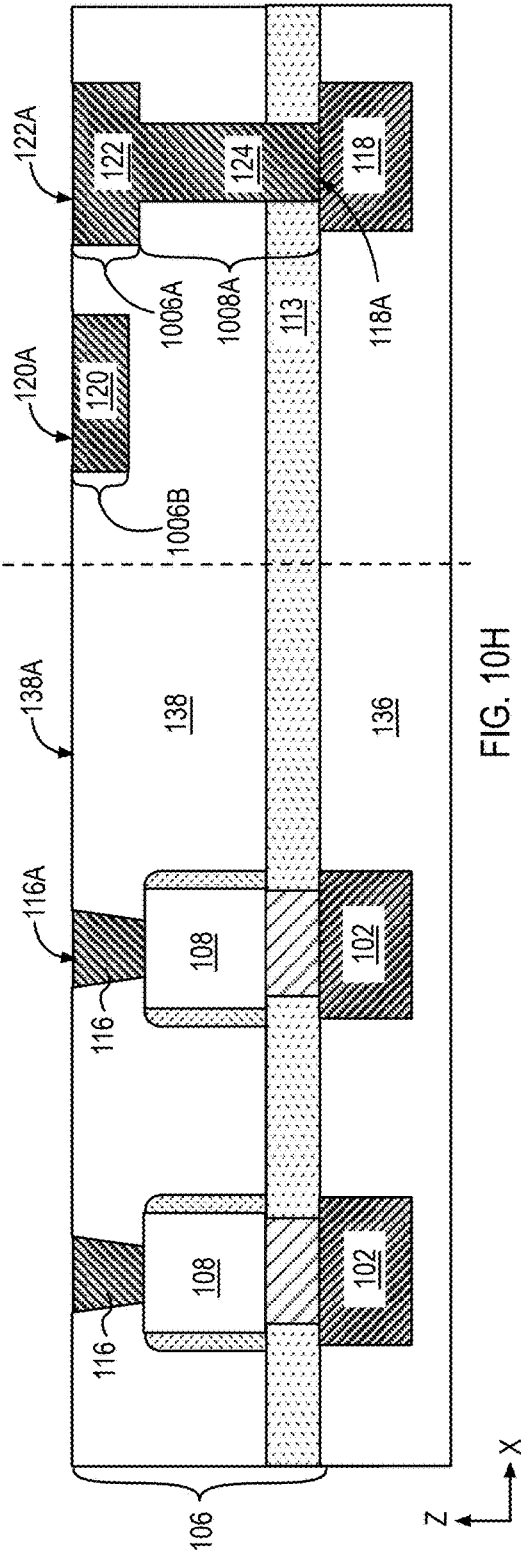
FIG. 10G
FIG. 10H

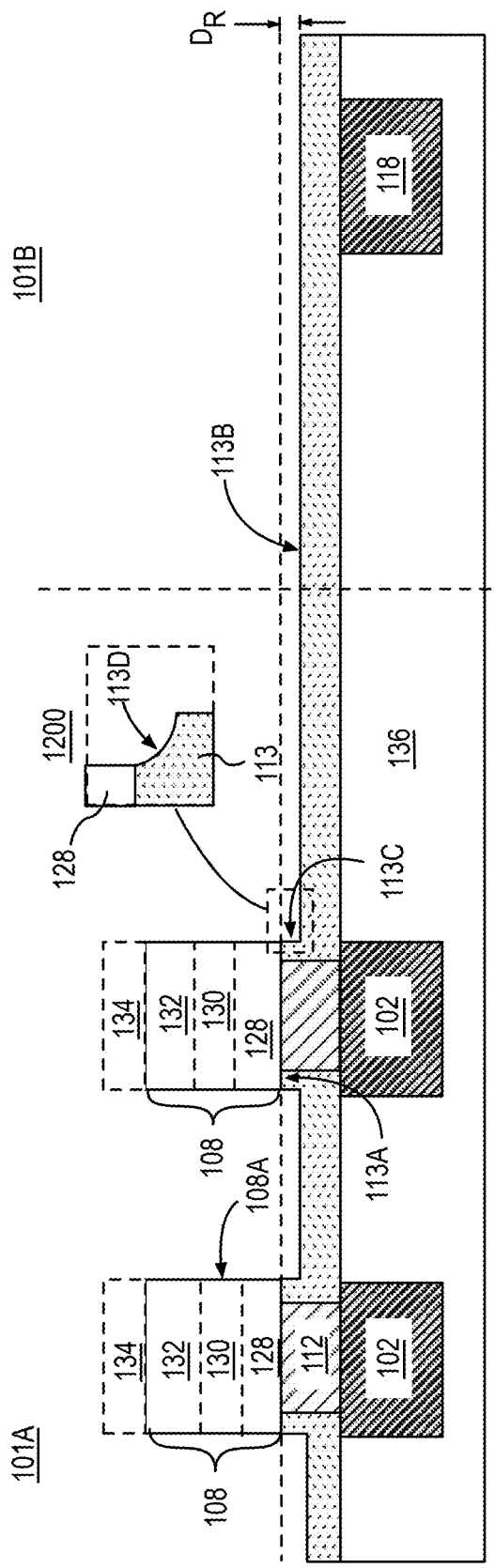
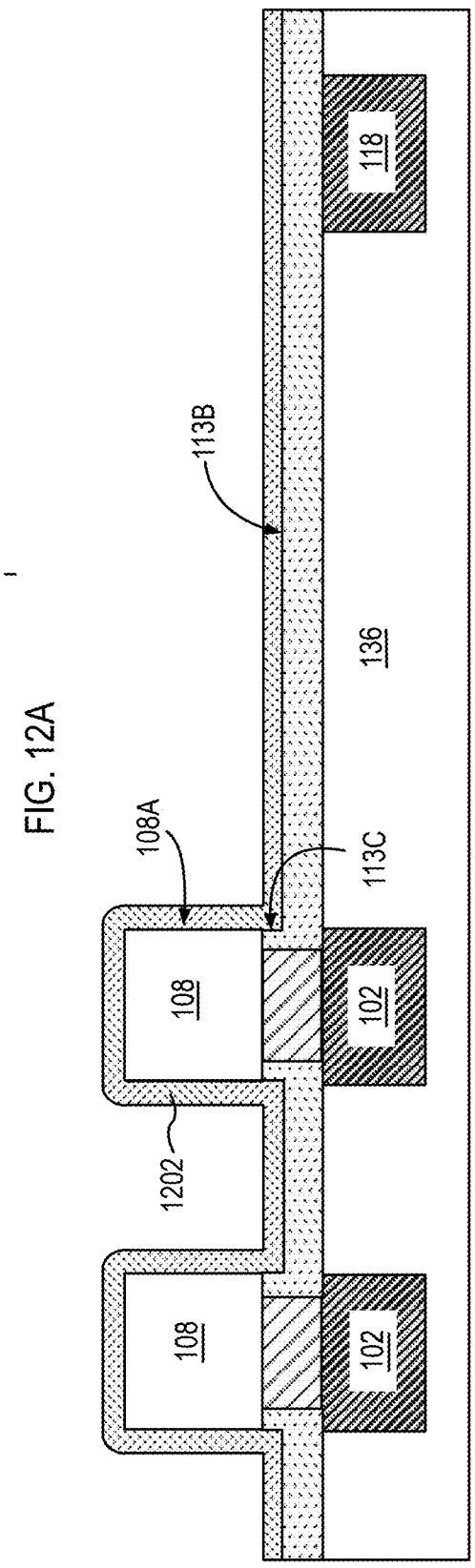
FIG. 12A
FIG. 12B

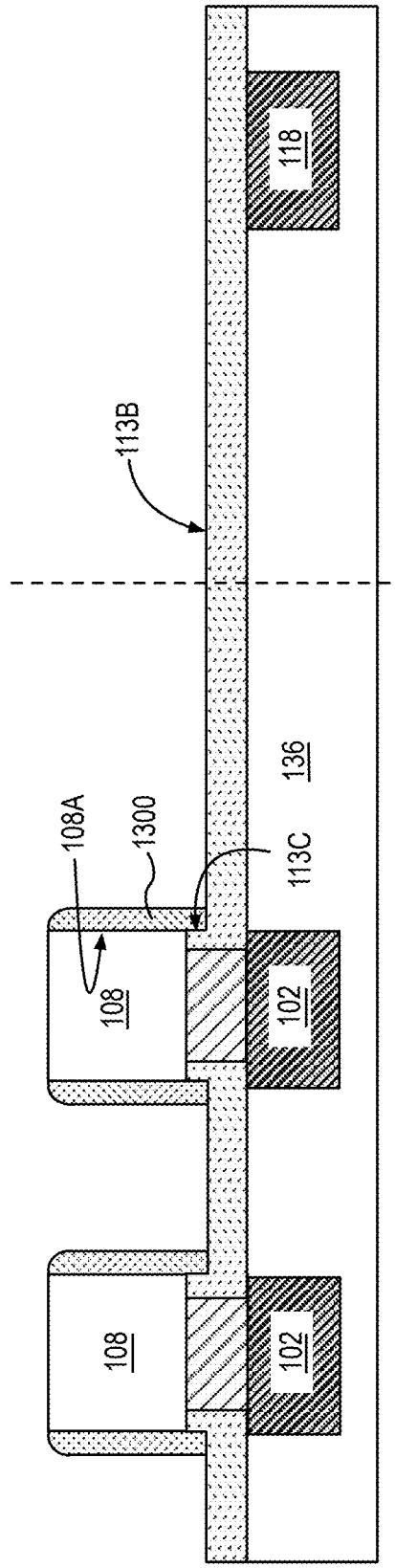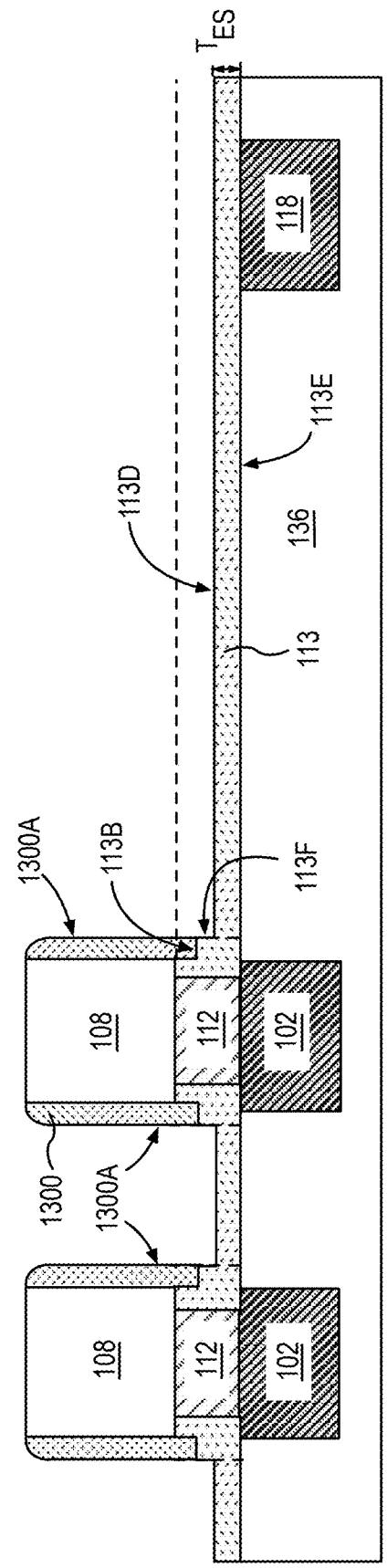
FIG. 13A
FIG. 13B

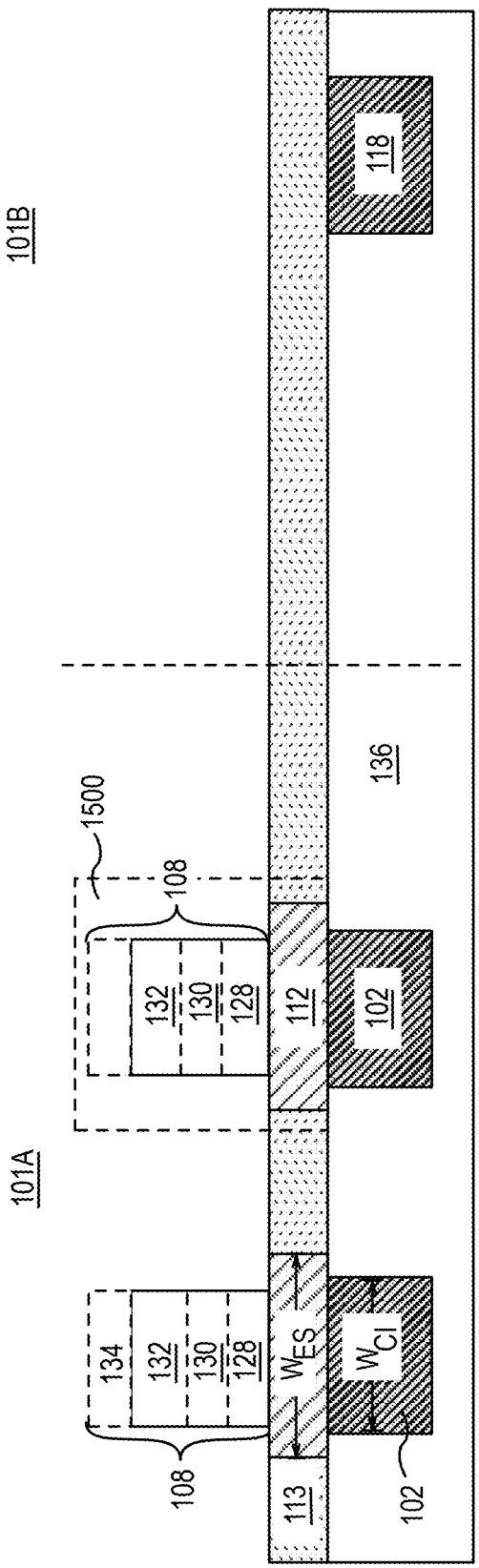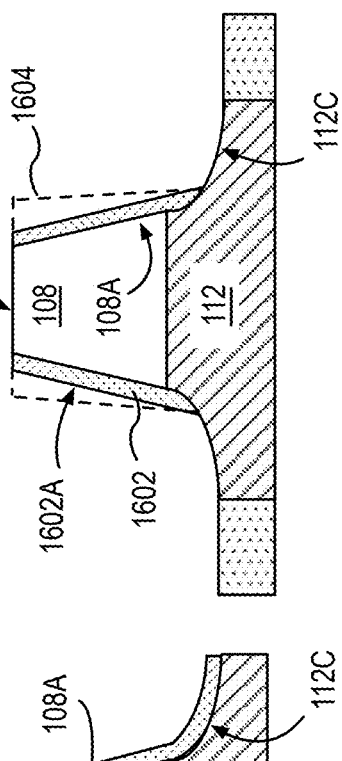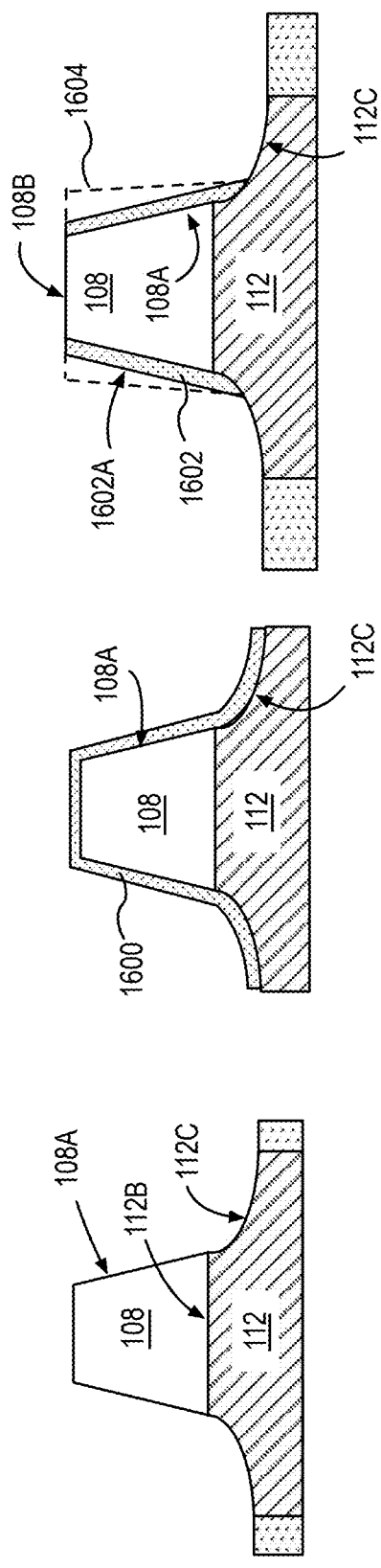
FIG. 15A
FIG. 15B
FIG. 16A
FIG. 16B

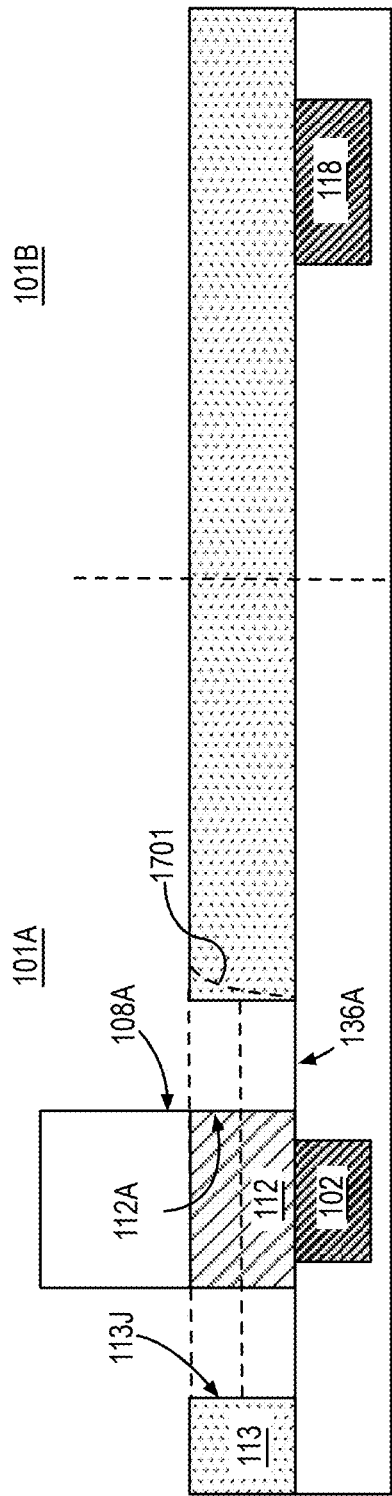
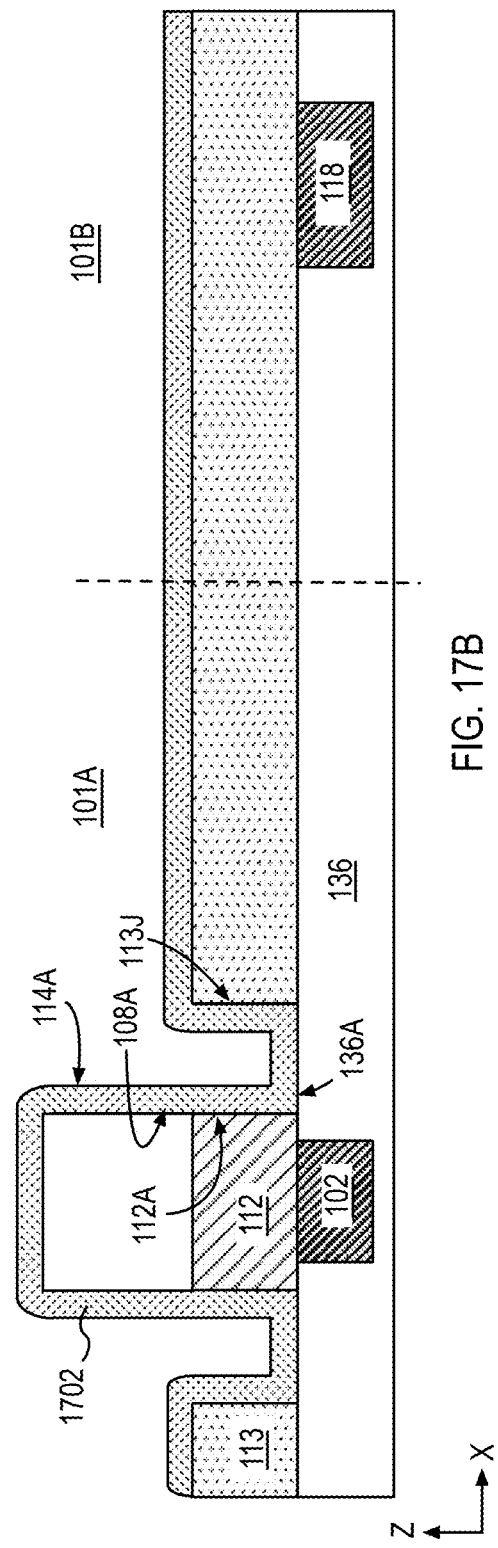
FIG. 17A
FIG. 17B

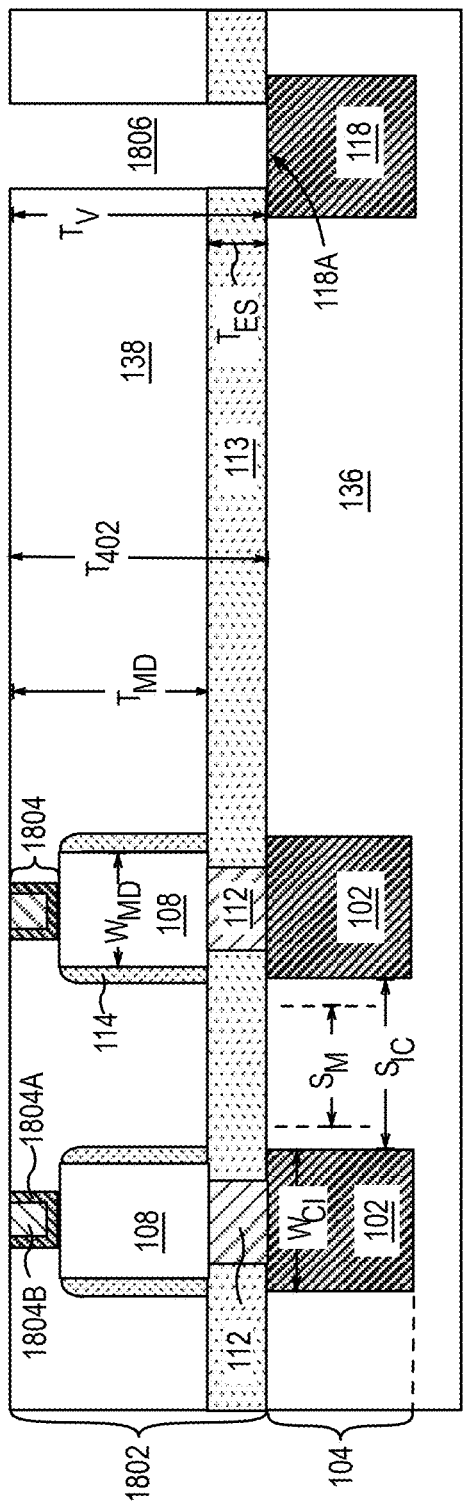
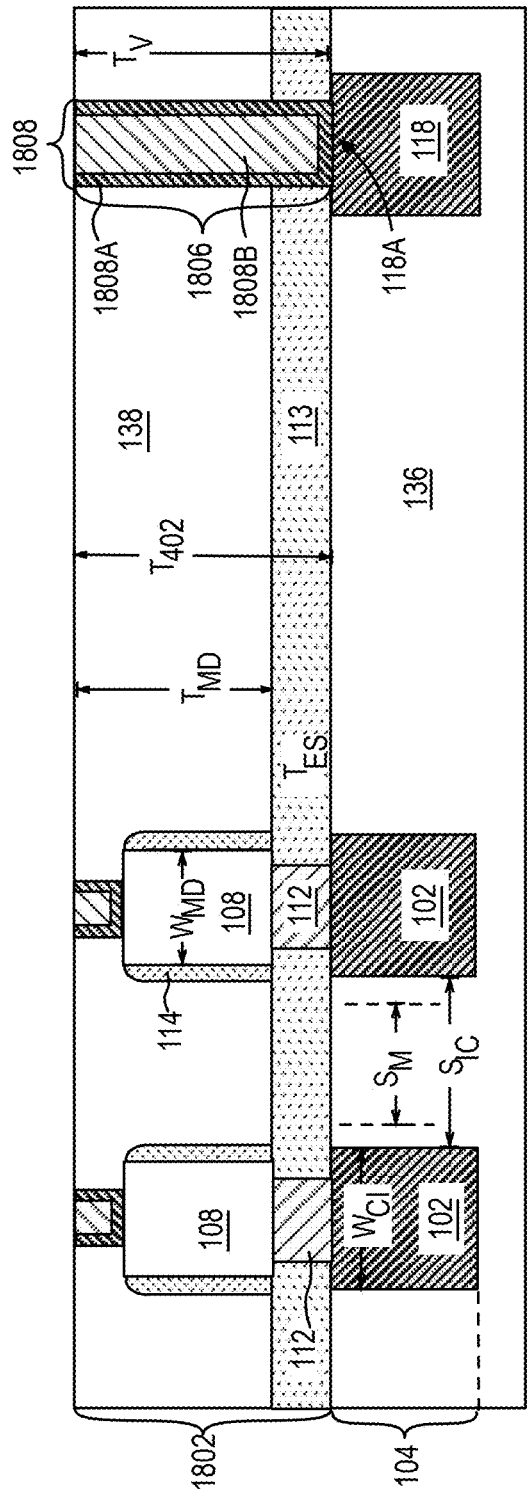
FIG. 18B
FIG. 18C

INTEGRATION PROCESS FOR FABRICATING EMBEDDED MEMORY

CLAIM OF PRIORITY

This application is a continuation of U.S. patent application Ser. No. 17/449,750 titled "AN ETCH STOP LAYER BASED INTEGRATION PROCESS FOR EMBEDDED MEMORY," filed Oct. 1, 2021, and which is incorporated by reference in its entirety.

BACKGROUND

Integration of random-access memory (RAM) devices including (ferroelectric or paraelectric materials) on a same plane as interconnects of logic devices can be challenging. RAM devices include materials that have a variety of thicknesses and are difficult to etch. Targeting a device thickness in a memory region with a height constraint of interconnects in an adjacent logic region is challenging. As such alternate methods to pattern and form devices and alternative enabling integration methods essential for realizing a high-density memory array including ferroelectric and paraelectric materials are desirable.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1B is a cross-sectional illustration of layers within a ferroelectric memory device that includes a hardmask, in accordance with an embodiment of the present disclosure.

FIG. 1C is a cross-sectional illustration of a memory device having sloped sidewalls and a spacer adjacent to the sloped sidewalls, in accordance with an embodiment of the present disclosure.

FIG. 1D is a cross-sectional illustration of a ferroelectric memory device that includes a conductive hardmask, in accordance with an embodiment of the present disclosure.

FIG. 1E is a cross-sectional illustration of a ferroelectric memory device that includes a dielectric hardmask above a conductive hardmask, in accordance with an embodiment of the present disclosure.

FIG. 1F is a cross-sectional illustration of a ferroelectric memory device in the structure of FIG. 1A, where the transition electrode is recessed and spacer adjacent to the ferroelectric memory device is on a surface of the recessed transition electrode, in accordance with an embodiment of the present disclosure.

FIG. 1G is a cross-sectional illustration of the structure in FIG. 1A where a surface of the recess in the transition electrode is curved, in accordance with an embodiment of the present disclosure.

FIG. 1H is a cross-sectional illustration of the structure in FIG. 1E where portions of the transition electrode adjacent that are not under the memory device are removed, in accordance with an embodiment of the present disclosure.

FIG. 1I is a cross-sectional illustration of a portion structure in FIG. 1E where a portion of the dielectric adjacent to the conductive interconnect recessed relative to an uppermost surface of the conductive interconnect and where the electrode structure extends onto a portion of a sidewall of the conductive interconnect, in the transition electrode is curved, in accordance with an embodiment of the present disclosure.

FIG. 2B is a cross-sectional illustration of a memory device within an embodiment of the structure of FIG. 2A, where the conductive interconnect, the transition electrode, and the memory device are misaligned relative to each other.

FIG. 2C is a cross-sectional illustration of a memory device within an embodiment of the structure of FIG. 2A, where an etch stop layer includes a first recess and spacer adjacent to the ferroelectric memory device is on a surface of the recess.

FIG. 2D is a cross-sectional illustration of a memory device within an embodiment of the structure of FIG. 2A where an etch stop layer includes curved recessed surface below the spacer.

FIG. 2E is a cross-sectional illustration of a memory device within an embodiment of the structure of FIG. 2A, where the etch stop layer includes a second recess adjacent to the spacer.

FIG. 2F is a cross-sectional illustration of a memory device within an embodiment of the structure of FIG. 2A, where the etch stop layer does not extend laterally beyond an outer sidewall of the spacer.

FIG. 6A is a cross-sectional illustration of a plurality of conductive interconnects formed within a first dielectric in a memory region and in a logic region above a substrate.

FIG. 6B is a cross-sectional illustration of the structure in FIG. 6A following the formation of an etch stop layer on the conductive interconnects.

FIG. 7A is a cross-sectional illustration of the structure in FIG. 6B following the process to etch openings in the etch stop layer.

FIG. 7B is an isometric illustration of a portion of the structure in FIG. 7A, in accordance with an embodiment of the present disclosure.

FIG. 7C is a cross-sectional illustration of an embodiment of the structure in FIG. 7B, where an uppermost surface of a dielectric adjacent to a conductive interconnect is recessed in accordance with an embodiment of the present disclosure.

FIG. 7D is an isometric illustration of a portion of the structure in FIG. 7A, in accordance with an embodiment of the present disclosure.

FIG. 7E is an isometric illustration of a portion of the structure in FIG. 7A, in accordance with an embodiment of the present disclosure.

FIG. 8A is a cross-sectional illustration of the structure in FIG. 7A following the process to deposit an electrode material in the openings and a planarization process to form transition electrodes on the conductive interconnects in the memory region.

FIG. 8B is a cross-sectional illustration of the structure in FIG. 8A following the process to form a material layer stack to form memory devices.

FIG. 9A is a cross-sectional illustration of the structure in FIG. 8B following the process to form memory devices.

FIG. 9B is an enhanced cross-sectional illustration of an embodiment of memory device formed by a plasma etch process, in accordance with an embodiment of the present disclosure.

FIG. 9C is an enhanced cross-sectional illustration of an embodiment of memory device formed by a plasma etch process, in accordance with an embodiment of the present disclosure.

FIG. 10E is a cross-sectional illustration of the structure in FIG. 10D following the process to etch the second dielectric to form hanging trenches in the logic region.

FIG. 10F is a cross-sectional illustration of the structure in FIG. 10E following the process to form a mask on the second dielectric, and on the via electrodes and within a hanging trench formed above a conductive interconnect in the logic region.

FIG. 10G is a cross-sectional illustration of the structure in FIG. 10F following the process to etch the second dielectric to form an opening below the hanging trench in the logic region.

FIG. 10H is a cross-sectional illustration of the structure in FIG. 10G following the process to remove the mask and deposit a conductive material into the hanging trench and the opening to form via and metal lines.

FIG. 12A is a cross-sectional illustration of an embodiment of the structure in FIG. 9A, in accordance with an embodiment of the present disclosure. In an embodiment, the plasma etch process utilized to form memory devices 108 can remove portions of the etch stop layer 113

FIG. 12B is a cross-sectional illustration of the structure in FIG. 12A following the process to form an encapsulation layer.

FIG. 13A is a cross-sectional illustration of the structure in FIG. 12B following the process to etch the encapsulation layer to form a spacer.

FIG. 13B is a cross-sectional illustration of the structure in FIG. 12B, following the process to form a spacer, in accordance with an embodiment of the present disclosure.

FIG. 15A is an embodiment of the structure in FIG. 9A following the formation of memory devices, in accordance with an embodiment of the present disclosure.

FIG. 15B is an embodiment where the memory device of FIG. 15A includes sloped sidewalls and where the etch process utilized to form the memory device also etches a portion of the electrode structure.

FIG. 16A is a cross-sectional illustration of the structure in FIG. 15B following the process to form an encapsulation layer on the sloped sidewalls and on a curved electrode structure surface.

FIG. 16B is a cross-sectional illustration of the structure in FIG. 16A following the process to form a spacer on a sloped sidewall of the memory device.

FIG. 17A is a cross-sectional illustration of the structure in FIG. 15A where portions of the electrode structure are etched and removed during the process to etch the memory device, in accordance with an embodiment of the present disclosure.

FIG. 17B is a cross-sectional illustration of the structure in FIG. 17A following the formation of an encapsulation layer.

FIG. 18B is a cross-sectional illustration of the structure in FIG. 18A following the process to form via electrode above a respective memory device within the first level.

FIG. 18C is a cross-sectional illustration of the structure in FIG. 18B following the process to form via electrode in a logic region within the first level.

DETAILED DESCRIPTION

Figure 1A:
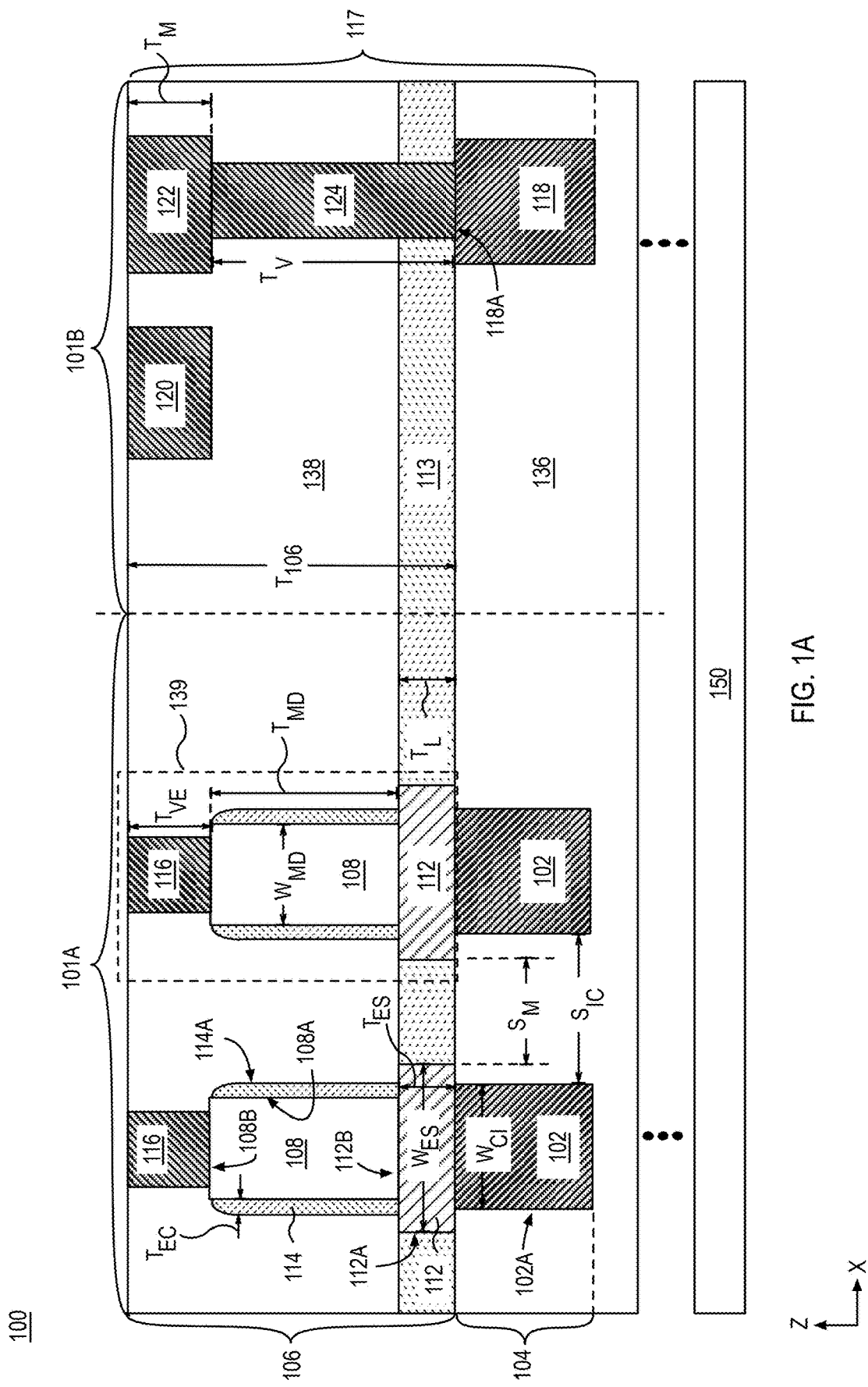
FIG. 1A is a cross-sectional illustration of a plurality of memory devices in a memory region adjacent to interconnect structures in a logic region, in accordance with an embodiment of the present disclosure.

An etch stop layer based integration process for embedded memory is described. While various embodiments are described with reference to FeRAM, capacitive structures formed herein can be used for any application where a capacitor is desired. For example, the capacitive structure can be used for fabricating ferroelectric based or paraelectric based majority gate, minority gate, and/or threshold gate. In the following description, numerous specific details are set forth, such as structural schemes and detailed fabrication methods to provide a thorough understanding of embodiments of the present disclosure. It will be apparent to one skilled in the art that embodiments of the present disclosure may be practiced without these specific details. In other instances, well-known features, such as process equipment and device operations, are described in lesser detail to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a," "an," and "the" are intended to include the plural forms as well, unless the context clearly indicates otherwise. It will also be understood that the term "and/or" as used herein refers to and encompasses all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/ material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to current signal, voltage signal, magnetic signal, or data/clock signal.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures, or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. Similar distinctions are to be made in the context of component assemblies.

The term "between" may be employed in the context of the z-axis, x-axis, or y-axis of a device. A material that is between two other materials may be in contact with one or both of those materials. In another example, a material that is between two or other materials may be separated from both of the other two materials by one or more intervening materials. A material "between" two other materials may therefore be in contact with either of the other two materials. In another example, a material "between" two other materials may be coupled to the other two materials through an intervening material. A device that is between two other devices may be directly connected to one or both of those devices. In another example, a device that is between two other devices may be separated from both of the other two devices by one or more intervening devices.

Perovskite FeRAM devices are advantageous for high density memory applications owing to their low power consumption and high on/off ratio. Perovskite FeRAM devices are also desirable over other forms of memory such as magnetic tunnel junction (MTJ)-based devices due to the relatively low number of layers within a device compared to the MTJ. A typical FeRAM may be fully operational with three layers, where a ferroelectric dielectric is contained between two electrode layers. The electrode layers may also include perovskite materials to enable lattice matching and reduction in electrical resistance. Introduction of lead-free perovskite materials offer additional environmental benefits without sacrificing device performance.

Ferroelectric capacitors may be integrated with transistors to form FeRAM devices in a memory region of a substrate. For example, ferroelectric capacitors may be on a memory level above a transistor level. There may be one or more layers of conductive interconnects between the ferroelectric capacitors (herein ferroelectric devices) and transistors in the transistor level. Ferroelectric devices in the memory region may be directly adjacent to a logic region within the memory level, for system functionality. In particular, the ferroelectric devices may be directly adjacent to routing interconnects in the logic region. A vertical thickness or height of a single level of routing interconnects (herein interconnect level) is determined by a combined thickness of one or more stacked vias and metal lines within the routing interconnects and is substantially fixed. To minimize fabrication cost, it is highly desirable to match a height of the memory level with a height of a single level of routing interconnects.

For manufacturability ferroelectric devices may be generally formed directly above conductive interconnects that are coupled with transistors on a lower level. When a conductive interconnect includes copper, it is highly desirable to not etch a ferroelectric device and expose the copper conductive interconnect. In such instances, an etch stop layer may be inserted between the conductive interconnect and the ferroelectric device. The etch stop layer may also provide a barrier against diffusion of material from the conductive interconnect to one or more memory devices in a layer above. However, to provide electrical conductivity between the ferroelectric device and the conductive interconnect, a transition electrode may be inserted between a ferroelectric device and a conductive interconnect. The transition electrode may be embedded within the etch stop layer. Because the transition electrode is embedded within the etch stop layer, alignment, and sizing requirements of the etch stop layer relative to the conductive interconnect (or the ferroelectric device) may be relaxed. Additionally, the shape of the transition electrode may be independent of a shape of the conductive interconnect.

The ferroelectric device may be patterned by a plasma etch process. Depending on a shape and size of the ferroelectric device relative to the transition electrode, the plasma etch process may etch portions of the transition electrode and/or the etch stop layer. A resulting shape of the transition electrode and/or the etch stop layer adjacent to the ferroelectric device may partially depend on thicknesses of the transition electrode and/or the etch stop layer. Etch selectivity between the transition electrode and/or the etch stop layer and the ferroelectric device can also affect the resulting shape.

For device functionality, each ferroelectric device is further coupled with a via electrode above the ferroelectric device. The memory level includes ferroelectric devices, via electrodes coupled with the ferroelectric devices, and transition electrodes. Thus, a height of the memory layer is a combination of individual thicknesses of the transition electrode, the ferroelectric device and the via electrode.

The ferroelectric device spans a height that depends on thickness of individual layers in the ferroelectric devices. Thus, depending on the thicknesses of the individual layers, the height of the ferroelectric device can vary depending on application. In general, the transition electrode has a fixed thickness. In order to maintain a height of the memory level, individual thicknesses of the ferroelectric devices and the via electrodes may be co-dependently tuned. For example, when the ferroelectric device has a reduced thickness, the thickness of the via electrode may be increased, and vice versa.

To provide greater flexibility to tune the height of the memory device, it is desirable to also desirable to have an ability to tune the thickness of the transition electrode. The transition electrode may be formed on the conductive interconnect prior to formation of a ferroelectric devices through a variety of processing methods, such as for example, a damascene process. A damascene process typically includes forming an etch stop layer on the conductive interconnect, patterning the etch stop layer to form an opening above the conductive interconnect, filling the opening with a suitable electrode material and planarizing. A planarization process often requires the etch stop layer to have a minimum deposited thickness. Process margins associated with planarization process can limit a minimum thickness of a transition electrode. However, a minimum thickness of the transition electrode and etch stop layer, can be advantageously chosen to accommodate fabrication of the ferroelectric device above, and in particular to the plasma etch process to be utilized.

In the logic region, thickness of the resulting transition electrode and etch stop layer will dictate respective heights of individual vias and metal lines to be targeted. In exemplary embodiments, a respective via is coupled between one or more metal lines and a respective conductive interconnect. The vias are formed in a dielectric and in the etch stop layer. The combined height of the via and metal lines remain unaltered. However, changing a thickness of the etch stop layer to accommodate the ferroelectric device (in the memory region) may necessitate targeting an etch to form the via.

The inventors have devised a method that enables formation of a transition electrode embedded in an etch stop layer having a tunable thickness in the memory area. This method further facilitates simultaneous implementation of the etch stop layer in the logic region to beneficially provide a diffusion barrier for diffusion of metallic atoms (for e.g., copper) from the conductive interconnects in the logic region. A substantially fixed thickness of the etch stop layer in the logic region can be ascertained after formation of the transition electrode. The total thickness of the transition electrode and the memory device can be co-dependently tuned.

To enable high density FeRAM devices the inventors have resorted to non-lead-based perovskite materials owing its environmental friendliness for mass production. A stack for ferroelectric capacitors can include one or more hardmask materials. The one or more hardmask materials can include dielectric materials, metallic materials, or a combination thereof. Implementation of an etch with high selectivity (such as a reactive ion etching, or plasma etch process) between the hardmask and device layers can advantageously enable patterning.

In some embodiments, the conductive interconnects coupled with a respective ferroelectric device are discrete island structures. In other embodiments, the conductive interconnect may be a continuous trench line, where a plurality of ferroelectric devices may be coupled with the trench line. In some such embodiments, the transition electrode may be continuous between a respective ferroelectric device and extend along a length of the trench line. In other embodiments, the conductive interconnect may be discrete, but the transition electrode may be continuous between each respective capacitor. In further embodiments, the conductive interconnects are discrete, but a top electrode of individual ferroelectric capacitors are coupled together by a single conductive plate.

FIG. 1A is a cross-sectional illustration of a device structure 100, including a region 101A, adjacent to a region 101B above a substrate 150. The region 101A and 101B may be for example a memory region and a logic region, respectively or vice versa. In the illustrative embodiment, region 101A is a memory region and region 101B is a logic region. The memory region 101A includes a plurality of conductive interconnects, such as conductive interconnect 102 within level 104. The device structure 100 further includes a level 106 above level 104. Level 106 may include a plurality of memory devices each including one or more ferroelectric materials or one or more paraelectric materials. In the illustrative embodiment, level 106 includes a plurality of memory devices, such as memory device 108 above a respective conductive interconnect 102. As shown, an electrode structure 112 is coupled between a respective memory device 108 and a respective conductive interconnect 102. The electrode structure 112 is laterally surrounded by an etch stop layer 113, wherein the etch stop layer 113 includes a dielectric material. In embodiments the electrode structure 112 includes tantalum, titanium, ruthenium, tungsten, or copper. In some embodiments, etch stop layer 113 includes a material such as silicon, nitrogen and/or carbon. In some embodiments, spacer 114 includes a material such as silicon, nitrogen and/or carbon, or aluminum and one more of nitrogen and oxygen.

The conductive interconnect 102, memory device 108 and the electrode structure 112 each have a lateral thickness, $W_{CI}$, $W_{MD}$, and $W_{ES}$, respectively. In general, the lateral thicknesses $W_{CI}$, $W_{MD}$, and $W_{ES}$ can be independent of each other. In particular $W_{CI}$ can depend on a shape of the conductive interconnect 102. In the illustrative embodiment, $W_{ES}$ is greater than $W_{CI}$ and $W_{MD}$. In some embodiments, such as is illustrated electrode structure 112 is wider than the memory device 108, as shown in the Figure. A $W_{ES}$ that is greater than $W_{CI}$ or $W_{CI}$ and $W_{MD}$, may determine material choices for the electrode structure 112 as well as for conductive interconnect 102. For example, when $W_{ES}$ is greater than $W_{MD}$, electrode structure 112 may not include a material such as copper to prevent sputtering of the electrode structure 112 during fabrication of the memory device 108.

However, conductive interconnect 102 and the electrode structure 112 can have a variety of plan view shapes as will be discussed below. The relative shapes of the electrode structure 112 and conductive interconnect 102 can determine relative alignment between sidewalls 112A and 102A.

To prevent degradation of layers in the memory device 108 during a fabrication process, a spacer 114 may be present on sidewalls and on top surfaces of memory device 108. In the illustrative embodiment, spacer 114 is sidewalls 108A of memory device 108 but not on a top surface 108B. Spacer 114 also provides a hermetic seal to sensitive layers within memory device 108. When $W_{ES}$ is greater than $W_{MD}$, as is shown, spacer 114 may be on a portion of the electrode structure 112. In some embodiments, depending on a lateral thickness, $T_{EC}$, spacer 114 may be fully on the electrode structure 112 or partially on each of electrode structure 112 and the etch stop layer 113. In the illustrative embodiment, spacer 114 is on electrode structure 112. In some embodiments, when $W_{ES}$ is equal to a sum of $W_{MD}$ and $W_{EC}$, then an outermost sidewall surface 114A of the spacer 114 is substantially aligned with sidewall 112A of the electrode structure 112. In the illustrative embodiment, the spacer 114 has a curved uppermost portion and outermost sidewall surface 114A. In some embodiments, outermost sidewall surface 114A matches a contour of sidewall 108A.

The electrode structure 112 has a vertical thickness $T_{ES}$ and etch stop layer 113 has a thickness, $T_L$ (herein vertical thickness is measured along the z-axis in the Figures). In exemplary embodiments, $T_{ES}$ is substantially equal to $T_L$, as is shown. As such an uppermost surface 113A is co-planar or substantially co-planar with uppermost surface 112B. In some embodiments, portions of the electrode structure surface 112B are concaved due to a processing methodology utilized. $T_{ES}$ may be chosen based on a combined thickness of individual layers within the memory device 108. Relative size of $W_{CI}$, $W_{ES}$ and $W_{MD}$, can also provide flexibility in a thickness of the etch stop layer 113 or electrode structure 112. In some examples when $W_{ES}$ is greater than $W_{MD}$, $T_{ES}$ and $T_{EL}$ can be relatively thinner compared to when $W_{ES}$ is less than $W_{MD}$ because of process margins to be discussed below.

Level 106 also includes a via electrode 116 coupled with a respective memory device 108. As shown, via electrode 116 has a vertical thickness, $T_{VE}$. Vertical level 106 has a vertical thickness $T_{106}$ that is substantially equal to a combined sum of $T_{ES}$, $T_{MD}$, and $T_{VE}$. It is to be appreciated that individual thicknesses $T_{ES}$, $T_{MD}$, and $T_{VE}$ may be co-dependently chosen to optimize performance of memory device 108.

In the illustrative embodiment, logic region 101B includes an interconnect structure 117 spanning levels 104 and 106. Interconnect structure 117 includes one or more conductive interconnects in level 104 and one or more vias and metal lines coupled with conductive interconnect 118 in level 106. In the illustrative embodiment, interconnect structure 117 includes conductive interconnect 118 in level 104 and a plurality of metal lines 120 and 122, where metal line 122 is coupled with conductive interconnect 118 through via 124. Metal line 122 may be coupled with a conductive interconnect through a via on a different plane, behind the plane of the illustration.

In the illustrative embodiment, etch stop layer 113 extends continuously from memory region 101A to logic region 101B. At least a portion of the via 124 is adjacent to the etch stop layer 113, as shown. The etch stop layer 113 may be in contact with the conductive interconnect 118 depending on a lateral thickness of the via 124. In some embodiments, such as is shown, at least a portion of the etch stop layer 113 is on the conductive interconnect 118.

Via 124 has a vertical thickness, $T_V$, as measured from a lower most point of level 104 or from uppermost surface 118A of conductive interconnect 118, and metal line 122 has a vertical thickness, $T_M$. In exemplary embodiments, a combined sum of $T_M$ and $T_V$ is equal to a combined sum of individual thicknesses $T_{ES}$, $T_{MD}$, and $T_{VE}$. In general, $T_M$ and $T_{VE}$ need not be equal. In some embodiments, $T_{VE}$ is between 80%-100% of $T_M$. In some embodiments, $T_M$ is between 20 nm and 50 nm. In other embodiments, $T_M$ is between 50 nm and 200 nm.

In an embodiment, $T_{MD}$ has a thickness between 10 nm and 100 nm and $T_{ES}$ has a thickness between 2 nm and 20 nm. In an embodiment, the sum of $T_{MD}$ and $T_{ES}$ is approximately between 85%-100% of $T_V$. In some embodiments, $T_V$ is between 20 nm and 50 nm. In other embodiments, $T_V$ is between 20 nm and 150 nm.

In the illustrative embodiment, each memory device 108 within device structure 100 are substantially identical. While two memory device such as memory devices 108 are illustrated, an array can have more than 1000 substantially identical memory devices 108. When $W_{ES}$ is greater than $W_{MD}$, a spacing between adjacent memory devices is determined by a spacing between the adjacent electrode structures 112 under each memory device 108. As shown adjacent electrode structures 112 may be laterally separated from each other by a distance, $S_M$. $S_M$ may range between 20 nm and 50 nm. The separation, $S_M$, is generally dependent on separation $S_{IC}$ between adjacent conductive interconnects 102 as well as on lateral thicknesses, $W_{CI}$ and $W_{ES}$ of the conductive interconnect 102 and electrode structure 112, respectively. In the illustrative embodiment, because $W_{CI}$ is less than $W_{ES}$, $S_M$ is determined by $W_{ES}$.

In some embodiments, $S_M$ may depend on a stack of layers within the memory device 108 because a thicker stack cause tapering of sidewalls 108A. Impact of taper in sidewall 108A may be more pronounced when $W_{ES}$ is greater than $W_{MD}$, but still comparable to $W_{MD}$. Depending on embodiments, memory device 108 can have three or more layers. An embodiment of the memory device 108 including four layers is illustrated in FIG. 1B. As shown, memory device 108 includes a bottom electrode 128, a dielectric layer 130 and a top electrode 132.

In an embodiment, bottom electrode 128 and top electrode 132 include a conductive ferroelectric oxide (when memory device 108 is a ferroelectric memory device 108). The conductive ferroelectric oxide includes one of a non-Pb perovskite metal oxides, such as but not limited to, La—Sr—CoO3, SrRuO3, La—Sr—MnO3, YBa2Cu3O7, Bi2Sr2CaCu2O8, or LaNiO3.

In an embodiment, dielectric layer 130 is a ferroelectric dielectric layer 130 that includes non-Pb perovskite material in the form $ABO_3$, where A and B are two cations of different sizes and O is oxygen. A is generally larger than B in size. In some embodiments, non-Pb perovskites can also be doped, e.g., by La or lanthanides. The non-Pb perovskite material can include one or more of La, Sr, Co, Cr, K, Nb, Na, Sr, Ru, Y, Fe, Ba, Hf, Zr, Cu, Ta, Bi, Ca, Ti and Ni.

In other embodiments, ferroelectric dielectric layer includes low voltage ferroelectric material sandwiched between top electrode 132 and bottom electrode 128. These low voltage FE materials can be of the form $AA'BB'O_3$, where A' is a dopant for atomic site A and can be an element from the lanthanides series, where B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below 2-Volts is sufficiently low to be characterized as low voltage.

Memory device 108 may also include hardmask 134 as shown. In some embodiments, hardmask 134 may be a dielectric hardmask 134, where the dielectric includes a material such as silicon and one or more of nitrogen, oxygen, or carbon. In other embodiments, hardmask 134 includes a conductive material, for example, tantalum, titanium, ruthenium, or an alloy of nitrogen and one or more of tantalum, titanium, and ruthenium. The combined thickness of the layers in memory device 108 can range between 7 nm and 100 nm.

Embodiments of features of device structure 100 within portion 139 are illustrated in FIGS. 1C-1I.

In some embodiments the sidewall 108A of the memory device 108 is sloped. The slope may be uniform as illustrated in FIG. 1C. In some such embodiments the spacer 114 thickness, $T_{EC}$ can vary along the vertical thickness of memory device 108. $T_{EC}$ may increase or decrease with $T_{MD}$ depending on a slope of the sidewall 108A, as well as on a method utilized to fabricate spacer 114. In the illustrative embodiment, $T_{EC}$ increases away from uppermost surface 112B.

In some embodiments, where memory device 108 includes hardmask 134, material of hardmask 134 will determine whether the via electrode 116 contacts the hardmask 134 or extends through a portion of the hardmask 134 and contacts top electrode 132. As shown in FIG. 1D, hardmask 134 includes a conductive material, and via electrode 116 is in contact with uppermost surface 134A of hardmask 134. In other embodiments, hardmask 134 includes dual layers such as a dielectric layer on a conductive layer. In some such embodiments, via electrode 116 extends through hardmask 134 and is in contact with uppermost surface 135A of conductive layer 135, as shown in FIG. 1E.

In other embodiments, the electrode structure 112 may have surfaces that are at different levels or recessed relative to an uppermost surface 112B that can change the structure of spacer 114. For example, as shown in FIG. 1F, an uppermost a surface 112C, that is away from sidewall 108A, is recessed relative to uppermost surface 112B. In some such embodiments, the surface 112C may be substantially planar, and the spacer 114 may extend below an interface 137 between the memory device 108 and electrode structure 112. As shown, spacer 114 is on a sidewall 112D of electrode structure 112 and also on a portion of the surface 112C. Sidewall 112D may be substantially vertical as shown.

In other embodiments, the surface 112C may not be planar, but have a gradual slope away from sidewall 108A as illustrated in FIG. 1G. In some such embodiments, where sidewall 108A is substantially vertical, the spacer 114 has a lower most portion that is on a gradually sloped surface 112C and has a non-uniform lateral thickness $T_{EC}$ relative to sidewall 108A.

In yet another embodiment, the electrode structure 112 does not extend beyond the memory device, as shown in FIG. 1H. In some such embodiments, sidewall 108A is substantially aligned with sidewall 108A as shown. In the illustrative embodiment, the spacer 114 is directly adjacent to the sidewall 112A. In embodiments, where $W_{CI}$ is less than $W_{ES}$, spacer 114 is on a portion of the dielectric 136. In other embodiments where $W_{CI}$ is greater than $W_{ES}$, spacer 114 can be on a portion of the conductive interconnect 102. In some embodiments, as shown, portions 114B of spacer 114 are adjacent to sidewalls 113J of etch stop layer 113 when a difference between where $W_{CI}$ and $W_{ES}$ is at least three times greater than $T_{EC}$.

FIG. 1I is a cross-sectional illustration of a portion of the structure in FIG. 1A, where a portion of the dielectric 136 is recessed relative to uppermost surface 102B of the conductive interconnect 102. As shown, the dielectric 136 has a surface 136B that is recessed relative to an uppermost surface 136A. In some such embodiments, the electrode structure 112 extends onto a portion of a sidewall 112A of the conductive interconnect 102. In some such examples, the extent of overlap between electrode structure 112 and sidewall 112A may not be uniform around a circumference of the conductive interconnect 102. In embodiments, such as will be discussed below, when conductive interconnect 102 and electrode structure 112 are cylindrical, the electrode structure 112 will cover an upper portion of sidewall 102A along a circumference of the conductive interconnect 102. Also in some such embodiments, the uppermost surface 112B is substantially co-planar with surface 113A.

Referring again to FIG. 1A, conductive interconnect 118 has one or more properties of conductive interconnect 102. Conductive interconnects 102 and 118 include a metal such as copper, cobalt, molybdenum, tungsten, or ruthenium. In some embodiments, conductive interconnects 102 and 118 include a liner layer and a fill metal on the liner layer. For example, the liner layer may include a material, such as but not limited to, ruthenium, cobalt or tantalum and the fill metal may include copper or tungsten. Conductive interconnects 102 and 118 have a thickness that spans a portion of dielectric 136 within level 104. There may be other vias and interconnect routing connections within level 104 that are not shown in the Figure. In an embodiment, via electrode 116, via 124, metal lines 120 and 122, include a same or substantially the same material. In some embodiments, via electrode 116, via 124, metal lines 120 and 122, include a same or substantially the same material as the material of the conductive interconnect 102. In different embodiments, via electrode 116, via 124, conductive interconnects 102 and 118 may be discrete vias or continuous trenches, as will be discussed further below.

In some embodiments, dielectric 136 includes a material such as silicon and one or more of nitrogen, oxygen, or carbon. In some embodiments, where the dielectric 136 includes a material such as silicon and one or more of nitrogen, oxygen, or carbon. In some embodiments, dielectric 136 includes a material that is the same or substantially the same as the material of the dielectric 138. The substrate 150 may include a suitable substrate such as is utilized in semiconductor device fabrication and may comprise a material such as silicon, germanium, silicon germanium, group III-V materials, group III-N materials, or quartz.

Figure 2A:
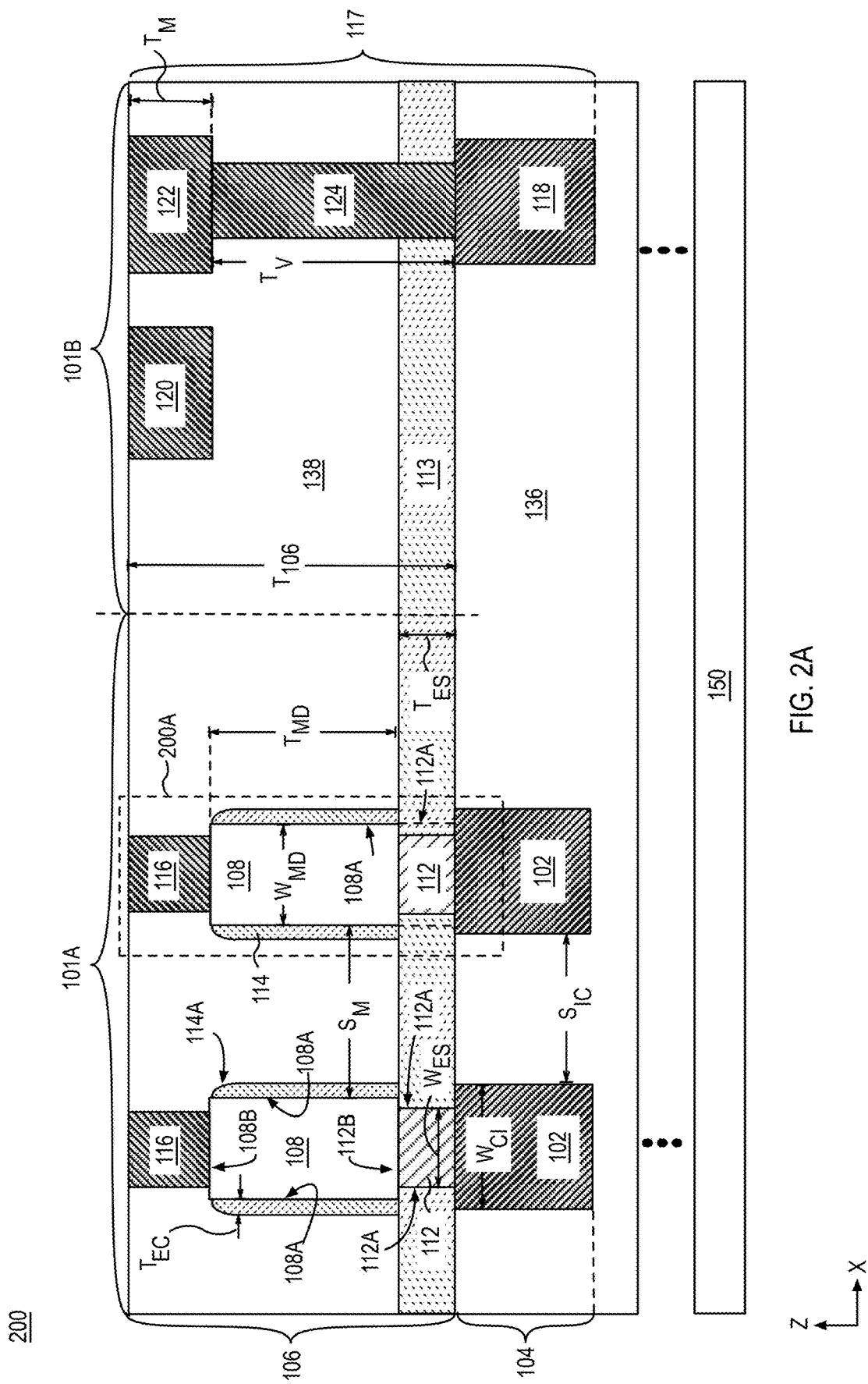
FIG. 2A is a cross-sectional illustration of a plurality of memory devices in a memory region adjacent to interconnect structures in a logic region, where the transition electrode has a lateral thickness less than a lateral thickness of the ferroelectric memory device, in accordance with an embodiment of the present disclosure.

In some embodiments, the electrode structure 112 has a lateral thickness $W_{ES}$ that is less than or equal to $W_{MD}$ as shown in the device structure 200 illustrated in FIG. 2A. Device structure 200 includes many features of device structure 100.

When $W_{MD}$ is substantially equal to $W_{ES}$, sidewalls 108A are substantially aligned with sidewalls 112A. In some embodiments, $W_{ES}$ is less than or equal to $W_{CI}$. When $W_{MD}$ is greater than $W_{ES}$, memory device 108 is on the electrode structure 112 and partially on the etch stop layer 113, as shown in the figure. When $W_{MD}$ is greater than $W_{ES}$, spacer 114 is also on etch stop layer 113, as shown. In the illustrative embodiment, memory device 108, electrode structure 112 and conductive interconnect 118 are substantially symmetric about each other, in the cross sectional plane of the Figure. When $W_{ES}$ is less than $W_{MD}$, a spacing between adjacent memory devices is determined by a spacing between the adjacent conductive interconnects 102, or spacing between the adjacent memory devices 108, whichever is greater.

Different embodiments of the memory device 108, electrode structure 112, etch stop layer 113 and conductive interconnect 102 are described in FIGS. 2B-2E with reference to portion 200A in FIG. 2A. In the various embodiments described herein, $W_{ES}$ is less than $W_{MD}$ and sidewall 112A is within sidewall 108A. It is to be appreciated that memory device 108 may be offset from electrode structure 112, as illustrated in FIG. 2B, without loss of functionality. The offset between sidewalls 112A and 108A can be up to 10%. It is to be appreciated that conductive interconnect 118 may also be offset from electrode structure 112 by between 5% and 10%, without loss of functionality. In some embodiments, when conductive interconnect 102, electrode structure 112 and memory device 108 are each cylindrical, a vertical axis (for e.g., z-axis in Figure) of the electrode structure 112 may be offset from a vertical axis of the conductive interconnect 102. The electrode structure 112 may be offset a vertical axis of the memory device 108. In other embodiments, such as is shown, electrode structure 112 is offset a vertical axis of the memory device 108 a vertical axis of the conductive interconnect 102.

Depending on embodiments, the etch stop layer 113 may have surfaces that are at different levels or recessed relative to an uppermost surface 113A. For example, as shown in FIG. 2C, surface 113B, that is away from sidewall 108A, is recessed relative to uppermost surface 113A. In some such embodiments, the surface 113B may be substantially planar, and the spacer 114 may extend below an interface 203 between the memory device 108 and etch stop layer 113. As shown, spacer 114 is on a sidewall 113C of etch stop layer 113 and also on a portion of the surface 113B. Sidewall 113C may be substantially vertical as shown.

In other embodiments, the surface 113B may not be planar, but have a gradual slope away from sidewall 108A as illustrated in FIG. 2D. In some such embodiments, where sidewall 108A is substantially vertical the spacer 114 has a lower most portion that is on a sloped surface 113B and has a non-uniform lateral thickness $T_{EC}$, relative to sidewall 108A.

The etch stop layer 113 may include further recessed surfaces compared to surface 113B. In some embodiments, the etch stop layer 113 can have a surface 113D that is recessed or at a lower level compared to surface 113B, but above a lowermost surface 113E, as illustrated in FIG. 2E. As shown surface 113D is adjacent to the portion of the spacer 114 on surface 113B. In the illustrative embodiment, surface 113D is substantially planar. A surface 113D that is lower than surface 113B may be an artifact of a processing operation and is a feature when materials of the spacer 114 and etch stop layer 113 are substantially similar, but may differ in dopant concentrations. For example, etch stop layer 113 may include silicon and nitrogen and one or more dopants such as carbon or oxygen. Spacer 114 may include silicon and nitrogen and one or more dopants such as carbon or oxygen, where the dopant species or levels may be different between the etch stop layer 113 and spacer 114. Features of etch stop layer 113 described in FIGS. 2C and 2E may be present when the etch stop layer 113 has a thickness that is less than 10 nm. The surface 113D may be recessed from surface 113B by anywhere from 1 nm-3 nm. A sidewall 113F in the etch stop layer 113 may be substantially aligned with an outermost sidewall surface 114A of spacer 114. The sidewall 113F may be substantially vertical (as shown) or tapered.

In other embodiments, a portion 113G of the etch stop layer 113 below surface 113D may be absent altogether, as shown in FIG. 2F. In some such embodiments, the sidewall 113F of etch stop layer 113 is substantially aligned to outermost sidewall surface 114A. The sidewall 113F may be substantially vertical (as shown) or tapered.

In the embodiments described above the conductive interconnect 102 may be offset relative to electrode structure 112 without affecting the features of the etch stop layer 113.

Figure 3A:
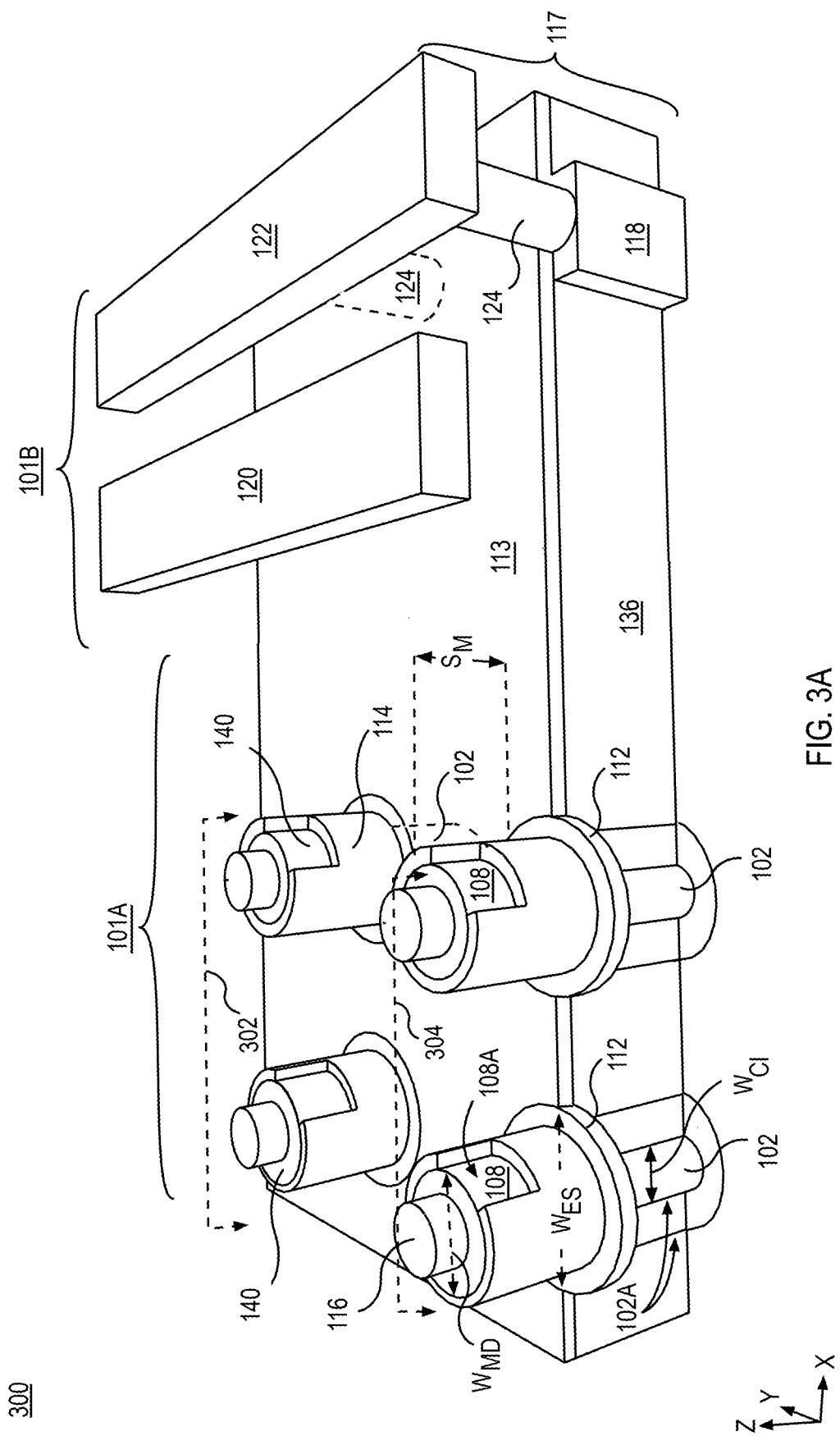
FIG. 3A is an isometric illustration of a plurality of memory devices in a memory region adjacent to interconnect structures in a logic region, where conductive interconnects in the memory region are discrete cylindrical shape that each couple with one memory device, in accordance with an embodiment of the present disclosure.

In accordance with an embodiment of the present disclosure, FIG. 3A is an isometric illustration of the device structure 300. Device structure 300 includes many of the features of device structure 100 described in association with FIG. 1A, where the conductive interconnect 102 are discrete islands. Device structure 300 further includes further features not illustrated in FIG. 1A as well as some variations in features of certain structures.

Device structure 300 includes a plurality of memory devices such as memory device 140 (illustrated through a cut out in spacer 114). Memory device 140 is on plane 302, behind a plane 304 of memory device 108. Memory device 140 is substantially identical to and has all the properties of memory device 108. In the illustrative embodiment, each of the memory devices 108 and 140 are coupled with a respective conductive interconnect 102.

As shown each conductive interconnect 102 has a discrete island structure (i.e., a conductive interconnect surrounded by dielectric 136). The conductive interconnect 102 may include a variety of shapes. As illustrated each conductive interconnect 102 is discrete, cylindrical, and spaced apart from an adjacent conductive interconnect 102. In some such embodiments, lateral thickness, $W_{CI}$ is also a diameter.

In the illustrative embodiment, the respective memory device 108 and memory device 140 have a cylindrical shape. In some such embodiments lateral thickness $W_{MD}$, is a diameter of the respective memory device 108 or memory device 140.

In the illustrative embodiment, electrode structure 112 also has a cylindrical shape. In some such embodiments, $W_{ES}$ is a diameter of the electrode structure 112. However, it is to be appreciated that the shape of the electrode structure 112 can be independent of the shape of the memory device 108 or 140, or a shape of conductive interconnect 102.

In the illustrative embodiment, each electrode structures 112 is spaced apart from an adjacent electrode structures 112 by a distance, $S_M$ along the x-direction and along the y-direction. In embodiments, $S_M$ along the x-direction and along the y-direction may be the same or different.

In the illustrative embodiment, a discrete via electrode 116 is coupled with respective memory device 108 or memory device 140. Also as shown, the spacer 114 has a substantially planar upper surface in contrast to the surface of the spacer 114 illustrated in FIG. 1A.

In the illustrative embodiment, conductive interconnect 118 is a conductive trench interconnect 118 that extends along the y-direction. As shown, metal lines 120 and 122 also extend along the y-direction. In some embodiments, via 124 is conductive via between metal line 122 and conductive interconnect 118. In other embodiments, interconnect structure 117 can include a plurality of vias such as via 124 between metal line 122 and conductive interconnect 118 to prevent an increase in electrical line resistance. In other embodiments, via 124 may be replaced by a metal line (not illustrated).

Figure 3B:
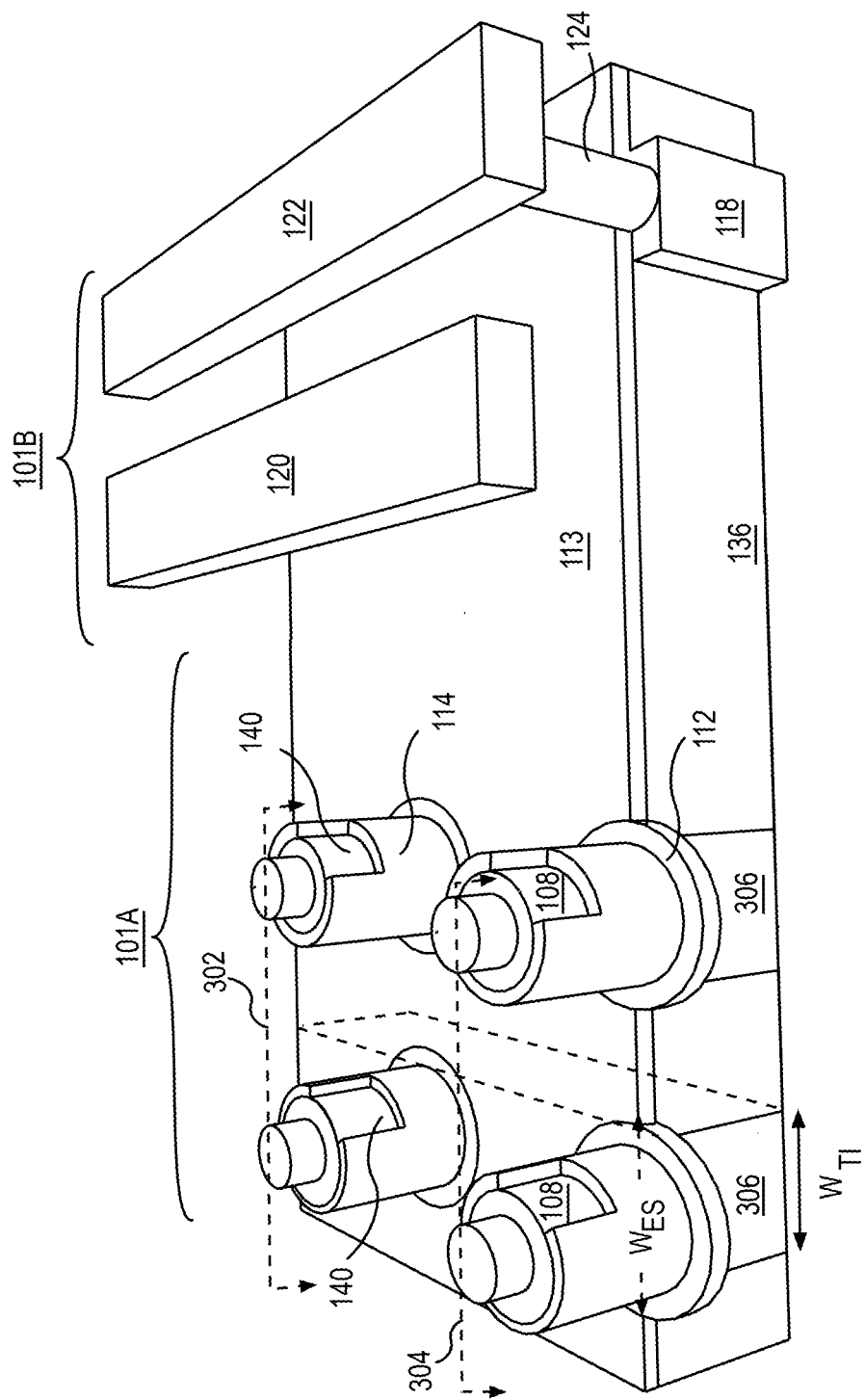
FIG. 3B is an isometric illustration of a plurality of memory devices in a memory region adjacent to interconnect structures in a logic region, where conductive interconnects in the memory region are trenches that couple more than one memory device, in accordance with an embodiment of the present disclosure.

In some embodiments, conductive interconnect 102 is a trench interconnect 306, as illustrated in FIG. 3B. The trench interconnect 306 may continuously extend continuously from under memory device 108 on plane 304 to under memory device 140 on plane 302. In the illustrative embodiment, the trench interconnect 306 couples a lower most electrode of each respective memory device 108 and 140 along a length of the trench (along the y-direction). A physical coupling between lower most electrode of each respective memory device 108 and 140 also electrically couples a respective (lowermost) terminal of each of the memory devices 108 and 140. In embodiments, trench interconnect 306 includes a material that is the same or substantially the same as the material of the conductive interconnect 102.

Because the etch stop layer 113 extends over the trench interconnect 306, the electrode structure 112 can have a shape and/size that is independent of the shape of trench interconnect 306. Trench interconnect 306 is not exposed to memory device 108 or 140 during memory device fabrication. It is also to be appreciated that electrode structure 112 can be offset along the x or the y direction relative to the trench interconnect 306, without loss of device functionality, as long as there is at least 50% overlap. As shown, trench interconnect 306 has a lateral thickness, $W_{TI}$. In general, $W_{TI}$ may be equal to, less than or greater than $W_{ES}$. However, it is to be appreciated that in some embodiments, where $W_{TI}$ is greater than $W_{ES}$, trench interconnect 306 can include a material other than copper.

As discussed above, the shape of the electrode structure 112 may be independent of the trench interconnect 306 or the memory device 108. The electrode structure 112 depicted in FIG. 3B has a cylindrical shape. However, the electrode structure 112 can be rectangular in other embodiments, such as is illustrated in FIG. 3C. Only the memory region 101A is illustrated for clarity. In some such embodiments, the electrode structure 112 can have a length, $L_E$ and a width $W_E$ as shown, where $L_E$ and $W_E$ are individually or collectively smaller or greater than $W_{MD}$, or $W_{TI}$.

Figure 3D:
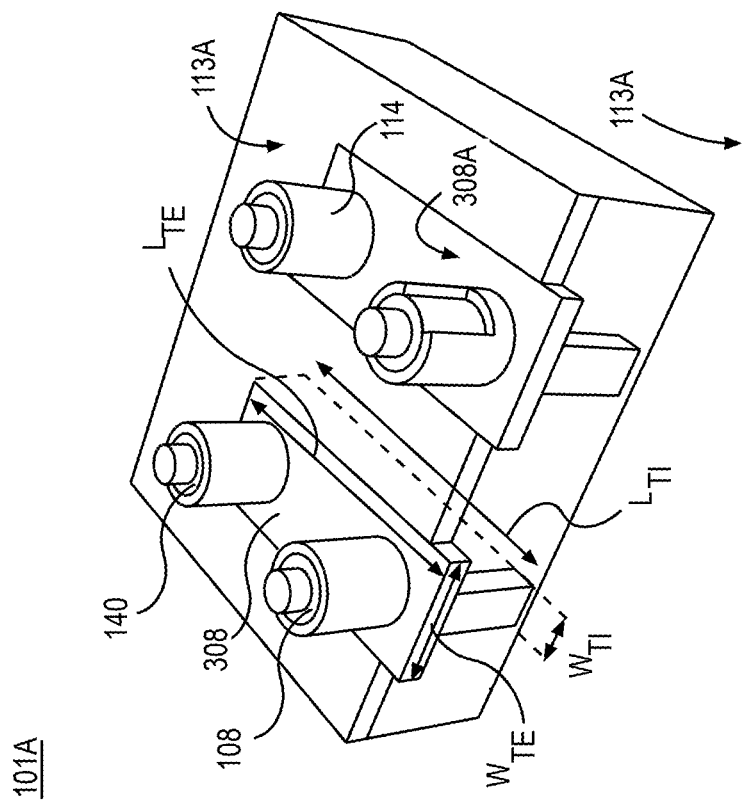
FIG. 3D where conductive interconnects in the memory region are trenches, and the transition electrodes have rectangular shape and where each transition electrode couples two memory devices, in accordance with an embodiment of the present disclosure.
Figure 3C:
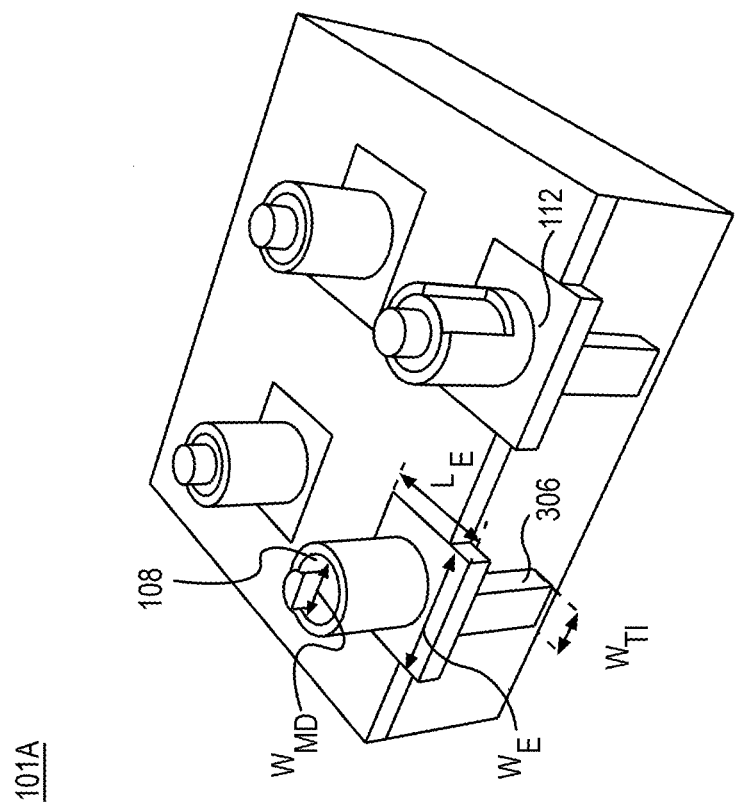
FIG. 3C is an isometric illustration of a plurality of memory devices in a memory region, where conductive interconnects in the memory region are trenches, but the transition electrodes have discrete rectangular shape, in accordance with an embodiment of the present disclosure.

In other embodiments, a discrete trench electrode structure 112 can be replaced by a trench electrode 308, in the memory region 101A, as illustrated in FIG. 3D. The trench electrode 308 can also extend over the trench interconnect 306 and couple the memory devices 108 and 140. As such, trench electrode 308 couples a lower most electrode of each of the respective memory device 108 and 140. In the illustrative embodiment, trench electrode 308 has a length, $L_{TE}$, and a width, $W_{TE}$. In some embodiments, $L_{TE}$ is substantially the same as a length, $L_{TI}$, of the trench interconnect 306. In the illustrative embodiment, $W_{TE}$ is greater than $W_{TI}$, but $W_{TE}$ can be less than $W_{TI}$ in other embodiments.

As shown an uppermost surface 308A of trench electrode 308 is substantially coplanar with uppermost surface 113A of etch stop layer 113. The spacer 114 can simultaneously be on uppermost surfaces 308A and 113A depending on a relative size between $W_{MD}$ and $W_{TE}$. For example, when $W_{MD}$ is less than $W_{TE}$, then spacer 114 can be limited to an uppermost surface 308A, as illustrated. However, depending on a thickness of spacer 114, some portions of the spacer 114 can be on the trench electrode 308 and other portions of the spacer 114 can be on uppermost surface 113A.

In other embodiments, conductive interconnect 102, in the memory region 101A, can be discrete islands. However, electrode structure 112 can be replaced by a trench electrode 308 that couples two or more memory devices, as shown in FIG. 3E. As shown, trench electrode 308 extends from above a conductive interconnect 102 on plane 304 to above conductive interconnect 102 on plane 302, behind plane 304. Trench electrode 308 provides enhanced flexibility to couple a selected number of memory devices along a row without having to provide a continuous trench interconnect (such trench interconnect illustrated in FIGS. 3B, 3C, and 3D). The flexibility to choose the number of devices and groups of devices can provide additional electrical advantages such as for programming.

Although as illustrated, $W_{TE}$ is greater than $W_{CI}$, in other embodiments, $W_{TE}$ can be less than $W_{CI}$ without loss of functionality. Furthermore, as explained above, $W_{MD}$ can be independently chosen with respect to $W_{TE}$.

As shown an uppermost surface 308A of trench electrode 308 is substantially coplanar with uppermost surface 113A of etch stop layer 113. The spacer 114 can simultaneously be on uppermost surfaces 308A and 113A. For example, when $W_{MD}$ is less than $W_{TE}$, then spacer 114 can be limited to an uppermost surface 308A, as illustrated. However, depending on a lateral thickness of spacer 114, and/or size of $W_{TE}$ relative to $W_{MD}$ some portions of the spacer 114 can be simultaneously on the uppermost surface 308A of trench electrode 308 and other portions of the spacer 114 can be on uppermost surface 113A of the etch stop layer 113.

Figure 3F:
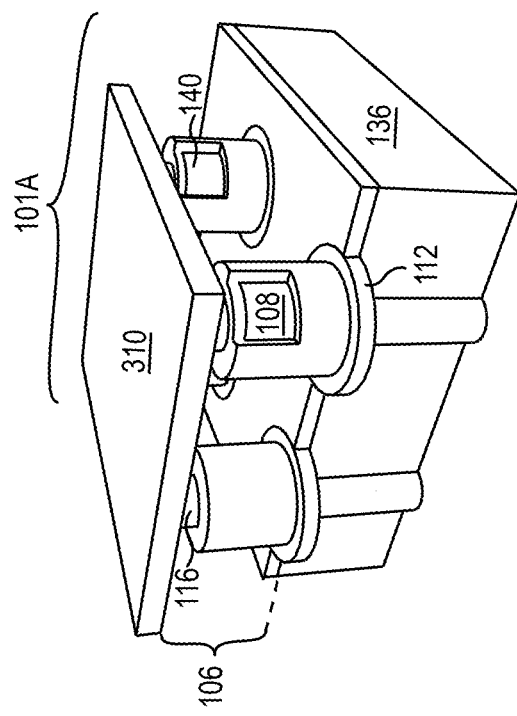
FIG. 3F is an isometric illustration of a plurality of memory devices in a memory region where a top electrode of individual ones of the plurality of memory devices are coupled to a common planar electrode, in accordance with an embodiment of the present disclosure.
Figure 3E:
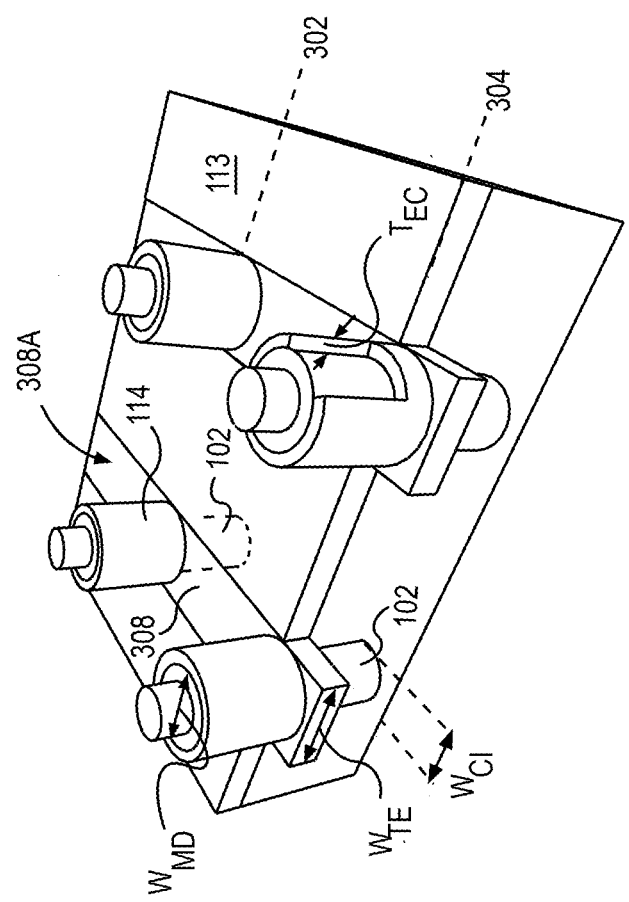
FIG. 3E is an isometric illustration of a plurality of memory devices in a memory region, where conductive interconnects in the memory region are discrete islands structure, but where a bottom electrode of individual ones of a plurality of memory devices, along a given line, are coupled by a common transition electrode, in accordance with an embodiment of the present disclosure.

In some embodiments, memory device 108 and memory devices 140 are collectively coupled together by a plate electrode 310, such as is shown in the cross-sectional illustration of FIG. 3F. In one such embodiment, plate electrode 310 may extend over and couple with each memory device 108 and 140, through a respective via electrode 116, as shown. In some embodiments, the electrode structure 112 memory devices 108 and 140, via electrode 116 and plate electrode 310 are all within level 106. In other embodiments, plate electrode 310 may be on a level above level 106. In some embodiments, plate electrode 310 includes a material that is the same or substantially the same as the material of the via electrode 116. In other embodiments, plate electrode 310 includes a material that can be etched by a plasma etch process.

Figure 4A:
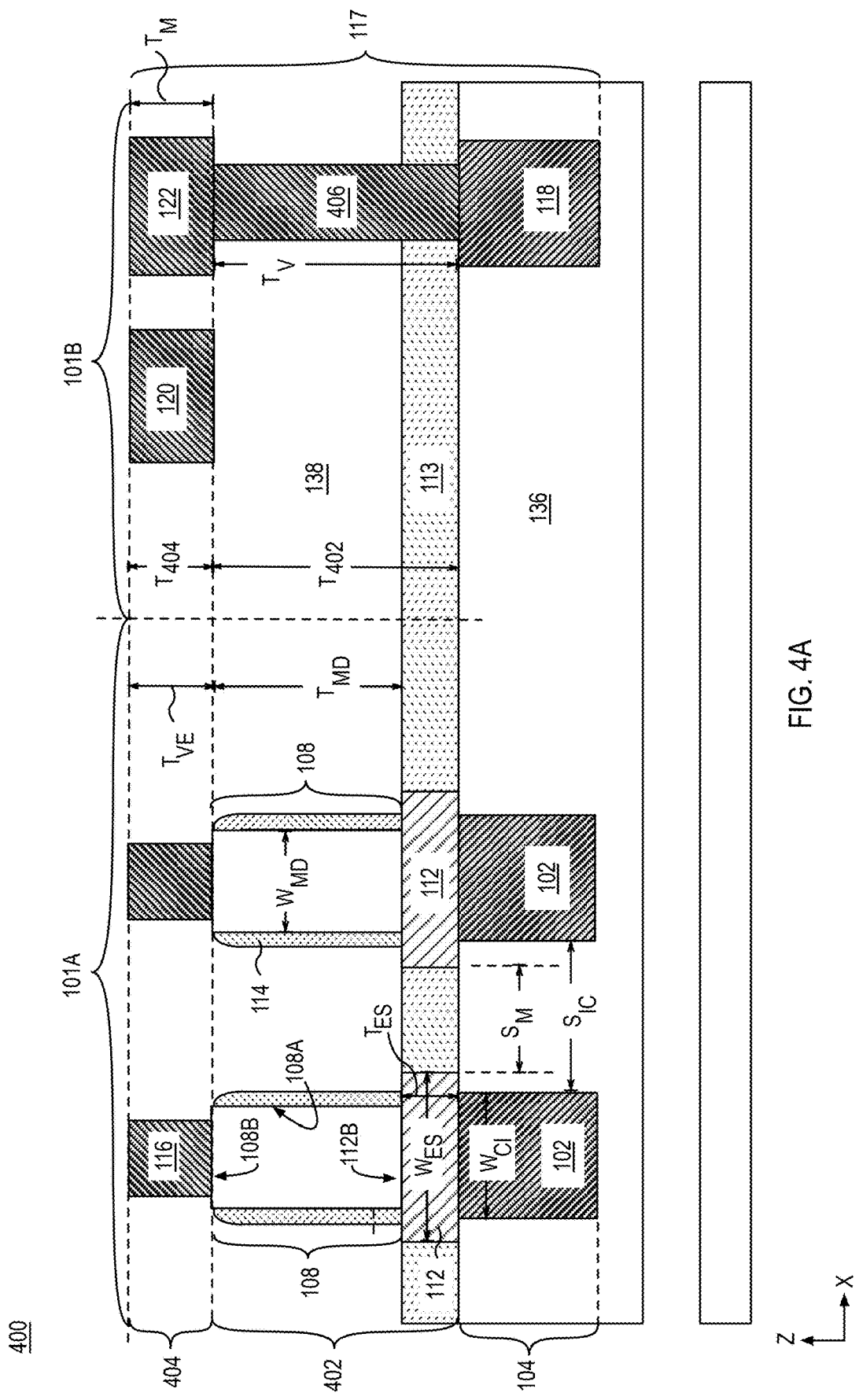
FIG. 4A is a cross-sectional illustration of a plurality of memory devices in a memory region adjacent to interconnect structures in a logic region, where the memory device and the transition electrode is within a same level as a level of a via in an adjacent logic region, in accordance with an embodiment of the present disclosure.

FIG. 4A is a cross-sectional illustration of device structure 400. Device structure 400 includes many of the features of device structure 100 including conductive interconnect 102, memory device 108, electrode structure 112, electrode structure 112, via electrodes 116, metal lines 120. In the illustrative embodiment, via structure 406 couples metal line 122 with conductive interconnect 118 . . . . The via 124 has a vertical thickness, $T_V$. $T_V$ is also a vertical thickness, $T_{402}$ of level 402. In some embodiments, $T_V$ is between 30 nm and 100 nm. In other embodiments, $T_V$ is less than 200 nm. In some such embodiments, the vertical thickness, $T_V$, of via 124 is substantially equal to a combined vertical thickness of the memory device 108 and electrode structure 112 (i.e., $T_V=T_{ES}+T_{MD}$). $T_{ES}$ and $T_{MD}$ may be co-dependently chosen to provide a combined thickness equivalent to $T_V$. In some embodiments, $T_{ES}$ may be between 5%-15% of $T_{MD}$. Via structure 406 includes a material that is the same or substantially the same as the material of the via structure 124. Although, via structure 406 is depicted as having substantially vertical sidewalls, different portions of the via structure 406, for example portion adjacent to dielectric 138 and portion adjacent to etch stop layer 113 may be tapered to different extents.

Also as shown, via electrodes 116, metal lines 120 and 122 are on a level 404 above level 402. In the illustrative embodiment, vertical thickness of via electrodes 116, $T_{VE}$, is substantially equal to vertical thicknesses, $T_M$ of metal lines 120 and 122 and can be represented by a vertical thickness $T_{404}$ of level 404.

Figure 4B:
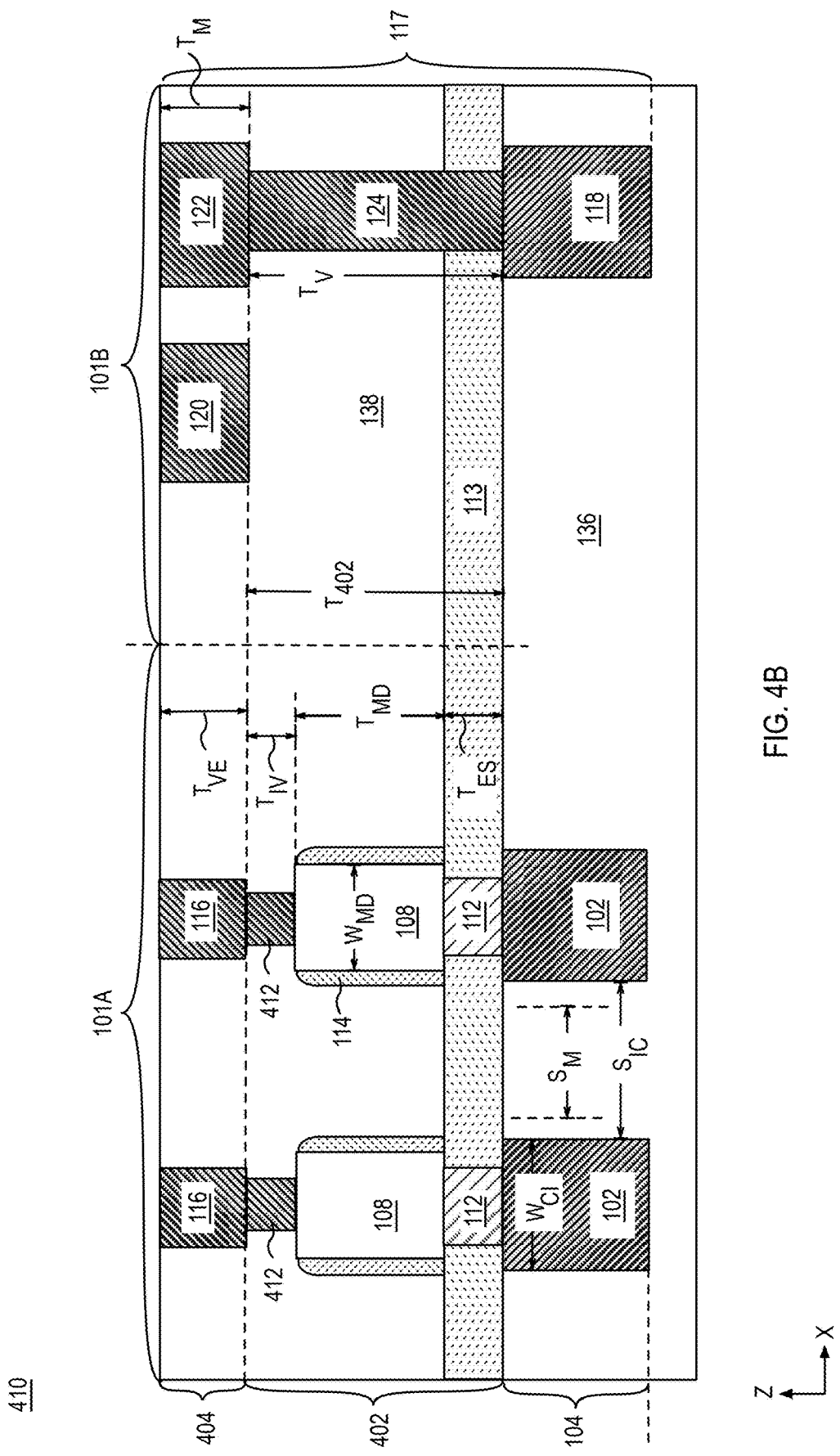
FIG. 4B is a cross-sectional illustration of a plurality of memory devices in a memory region adjacent to interconnect structures in a logic region, where the transition electrode, the memory device, and a transition via is within a same level as a level of a via in an adjacent logic region, in accordance with an embodiment of the present disclosure.

In some embodiments, it is advantageous for $T_{MD}$ to be comparable to $T_{ES}$. For example, $T_{MD}$ may be at most 2 times $T_{ES}$. In some such embodiments, $T_{MD}$ and $T_{ES}$ combined may not be equivalent to $T_V$ such as is illustrated in FIG. 4B. Device structure 410 further includes an intermediate via electrode 412 between memory device 108 and via electrode 116 to compensate for a difference in vertical thickness between $T_V$ and sum of $T_{MD}$ and $T_{ES}$. As shown, the memory region 101A of level 404 includes electrode structure 112, memory device 108 on electrode structure 112 and an intermediate via electrode 412 on memory device 108. Intermediate via electrode 412 has a vertical thickness, $T_{IV}$. In the illustrative embodiment, $T_V$ is equivalent or substantially equivalent to sum of $T_{ES}$, $T_{MD}$ and $T_{IV}$.

Figure 5:
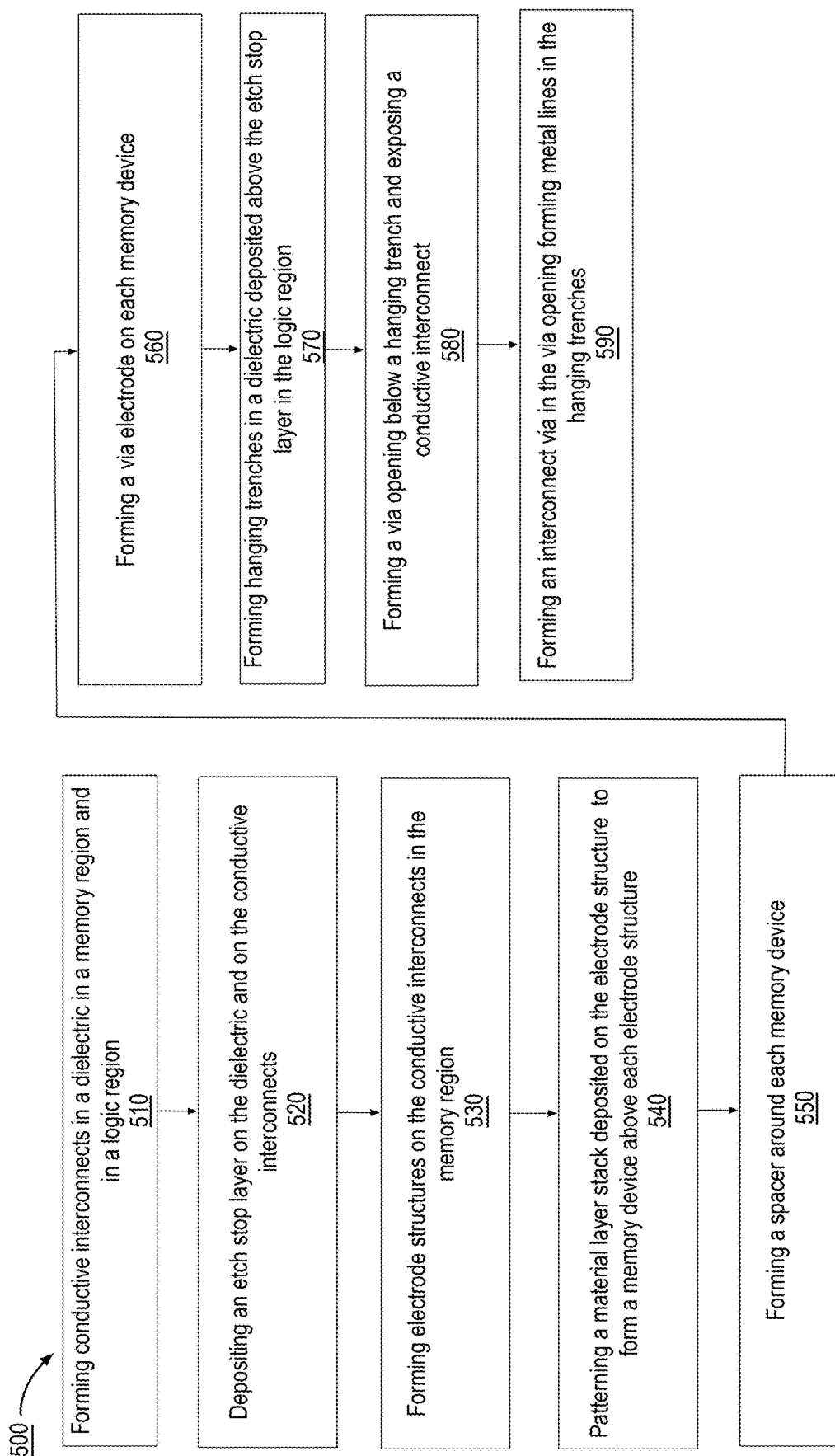
FIG. 5 is a flow diagram of a method to fabricate a memory device adjacent to interconnects in a logic region, in accordance with an embodiment of the present disclosure.

FIG. 5 is a flow diagram to form memory devices in a memory region and conductive interconnects in a logic region, in accordance with some embodiments of the present disclosure. Some operations can be performed simultaneously or out of order. The method begins at operation 510, with the formation conductive interconnects in a dielectric in a memory region and in an adjacent logic region. The method 500 continues at operation 520 with the deposition of an etch stop layer on the dielectric and on the conductive interconnects. The method continues at operation 530 with the formation of electrode structures on each of the conductive interconnects, in the memory region. The method continues at operation 540 with the process to etch a material layer stack deposited on the electrode material to form a memory device above each conductive interconnect in the memory region. The method continues at operation 550 with formation of a spacer around each memory device. The method continues at operation 560 with the formation of a via electrode on each memory device. The method continues at operation 570 with a formation of a hanging trench in a dielectric deposited above the etch stop layer in the logic region. The method continues at operation 580 with the formation of via opening below a hanging trench and exposing a conductive interconnect. The method concludes at operation 590 with the formation of conductive via in the via opening and metal lines in the hanging trenches.

FIG. 6A is a cross-sectional illustration of a plurality of conductive interconnects 102 and 118 formed within dielectric 136 above a substrate 600. In the illustrative embodiment, conductive interconnects 102, are formed in a memory region and conductive interconnect 118 is formed in a logic region. In exemplary embodiments, there may be one or more levels of transistors and interconnects between conductive interconnects 102 and 118 and substrate 600. In high density memory applications, the number of conductive interconnects 102 and 118 can range between 1K and 5K within a given array in memory region 101A. Conductive interconnects 102 and 118 have a lateral thickness, $W_{CI}$, that may be determined by a minimum acceptable electrical resistance. In some embodiments, conductive interconnects 102 are discrete structures that are substantially circular or elliptical in shape and conductive interconnect 118 is a trench line (extending into the plane of the Figure). Conductive interconnects 102 may have a maximum lateral thickness between 20 nm and 40 nm. For example, conductive interconnects 102 may have a lateral thickness between 20 nm and 40 nm, along the x-direction, as shown. In other embodiments, conductive interconnects 102 and 118 are trenches that extend into the plane of the Figure. The conductive interconnects 102 and 118 may have shapes that are independent of each other. As shown, conductive interconnects 102 have substantially the same lateral thickness to minimize variability in device performance.

In some embodiments, the conductive interconnects 102 and 118 are electrically and mechanically coupled with vias and/or lines such as via 601 and/or line 601 indicated in dashed boxes in the Figure. The via 601 and/or line 601 may include a same or substantially the same material as a material of the conductive interconnect 102.

In some embodiments, conductive interconnects 102 and 118 include a liner layer and a fill metal on the liner layer. For example, the liner layer may include a material, such as but not limited to, ruthenium, cobalt or tantalum and the fill metal may include copper or tungsten. In one or more embodiments, conductive interconnects 102 and 118 include copper fill metal on a ruthenium or a tantalum liner. In an embodiment, each of the conductive interconnects 102 are separated by spacing $S_{IC}$. $S_{IC}$ is substantially determined by a designed density of memory devices to be fabricated within a given area, as well as by underlying structures embedded within layers below conductive interconnects 102.

FIG. 6B is a cross-sectional illustration of the structure in FIG. 6A following the process to deposit an etch stop layer 113 on conductive interconnects 102 and 118 as well as on the dielectric 136. Etch stop layer 113 is deposited to a thickness, TED that is chosen to accommodate a height of an electrode structure to be formed, as well as to provide sufficient material against etching during fabrication of memory devices in the memory region 101A. In an embodiment, etch stop layer 113 also serves as a diffusion barrier layer. A diffusion barrier layer is essential for preventing diffusion of copper from conductive interconnect 118 to the memory devices to be formed or other devices within the logic region. As such, etch stop layer 113 includes a material such as but not limited to silicon and one or more of nitrogen, oxygen, or carbon.

FIG. 7A is a cross-sectional illustration of the structure in FIG. 6B following the process to etch openings 701 in etch stop layer 113 to form electrode structures. In an embodiment, photoresist mask 702 is formed by a lithographic process on etch stop layer 113. Exposed portions of etch stop layer 113 may be etched by a plasma etch process through opening in the photoresist mask 702. In the illustrative embodiment, the openings 701 have a lateral thickness, $W_O$. $W_O$ may be substantially the same across various openings 701 that are designed to form electrode structures. $W_O$ may be narrower, equal to or wider than $W_{CI}$ of conductive interconnects 102. In the illustrative embodiment, $W_O$ is less than $W_{CI}$. Openings in the substrate 600 are not illustrated in FIGS. 6B-18E, for clarity.

Shape of openings 701 may be circular or rectangular and the conductive interconnects may be discrete islands or trenches depending on embodiments. FIGS. 7A-7C illustrate different embodiments (for example portions 704A, 704B, 704C, and 704D) of a portion 704 of the conductive interconnect and opening in FIG. 7A. The photoresist mask 702 is removed for clarity.

FIG. 7B is an isometric illustration of a portion 704A of the structure in FIG. 7A, in accordance with an embodiment of the present disclosure. A cross section through opening 701 is illustrated. In the illustrative embodiment, the conductive interconnect 102 is cylindrical, where $W_{CI}$ is less than $W_O$, (for example diameter) of opening 701. As shown opening 701 is circular and $W_O$ may be, for example, a diameter of the opening 701. In other embodiments, opening 701 can be rectangular and/or extend over two or more conductive interconnects, such as for example, conductive interconnect 102. The dielectric 136 is exposed during formation of the openings 701 when $W_{CI}$ is less than $W_O$, as shown.

In some embodiments, when $W_{CI}$ is less than $W_O$, then a surface 136B of dielectric 136 may be recessed relative to an uppermost surface 136A (which is covered by the etch stop layer 113) as illustrated in embodiment portion 704B in FIG. 7C. The photoresist mask 702 is removed for clarity. Such a recess in the dielectric 136 may occur when there is a loss of selectivity or where there is limited selectivity between the material of the etch stop layer 113 and the dielectric 136. In some such embodiments, sidewalls 102A of the conductive interconnect 102 are exposed after forming opening 701.

In some embodiments, the conductive interconnect within portion 704C is a trench interconnect 306 as illustrated in FIG. 7D. In some such embodiments, the openings 701 expose different portions of uppermost surface 306A of trench interconnect 306. In the illustrative embodiment, $W_{TI}$ is less than $W_O$ and openings 701 expose uppermost surface 136A of the dielectric 136. In the illustrative embodiment, opening 701 is circular. However, in other embodiments, the opening 701 can be rectangular as indicated by dashed lines 705.

While it is desirable for the opening 701 to be substantially aligned with sidewalls of trench interconnect 306, in some embodiments, the opening 701 may be offset relative to trench interconnect 306, as is illustrated in portion 704D in FIG. 7E. Such an offset may be a result of misalignment between photoresist mask 702 and the trench interconnect 306 (or a conductive interconnect in other embodiments). The method adopted to fabricate an electrode structure within opening 701 is not impacted by misalignment as long as at least 50% of the opening 701 exposes the underlying uppermost surface 306A of trench interconnect 306.

FIG. 8A is a cross-sectional illustration of the structure in FIG. 7A following the process to deposit an electrode material on the conductive interconnects 102 and on etch stop layer 113. After deposition, the electrode material may be planarized to form electrode structure 112 within each of the openings 701. In an embodiment, the electrode material is planarized by a chemical mechanical planarization (CMP) process. The CMP process removes the electrode material from an uppermost surface 113A of the etch stop layer 113. In embodiments the electrode material includes tantalum, titanium, ruthenium, tungsten, or copper.

The CMP process may also reduce the as deposited thickness of the etch stop layer 113 to a thickness $T_{EC}$. $T_{EC}$ may be substantially uniform across the memory and logic regions 101A and 101B, respectively. There may be variations in thicknesses of up 5% from the CMP processing due to the presence of the electrode structures. Additionally, in some embodiments, the electrode structure 112 may be dished (or recessed in a concave manner) as indicated by dashed lines 801. A concaved profile may change a surface profile of each layer within a memory device to be formed. The extent of dishing may be dependent on $W_{CI}$ and on a pattern density of and spacing between the electrode structures 112.

FIG. 8B is a cross-sectional illustration of the structure in FIG. 8A following the process to form material layer stack 800 on the electrode structure 112 and on the etch stop layer 113.

The process to form material layer stack 800 includes blanket deposition of a variety of material layers depending on a type of memory device to be fabricated. In some embodiments, the material layer stack 800 includes deposition of layers for a ferroelectric memory device. In other embodiments, the material layer stack 800 includes deposition of layers for a paraelectric memory device.

In an embodiment, individual layers of material layer stack 800 (for a ferroelectric memory device) are deposited in situ, i.e., without breaking vacuum. Material layer stack 800 may be deposited by an atomic layer deposition (ALD) process, a plasma enhanced chemical vapor deposition (PECVD), chemical vapor deposition (CVD) or a physical vapor deposition (PVD) process. In some embodiments, conductive layer 800A is blanket deposited on electrode structure 112 and on etch stop layer 113. In an embodiment, conductive layer 800A includes a conductive ferroelectric oxide. The conductive ferroelectric oxide includes one of a non-Pb perovskite metal oxides, such as but not limited to, La—Sr—CoO3, SrRuO3, La—Sr—MnO3, YBa2Cu3O7, Bi2Sr2CaCu2O8, or LaNiO3.

Conductive layer 800A is deposited to a thickness, $T_1$, that is suitable for minimizing electrical resistance and to minimize tapering of sidewalls during a patterning process that will be utilized to fabricate memory devices. In some embodiments, conductive layer 800A has a thickness that is between 3 nm and 30 nm. A thickness of less than 30 nm is highly desirable to prevent significant tapering in sidewalls during the patterning process.

In an embodiment, the deposition process is continued by deposition of a dielectric layer 800B (for example, a ferroelectric dielectric layer 800B for a ferroelectric memory device). The dielectric layer 800B may be blanket deposited on the conductive layer 800A. Dielectric layer 800B has a thickness, $T_2$, that is between 1 nm and 30 nm. In some embodiments, dielectric layer 800B includes non-Pb perovskite material in the form $ABO_3$, where A and B are two cations of different sizes and O is oxygen. A is generally larger than B in size. In some embodiments, non-Pb perovskites can also be doped, e.g., by La or lanthanides. The non-Pb Perovskite material can include one or more of La, Sr, Co, Cr, K, Nb, Na, Sr, Ru, Y, Fe, Ba, Hf, Zr, Cu, Ta, Bi, Ca, Ti, and Ni.

In other embodiments, dielectric layer 800B includes a low voltage ferroelectric material sandwiched between the conductive oxide layers (800A and 800C). Low voltage materials can be of the form $AA'BB'O_3$, where A' is a dopant for atomic site A and can be an element from the lanthanides series and B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below 3 Volts is sufficiently low to be characterized as low voltage.

The deposition process is continued with a deposition of conductive layer 800C on dielectric layer 800B, In an exemplary embodiment, the conductive layer 800C includes a material that is the same or substantially the same as the material of conductive layer 800A. When conductive layers 800A and 800C include the same material, the material layer stack is symmetric. In different embodiments, conductive layer 800C can have a different thickness than conductive layer 800A. In embodiments, conductive layer 800C is deposited to a thickness, $T_3$, between 3 nm and 30 nm. Conductive layer 800C between 3 nm and 30 nm can facilitate the patterning process.

The deposition process concludes with the formation of hardmask layer 802 on conductive layer 800C. In some embodiment, hardmask layer 802 is blanket deposited by a PECVD, CVD, or PVD process. In an embodiment, hardmask layer 802 includes a material that has a favorable etch selectivity compared to the ferroelectric materials in material layer stack 800. In some embodiments, hardmask layer 802 includes materials that can be patterned with high fidelity with respect to a masking layer formed on hardmask layer 802, for example SiO2, Si3N4, DLC (Diamond Like Carbon) or Al2O3. In other embodiments, hardmask layer 802 includes a conductive material that is different from the conductive material of the ferroelectric material. In some embodiments it is desirable to deposit hardmask layer 802 to a thickness, $T_4$ that enables patterning of at least the conductive layer 800C. In other embodiments, hardmask layer 802 may deposited to a thickness, $T_4$ that depends on a total thickness of material layer stack 800. $T_4$ may be at least 20 nm. In a different embodiment, hardmask layer 802 includes a bilayer where the bilayer includes a metallic layer and a dielectric on the metallic layer.

In an embodiment, photoresist mask 804 is formed on hardmask layer 802 and is formed by a lithographic process. The photoresist mask 804 includes blocks 804A and 804B. Each block 804A-B is a mask for patterning a discrete memory device, such as for example a ferroelectric memory device.

In an embodiment, the bottom electrode 128 and top electrode 132 include paraelectric materials. Paraelectric materials may include: SrTiO3, Ba(x)Sr(y)TiO3 (where x is-0.05, and y is 0.95), HfZrO2, Hf—Si—O, La-substituted PbTiO3, or a PMN-PT based relaxor ferroelectrics. In embodiments, the paraelectric material for top electrode 132 can be different from the paraelectric material of the bottom electrode. In some embodiments, material layer stack including paraelectric materials can range from 10 nm to 100 nm in total thickness.

FIG. 9A is a cross-sectional illustration of the structure in FIG. 8B following the process to pattern hardmask layer 802. In an embodiment, hardmask layer 802 is etched by a plasma etch process. The plasma etch process may include a discharge produced by a magnetic enhanced reactive ion etching mechanism, an electron cyclotron resonance discharge or an inductively coupled plasma discharge. The plasma parameters may be characterized by a range of plasma densities such as between 1e9-1e12 ions/cm$^3$, pressures in the range of 0.001-10 Torr, and electron temperatures in the range of 1-8 eV. Ions may be accelerated to the surface from a plasma sheath by means of electrostatic chuck with biasing capabilities that are independent of the power delivered to sustain various plasma configurations. It is highly desirable to pattern hardmask layer 802 to have substantially vertical side walls to prevent increase in the lateral thickness when patterning the remaining layers in material layer stack 800.

A $CH_XF_Y$ (fluorocarbon) $O_2$ and Ar based gas combination may be utilized to etch hardmask layer 802 to form hardmask 134 in one of the three different plasma discharges described above. In an exemplary embodiment, hardmask 134 has a substantially vertical profile relative to a lowermost surface 128B. In some embodiments, photoresist mask 804 is removed after forming hardmask 134. The plasma etch process is continued to pattern conductive layer 800C. Hardmask 134 is utilized to etch conductive layer 800C. In an embodiment, a plasma etch process is utilized to etch the conductive layer 800C to form a top electrode 132. In the illustrative embodiment, top electrode 132 has substantially vertical sidewalls 132A. In some embodiments, hardmask 134 is removed during the plasma etch process as indicated by dashed lines, when the hardmask 134 includes a dielectric material. The etch process is continued to etch dielectric layer 800B to form etched dielectric layer 130 (herein dielectric layer 130).

The plasma etch process is continued to etch and form a bottom electrode 128. In an embodiment, the process utilized to etch conductive layer 800A (FIG. 8B) to form bottom electrode 128 may be substantially the same as the etch process utilized to form top electrode 132. In the illustrative embodiment, sidewalls of the memory device 108 are substantially vertical respect to a normal to lowermost surface 128B. The process of forming the top electrode 132, dielectric layer 130, bottom electrode 128 also completes formation of memory device 108.

In other embodiments, individual layers within the memory device may be formed with sidewalls that are not vertical and have a slope that is different from 90° with respect to a normal to lowermost surface 128B, as illustrated in FIG. 9B, in accordance with an embodiment of the present disclosure. Each layer may have a slope that also depends on a thickness of that particular layer. In embodiments, the slope can vary between 0 degrees to 30 degrees from a normal relative to lowermost surface 128B. The slope of each sidewall (e.g., 128A, 130A, 132A) may be defined by an angle theta. It is to be appreciated that that sidewalls 132A, 130A and 128A can have same or different slopes. As indicated by dotted lines 901, 902 and 903 variations in the slope of sidewall 128A, 130A and 132A, respectively can change the lateral thickness, $W_{BE}$, of lowermost surface 128B.

A maximum slope in a sidewall of layers (for e.g., bottom electrode 128, dielectric layer 130, or top electrode 132) may be labeled by theta$_{max}$. In some embodiments, theta$_{3max}$ is between 0 and 10 degrees where when $T_1$ (thickness of bottom electrode 128) is less than 30 nm. In some such embodiments, $T_2$ (thickness of layer 130) is less than 10 nm, and $T_3$ (thickness of top electrode 132) is less than 30 nm.

In some embodiments, theta$_1$<theta$_2$<theta$_3$, where each of theta1, theta2, theta$_3$ remain less than 10 degrees. In other embodiments, theta$_1$ may be substantially close to 0, theta$_2$ can be between 10 and 30 degrees, and thetas can be less than 10 degrees. In yet other embodiments, theta$_1$ is substantially close to 0 degrees, theta$_2$ is less than 30 degrees, and theta$_3$ is substantially close to 0. In yet other embodiments, theta$_1$ is substantially close to 0 degrees, theta$_2$ is less than 30 degrees, and thetas is substantially close to 0 degrees, where theta$_1$, theta$_2$, and theta$_3$ are different from each other. In some embodiments, theta$_1$ is substantially less than 10 degrees, theta$_2$ is substantially close to 0 and theta$_3$ is substantially less than 10 degrees.

In various embodiments, by scaling down $T_{MD}$ from 90 nm, an average flare of the memory device 108 can be increased, for example up to 30 degrees. An average flare is defined as a sum of different theta angles divided by three.

Regardless of the difference between theta$_1$, theta$_2$ or theta$_3$, in exemplary embodiments sidewall of memory device 108 do not have staircase sidewall profile, where for example an uppermost surface of bottom electrode 128 is wider than a lowermost surface of dielectric layer 130.

Sloped sidewalls 128A cause the lateral thickness, $W_{BE}$, of the bottom electrode 128 to be wider than lateral thickness $W_{TE}$ of an uppermost surface of top electrode 132. In the illustrative embodiment, the bottom electrode 128 extends beyond sidewalls 130A of the dielectric layer 130.

It is to be appreciated that in some embodiments, the hardmask 134 may be further eroded during the etching process utilized to form bottom electrode 128. In an embodiment, the top of hardmask 134 may be rounded.

In some embodiments, theta$_1$, theta$_2$, and theta$_3$ are substantially the same and sidewalls 132A, 130A, 128A are substantially collinear as illustrated in FIG. 9C. In some such embodiments, theta$_1$, theta$_2$ and theta$_3$ are each less than 10 degrees. In further some such embodiments, theta$_1$, theta$_2$, and theta$_3$ are each less than 10 degrees but greater than 5 degrees.

While a sloped sidewall is shown, some reasons for minimizing flare are to provide uniformity in device performance and to reduce space, S$_{MD}$, between any two adjacent memory devices 108 to form spacers on sidewalls 108A.

Figure 10A:
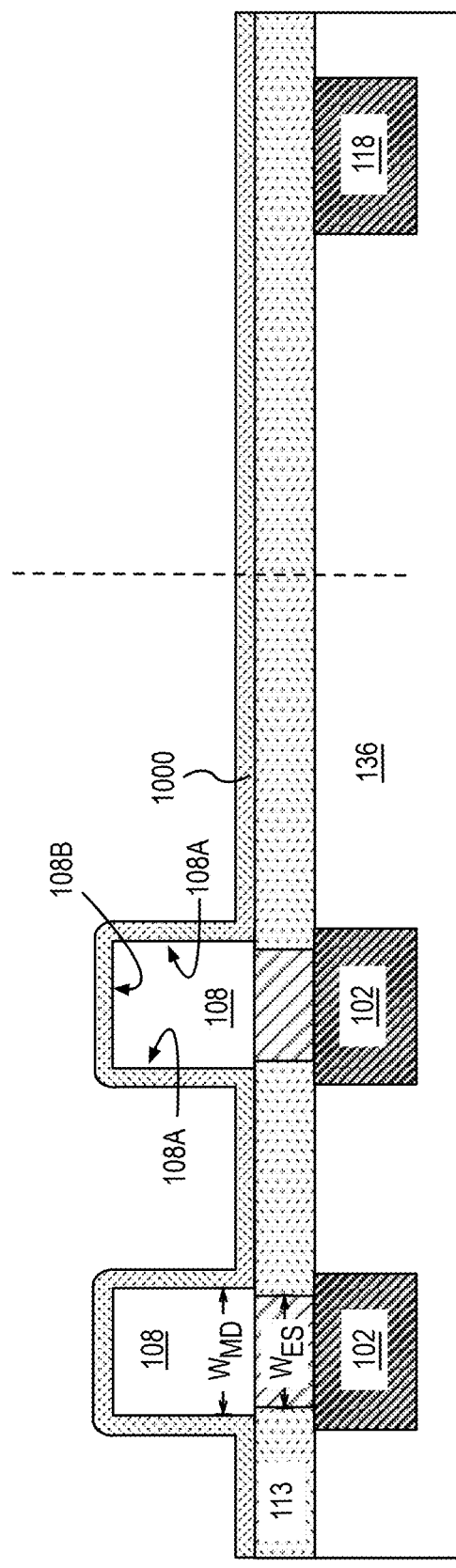
FIG. 10A is a cross-sectional illustration of the structure in FIG. 9A following the process to deposit an encapsulation layer.

FIG. 10A is a cross-sectional illustration of the structure in FIG. 9A following the process to deposit an encapsulation layer 1000 on memory device 108 and on etch stop layer 113. In the illustrative embodiment, the electrode structure 112 is not exposed to the encapsulation layer 1000. In an embodiment, encapsulation layer 1000 includes an insulator material that provides a hermetic seal for the individual layers in memory device 108 against impacts of downstream processing. Electrical insulator materials that are substantially easy to pattern include silicon and one or more of carbon, nitrogen, and oxygen. Encapsulation layer 1000 may be deposited by a PVD, PECVD, or an ALD process. The deposition process may be conformal on sidewalls 108A of memory device 108.

In other embodiments, encapsulation layer 1000 can also have a profile that is dependent on profile of sidewall 108A. For example, an encapsulation layer 1000 may be advantageously deposited using a PVD process to form a wider portion adjacent to uppermost surface 108B and narrower portion on sidewalls 108A and at the base of memory device 108. Such a deposition technique may be advantageous when sidewall 108A is tapered. Spacer 114 may be deposited to a thickness T$_{EC}$ between 5 nm and 30 nm. The thickness, T$_{EC}$, depends on a maximum spacing, S$_{MT}$, between adjacent memory devices 108.

In some embodiments, where W$_{ES}$ is greater than W$_{MD}$, the encapsulation layer 1000 is also deposited on an uppermost surface of the encapsulation layer 1000.

Figure 10B:
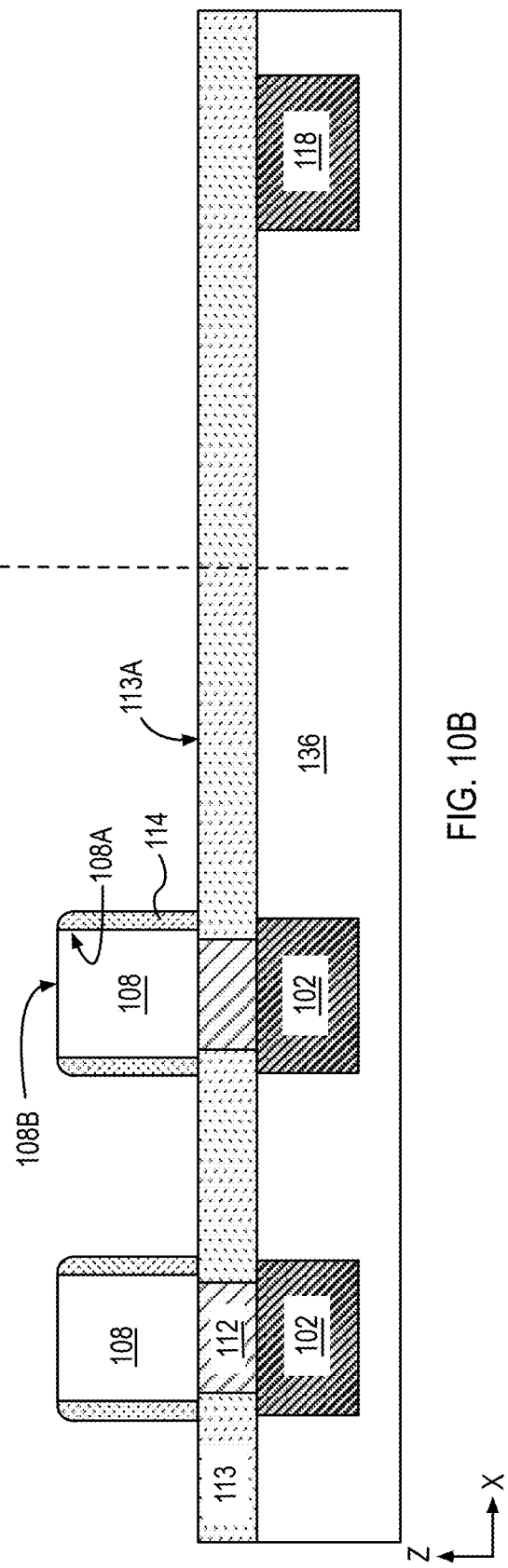
FIG. 10B is a cross-sectional illustration of the structure in FIG. 10A following the process to etch the encapsulation layer.

FIG. 10B is a cross-sectional illustration of the structure in FIG. 10A following the process to etch the encapsulation layer to form a spacer 114. In the illustrative embodiment, the encapsulation layer is etched from an uppermost surface 108B of each of the memory devices 108, and from uppermost surface 113A by a plasma etch process selective to the etch stop layer 113 and uppermost layer of the memory devices 108.

Figure 10C:
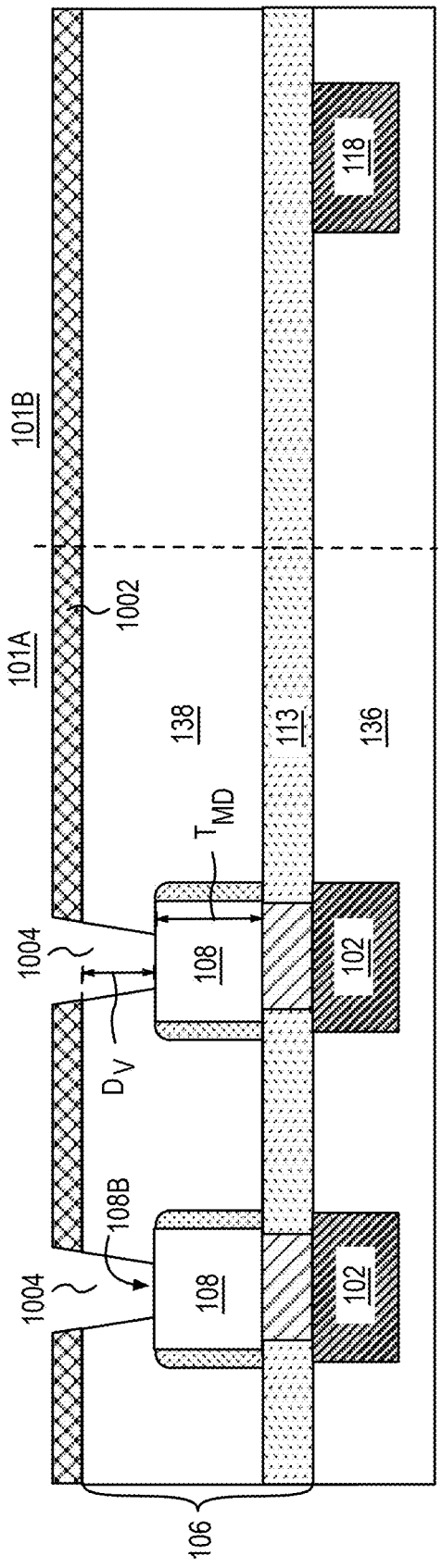
FIG. 10C is a cross-sectional illustration of the structure in FIG. 10B following the process to form openings in a second dielectric formed above the memory devices.

FIG. 10C is a cross-sectional illustration of the structure in FIG. 10B following the process to deposit a dielectric 138 and then form openings 1004 in a dielectric 138, in accordance with an embodiment of the present disclosure.

In an embodiment, the dielectric 138 is formed on the etch stop layer 113, on spacer 114 and on each of the memory devices 108. In an embodiment, a blanket deposition process is utilized to deposit dielectric 138 on spacer 114, on the memory devices 108 and on etch stop layer 113. The deposition process may be carried out by a PVD, a PECVD, an atomic layer deposition (ALD), or a chemical vapor deposition (CVD) process. Dielectric 138 may be planarized after deposition. Mask 1002 may be formed on the dielectric 138 by a lithographic process.

In some embodiments, openings can be first formed in the memory region 101A and subsequently in the logic region 101B, or vice versa. In the illustrative embodiment, openings 1004 are first formed in the memory region 101A.

A plasma etch process is utilized to etch the dielectric 138 to form opening 1004. The etch exposes an uppermost surface the logic region 101B of the memory device 108. In the illustrative embodiment, the openings 1004 are tapered. In other embodiments, openings 1004 are substantially vertical. The openings 1004 have a depth D$_V$. D$_V$ will depend on T$_{MD}$ and on a thickness of the dielectric 138.

Figure 10D:
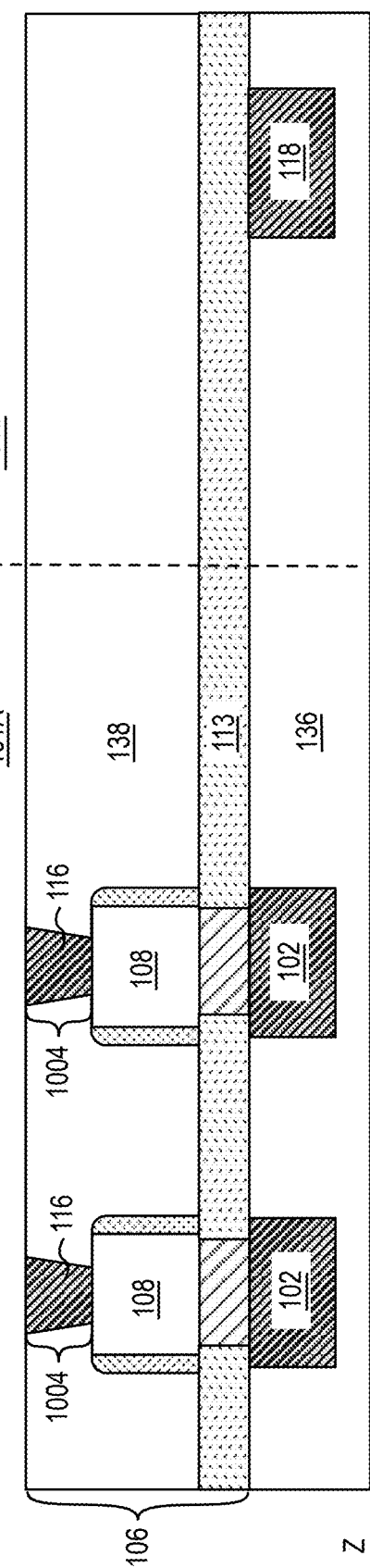
FIG. 10D is a cross-sectional illustration of the structure in FIG. 10C following the process to remove the mask and deposit a conductive material to form via electrodes.

FIG. 10D is a cross-sectional illustration of the structure in FIG. 10C following the process to remove the mask 1002 and deposit a conductive material to form via electrodes 116. In an embodiment, one or more liner layers are formed in opening 1004 on the uppermost layer of memory device 108. In some embodiments, a fill metal such as copper, tungsten, nickel, cobalt is deposited on a liner layer. The liner layer may include ruthenium or tantalum. A planarization process may be performed to remove the excess conductive material deposited on dielectric 138. In an embodiment, the planarization process includes a chemical mechanical polish (CMP) process.

FIG. 10E is a cross-sectional illustration of the structure in FIG. 10D following the process to form mask 1005 on dielectric 138, and on the via electrodes 116, and following the process to etch dielectric 138 to form hanging trench openings 1006A and 1006B in logic region 101B. Mask 1005 is designed to form an interconnect structure in logic region 101B. In an embodiment, mask 1005 is formed by a lithographic process and includes a photoresist material. In different embodiments, D$_H$ can be equal, less than or greater than D$_V$. In general D$_H$ may depend on interconnect circuitry within level 106.

In an embodiment, a plasma etch process is utilized to etch dielectric 138 through openings in mask 1005 to form hanging trench openings 1006A and 1006B. Dielectric 138 may be etched to a depth, D$_H$ and a width, W$_H$, that is determined by a thickness T$_O$, of dielectric 138 above the etch stop layer 113. In embodiments, T$_H$ and W$_H$ range between 10 nm and 200 nm and between 10 nm and 50 nm, respectively. W$_H$ is determined by a width of interconnect vias to be formed within the trench. A height, difference between T$_O$ and T$_H$, of the remaining dielectric 138 (as measured from an uppermost surface of etch stop layer 113) may also be determined by a height and width of a via to be formed within hanging trench opening 1006A. The height and width of a via is determined by a desired minimum line conductance of the via to be formed within hanging trench opening 1006A.

FIG. 10F is a cross-sectional illustration of the structure in FIG. 10E following the process to etch dielectric 138 to form a via below the hanging trench in logic region 101B. In an embodiment, mask utilized to form hanging trench openings 1006A and 1006B is removed and a mask 1007 is formed. In an embodiment, mask 1007 is formed by a lithographic process and includes a photoresist material. Mask 1007 has an opening 1008 within hanging trench opening 1006A that is designed to enable etching the dielectric 138 to form a via opening in a subsequent operation. The opening 1008 has a lateral thickness W$_V$. The opening may be symmetric about the hanging trench opening 1006A or offset. W$_V$ can range between 25%-75% of W$_H$.

FIG. 10G is a cross-sectional illustration of the structure in FIG. 10F following the process to etch dielectric 138 to form a via opening 1008A below the hanging trench opening 1006A in logic region 101B. In an embodiment, a plasma etch process is utilized to form via opening 1008A by etching the dielectric 138 and etch stop layer 113. In an embodiment, the dielectric 138 is first etched and the etch is halted. The plasma etch process is continued with a different chemistry to etch stop layer 113. An advantage of the process methodology outlined herein, is that etch stop layer 113 has a thickness, $T_{EC}$, that is determined by a deposition process and by the formation of electrode structure 112 in memory region 101A. Formation of via opening 1008A within etch stop layer 113 can be targeted and tuned by fixing a thickness of the etch stop layer 113 to a desired thickness. In the illustrative embodiment, the formation of via opening 1008A exposes an uppermost surface 118A of conductive interconnect 118. The via opening 1008A may have a first slope within dielectric 138 and a second slope within etch stop layer 113 due to a difference in material between the dielectric 138 and etch stop layer 113.

FIG. 10H is a cross-sectional illustration of the structure in FIG. 10G following the process to remove the mask and deposit a conductive material into the openings to form via 124, and metal lines 120. Mask utilized to form via opening 1008A is removed and a conductive material is deposited into the hanging trench openings 1006A and 1006B and via opening 1008A. In an embodiment, the conductive material includes a material that is the same or substantially the same as the material of the via electrode 116, including embodiments with or without one or more liner layers and fill metal. In some embodiments, a fill metal includes copper, tungsten, nickel or cobalt, and a liner layer includes ruthenium or tantalum. In some such embodiments, the liner layer is deposited on uppermost surface 118A of the conductive interconnect 118, on sidewalls of etch stop layer 113, dielectric 138, on uppermost dielectric surface 138A and on surfaces of via electrodes 116. In other embodiments where no liner is implemented a fill metal or a conductive material is directly deposited on uppermost surface 118A of the conductive interconnect 118, on sidewalls of etch stop layer 113, dielectric 138, on uppermost dielectric surface 138A and on surfaces of via electrodes 116.

A planarization process may be utilized to remove an excess conductive material deposited on dielectric 138 and on via electrodes 116. In an embodiment, the planarization process includes a chemical mechanical polish (CMP) process. The CMP process isolates metal lines 120 and 122 within hanging trench openings 1006A and 1006B. Via 124 is formed at the same time as metal line 122.

In the illustrative embodiment, uppermost surfaces 116A of via electrode 116 and uppermost surfaces 120A, 122A of metal line are co-planar or substantially co-planar after the CMP process.

In general, via electrodes 116 may be fabricated before or after fabrication of via 124 and metal line 122. The method described in association with FIGS. 8A-F can be performed so as to fabricate via 124 and metal line 122 prior to fabrication of via electrode 116, as is described herein.

Figure 11A:
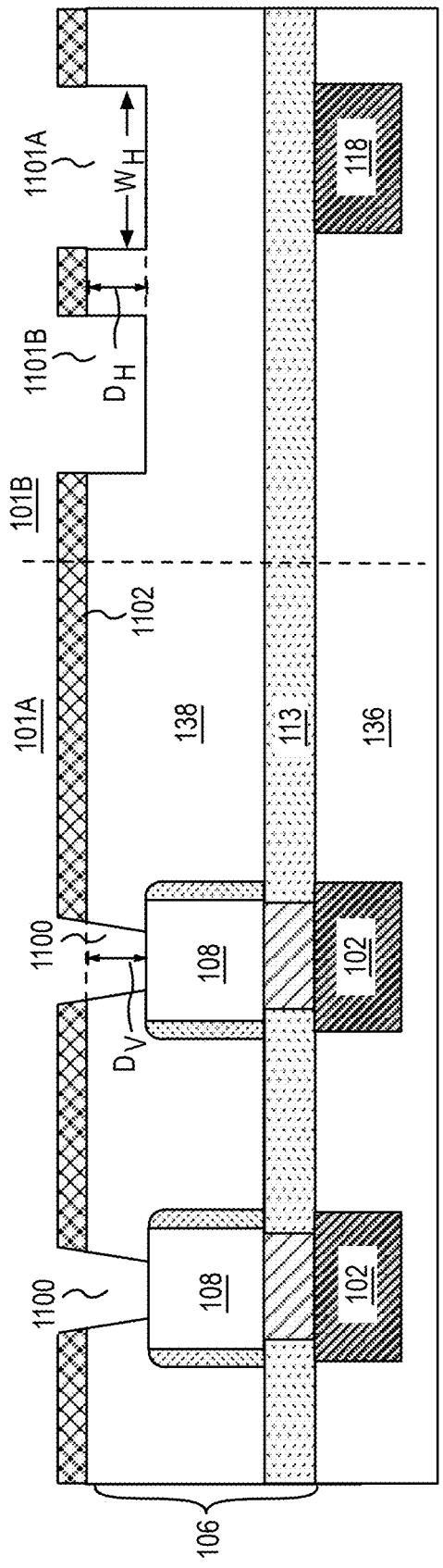
FIG. 11A illustrates the structure of FIG. 10B following the process to form openings in a second dielectric formed above the memory devices and simultaneously form trench openings in the logic region, in accordance with some embodiments.
Figure 11B:
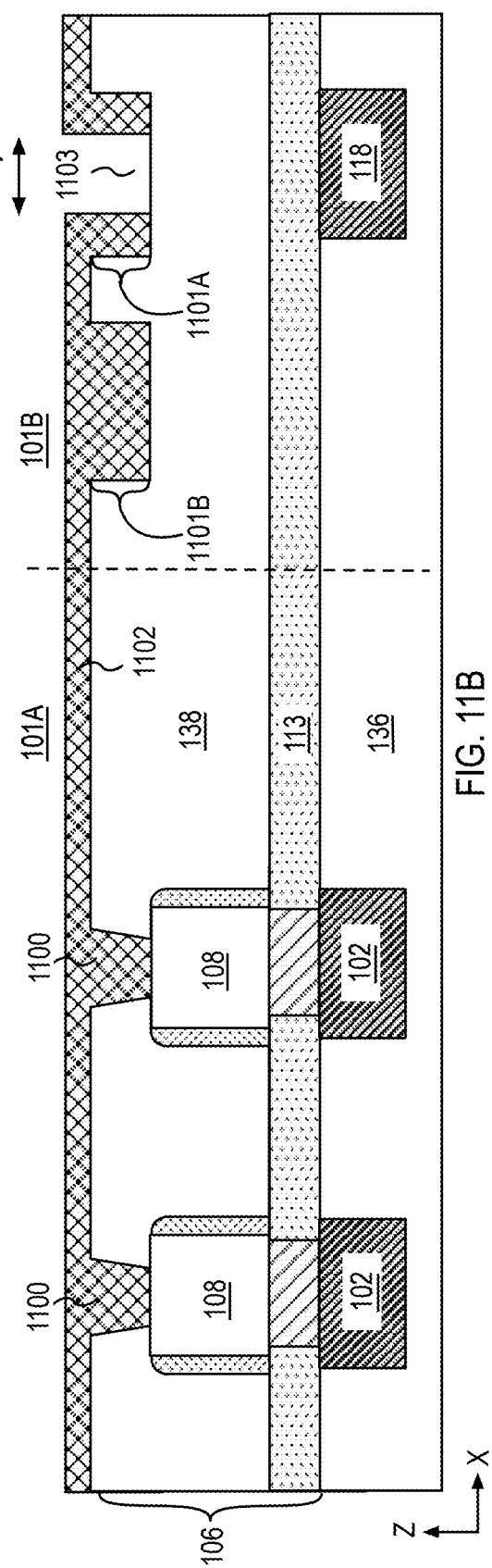
FIG. 11B illustrates the structure of FIG. 11A following the process to form a mask on the second dielectric in the openings in the memory region, in the trench openings.

In other embodiments, such as is illustrated in FIG. 11A, openings 1100 above the memory devices 108, and trench openings 1101A and 1101B can be formed simultaneously. In an embodiment, a plasma etch is utilized to etch dielectric 138 selective to memory devices 108. As shown, openings 1100 have a depth $D_V$, and trench openings 1101A and 1101B have a depth $D_H$. In some embodiments, $D_V$ is substantially equal to $D_H$. However, in some embodiments, an over etch may be performed to ensure an uppermost surface 108B of each memory device 108 is exposed for contact. An over etch may increase a depth $D_H$ of trench openings 1101A and 1101B relative to $D_V$. $D_H$ can be greater by up to 10% compared to $D_V$. Trench openings 1101A and 1101B have a width, $W_H$. $W_H$ can be the same or different for trench openings 1101A and 1101B FIG. 11B is a cross-sectional illustration of the structure in FIG. 11A following the process to form mask 1102, in accordance with an embodiment of the present disclosure. Mask 1102 covers openings 1100 and portions of trench opening 1101A and all of trench opening 1101B, as shown. Mask 1102 includes an opening 1103 within trench opening 1101A to define a via opening in a subsequent operation.

Figure 11C:
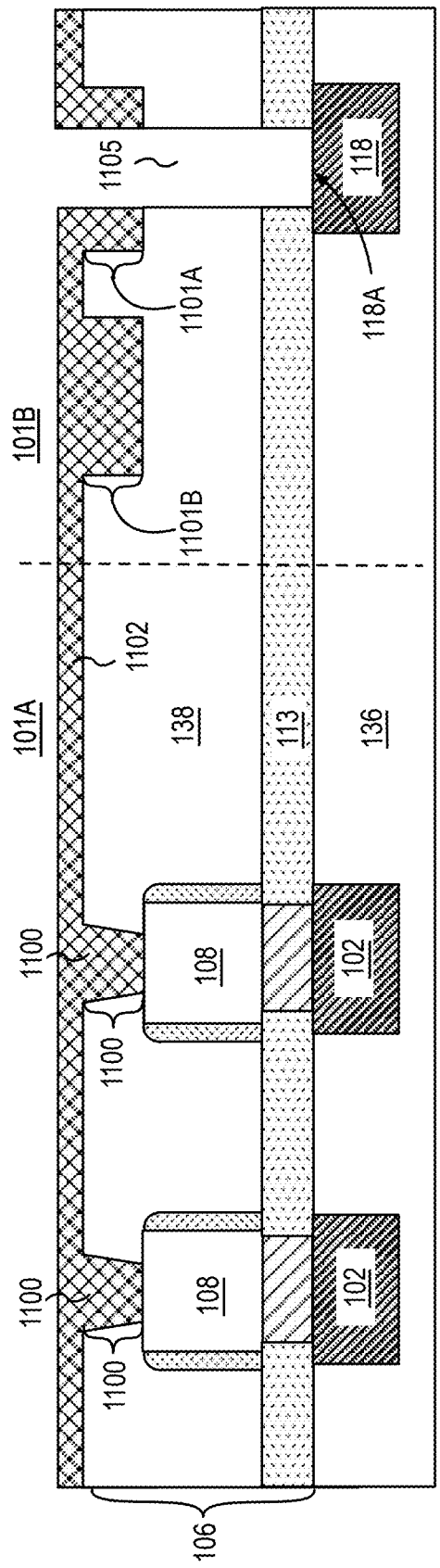
FIG. 11C illustrates the structure of FIG. 11B following the process to form an opening under the trench, where the opening exposes a conductive interconnect in the logic region, in accordance with an embodiment of the present disclosure.

FIG. 11C is a cross-sectional illustration of the structure in FIG. 11B following the process to etch an opening in the dielectric 138 below the trench opening 1101A. plasma etch process described in association with FIG. 10G may be performed to form via opening 1105. The plasma etch etches a remainder of the dielectric 138 below a depth $D_H$, etch stop layer 113 and exposes uppermost surface 118A. Mask 1102 is removed after formation of opening 1105.

Figure 11D:
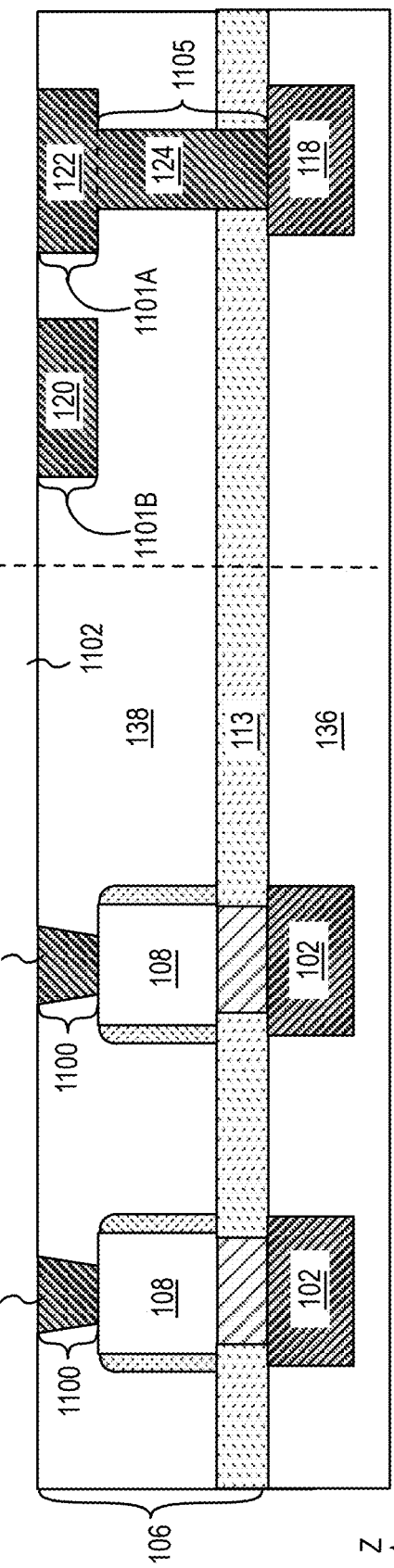
FIG. 11D illustrates the structure of FIG. 11C following the process to remove the mask and expose a memory device in each opening in the memory region, and remove the mask in the logic region, followed by formation of via electrodes in the openings in the memory region and metal lines and via in the logic region.

FIG. 11D is a cross-sectional illustration of the structure in FIG. 11C following the process to form via electrodes 116, metal lines 120 and 122 and via 124. A deposition process and planarization process described in association with FIG. 10H can be utilized to fill openings 1100, trench openings 1101A and 1101B and via opening 1105, and form via electrodes 116, metal lines 120 and 122 and via 124.

FIG. 12A is a cross-sectional illustration of an embodiment of the structure in FIG. 9A, in accordance with an embodiment of the present disclosure. In an embodiment, the plasma etch process utilized to form memory devices 108 can remove portions of the etch stop layer 113. In the illustrative embodiment, portions of the etch stop layer 113 not covered by the memory devices 108 are recessed by the plasma etch process. The plasma etch forms a surface 113B that is recessed below an uppermost surface 113A (under the memory device 108). In some embodiments the surface 113B is substantially planar as shown. The amount of recess of surface 113B relative to uppermost surface 113A depends on the severity of the plasma etch process. In some embodiments, the recess has a depth, $D_R$, that can be between 1 nm-3 nm.

Also as shown, the recess can form a sidewall 113C in the etch stop layer 113. The sidewall 108A acts as a mask while etching of the etch stop layer 113 to form sidewall 113C. The sidewall 113C may be substantially vertical as shown. In some embodiments, such as is illustrated in the enhanced cross-sectional illustration within box 1200, the sidewall 113C may be substantially curved.

It is to be appreciated that the etch stop layer 113 may be uniformly reduced throughout in memory region 101A and in logic region 101B, as shown. However, in some embodiments, recess in etch stop layer 113 in a vicinity of patterned structures such as between adjacent memory devices 108 may be greater than in open fields such as in the logic region 101B. $D_R$ in open fields may be 5% lower than $D_R$ in densely patterned areas.

FIG. 12B is a cross-sectional illustration of the structure in FIG. 12A following the process to form an encapsulation layer 1202. Encapsulation layer 1202 includes a material that is the same or substantially the same as the material of the encapsulation layer 1000. The encapsulation layer 1202 is deposited on the sidewall of the memory device 108, on sidewall 113C and on the surface 113B. In the illustrative embodiment, encapsulation layer 1202 is substantially conformal on the sidewalls 108A, 113C and on surface 113B.

FIG. 13A is a cross-sectional illustration of the structure in FIG. 12B following the process to etch the encapsulation layer 1202 to form spacer 1300. The process to etch and form spacer 114 is substantially the same as the process to etch and form spacer 114 described in association with FIG. 10B. In the illustrative embodiment, a spacer etch process utilized selectively removes portions of the encapsulation layer without recessing surface 113B and forms spacer 1300 adjacent to the memory device 108 and adjacent to sidewall 113C.

In some embodiments, where the material of the spacer 1300 is substantially similar to the material of the etch stop layer 113, further recess of surface 113B away from a sidewall 1300A of spacer 1300 may be possible.

FIG. 13B is a cross-sectional illustration of the structure in FIG. 12B, following the process to form a spacer 1300 in accordance with an embodiment of the present disclosure. In the illustrative embodiment, similarity between material of the spacer 1300 and the material of the etch stop layer 113 can cause the plasma etch process to have limited selectivity. In some such embodiments, portions of etch stop layer 113 exposed after formation of spacer 1300 may be recessed during an over etch process. An over etch process may be utilized to remove successful remove portions of the encapsulation layer from across an entire wafer substrate and account for variations in etch rates across the wafer substrate.

In the illustrative embodiment, the etch stop layer 113 is recessed away from a vicinity of sidewall 1300A. The recess reduces an effective thickness, $T_{EC}$ of the etch stop layer 113 and forms a surface 113D that is below surface 113B but above lowermost surface 113E. Also as shown, the etch process forms a sidewall 113F in the etch stop layer 113. In the illustrative embodiment, the sidewall 113F is substantially vertical and is substantially aligned with sidewall 1300A. In other embodiments, sidewall 113F can be sloped or curved.

In further embodiments, when the etch stop layer 113 is sufficiently thin after formation of the electrode structure 112. In some such embodiments, the process to form spacer 1300 may remove the etch stop layer entirely after formation of spacer 1300.

Figure 13C:
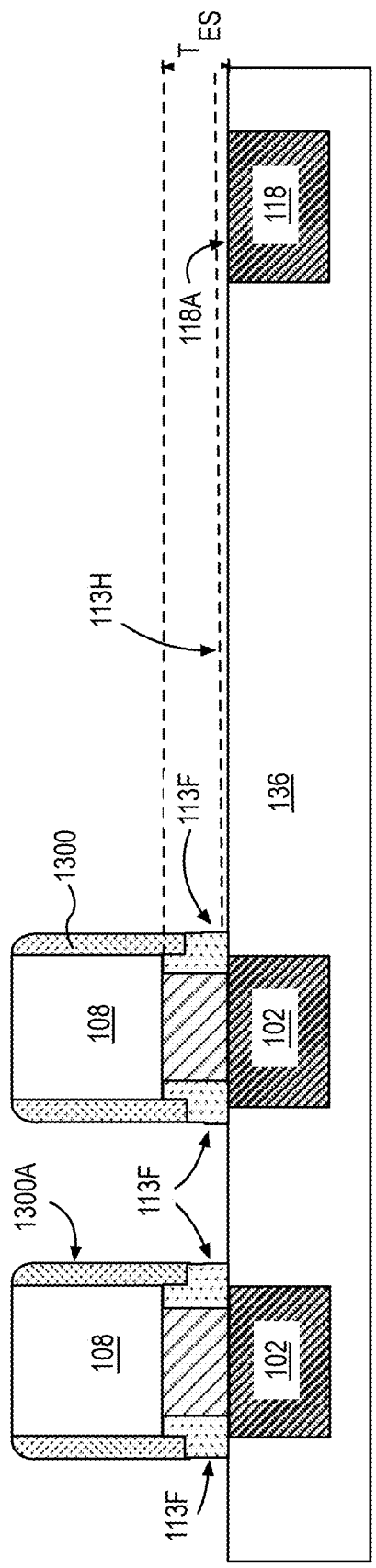
FIG. 13C is a cross-sectional illustration of the structure in FIG. 12B following the process to form spacer, in accordance with embodiments of the present disclosure.

FIG. 13C is a cross-sectional illustration of the structure in FIG. 12B following the process to form spacer 1300, in accordance with embodiments of the present disclosure. In some such embodiment, loss of etch selectivity can remove an entire thickness, $T_{EC}$, of the etch stop layer 113 away from the vicinity of the memory devices 108 while forming spacer 1300. In the illustrative embodiment, sidewalls 113F of the etch stop layer 113, and uppermost surfaces 118A and 136A are exposed. Loss of etch stop layer 113 while formation of spacer 1300 does not impact electrical performance of memory devices 108, because memory device 108 is hermetically sealed by spacer 1300. However, exposure of conductive interconnect 102 and uppermost surface 118A may not be desirable for device fabrication. In some embodiments, as is illustrated, portions of the etch stop layer 113 may remain in the logic region 101B as indicated by dashed line 113H.

Figure 14A:
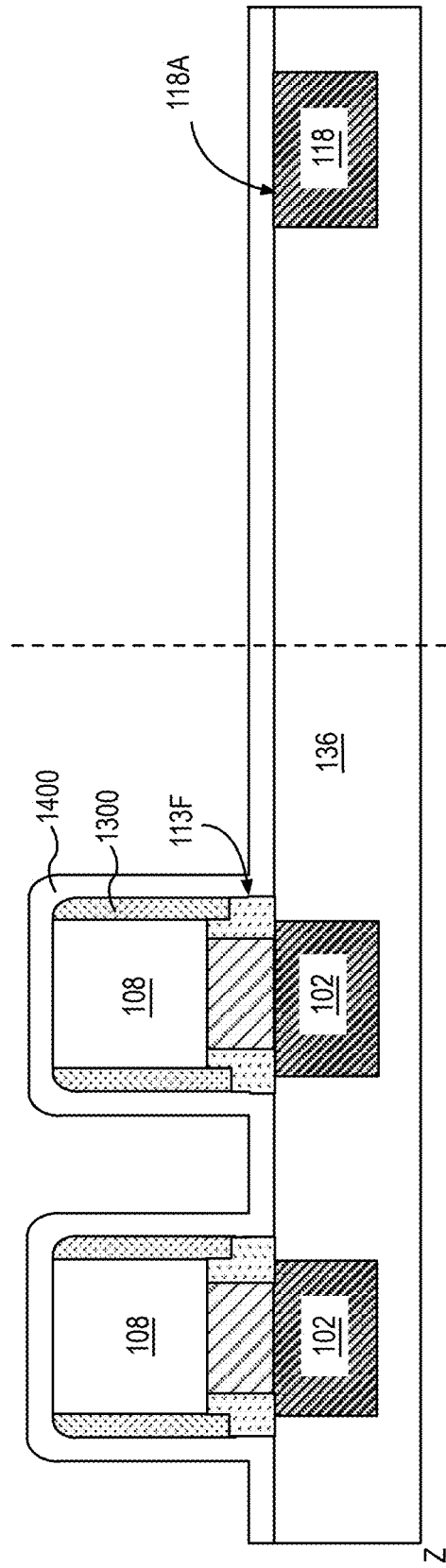
FIG. 14A is a cross-sectional illustration of the structure in FIG. 13C following the formation of an encapsulation layer to provide a barrier against diffusion of material from one or more conductive interconnects in the logic region.

FIG. 14A is a cross-sectional illustration of the structure in FIG. 13C following the formation of an encapsulation layer 1400 to provide a barrier against diffusion of material (for e.g., copper) from conductive interconnect 118. In an embodiment, the encapsulation layer 1400 is blanket deposited by an ALD, PVD, or CVD technique. The encapsulation layer 1400 includes one or more of silicon, nitrogen, oxygen, carbon, and aluminum. The encapsulation layer 1400 is formed on the spacer 1300, memory device 108, on sidewall 113F, on dielectric 136 and on conductive interconnect 118 including uppermost surface 118A, as shown. In some embodiments, encapsulation layer 1400 may be formed to a thickness of less than 5 nm. In other embodiments, the encapsulation layer 1400 may be formed to a thickness of between 20 nm and 70 nm.

As discussed above, in some embodiments, portions of the etch stop layer 113 may remain in the logic region 101B as indicated by dashed line 113H (in FIG. 13C). In some such embodiments, the encapsulation layer 1400 is deposited on the portions of the etch stop layer 113.

After deposition of the encapsulation layer 1400, further processing may be carried out as described above in association with FIGS. 10C-10H.

Figure 14B:
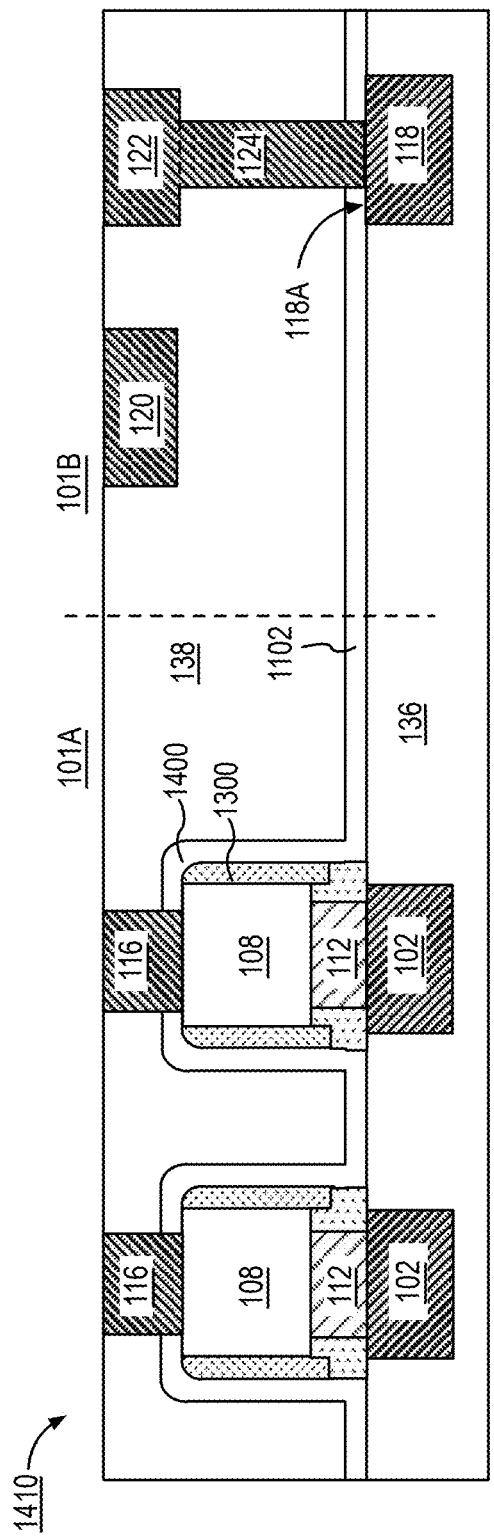
FIG. 14B is a cross-sectional illustration of a device structure that includes the encapsulation layer in FIG. 14A, in accordance with an embodiment of the present disclosure.

FIG. 14B is a cross-sectional illustration of a device structure 1410, that includes the encapsulation layer 1400, in accordance with an embodiment of the present disclosure. The device structure 1410 includes many features of the device structure 100, such as conductive interconnects 102, memory devices 108, spacer 1300, conductive interconnect 118, via electrodes 116, metal lines 120, 122, and via 124. Formation of the via electrode 116 includes implementing an extra break through etch to remove portions of the encapsulation layer 1400 to expose memory devices 108.

Formation of via 124 is performed by a method similar to method described in association with FIG. 11C. However, portions of the encapsulation layer 1400 covering the conductive interconnect 118 are etched instead of etching an etch stop layer.

Figure 14C:
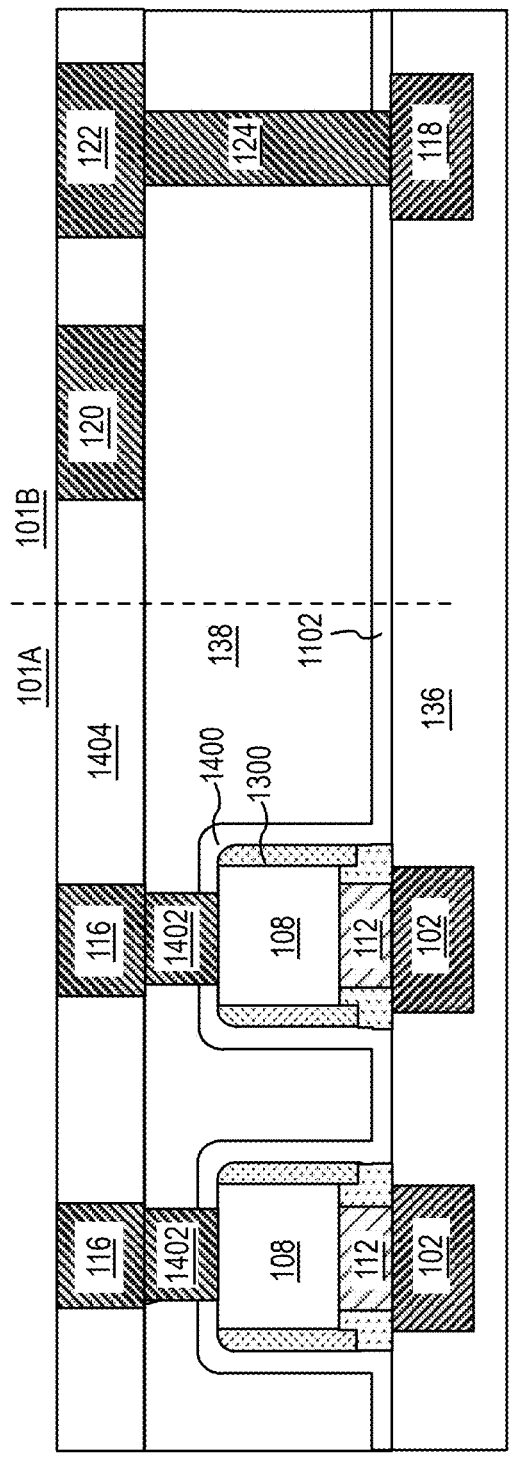
FIG. 14C is an embodiment of the structure in FIG. 14B where formation of a metal line in the logic region is independent of formation of a via coupling the metal line with a conductive interconnect the logic region.

FIG. 14C is an embodiment of the structure in FIG. 14B where formation of metal lines 120 and 122 are independent of via 124. Via 124 may be formed before or after formation of via electrodes 1402. In an embodiment, via 1402 includes one or more materials of via electrode 116. After formation of via electrode 1402 (using techniques described above), a dielectric 1404 may be deposited on the via electrodes 1402, dielectric 138 and on via 124. Via electrodes 116 and metal lines 120 and 122 may be formed by etching the dielectric 1404 to form a plurality of openings followed by deposition of conductive material and a planarization process. In an embodiment, dielectric 1404 includes a material that is the same or substantially the same as the material of the dielectric 138.

FIG. 15A is an embodiment of the structure in FIG. 9A following the formation of memory devices 108. In the illustrative embodiment, the electrode structure 112 is wider than the conductive interconnect 102 as well as the memory device 108 (i.e., $W_{ES}>W_{MD}$ and $W_{CI}$). In some such embodiments, the plasma etch process utilized to form the various layers (such as for example, layers 132, 130 and 128) in the memory device 108, can also etch portions of the electrode structure 112. The resultant shape of the electrode structure 112 is dependent on the nature of the etch and in particularly the material and thickness of the bottom electrode 128.

A portion 1500 of the memory device 108, electrode structure 112 and etch stop layer 113 is expanded to describe different embodiments in FIGS. 15B-16B.

FIG. 15B is an embodiment where the memory device 108 includes sloped sidewalls 108A and where the etch process utilized to form the memory device 108 also etches a portion of the electrode structure 112. In the illustrative embodiment, the plasma etch etches the electrode structure 112 away from the sidewall 108A and forms a sloped surface 112C.

FIG. 16A is a cross-sectional illustration of the structure in FIG. 15B following the process to form an encapsulation layer 1600 on the sloped sidewalls 108A and on the surface 112C that is curved. In the illustrative embodiment, the encapsulation layer 1600 includes a material that is the same or substantially the same as the material of the encapsulation layer 1000 and may be formed by a similar method utilized to deposit encapsulation layer 1000.

FIG. 16B is a cross-sectional illustration of the structure in FIG. 16A following the process to form a spacer on a sloped sidewall 108A. In an embodiment, spacer 1602, formed by etching the encapsulation layer 1600 (FIG. 16A), is substantially conformal as shown. In some such embodiments, outermost sidewalls 1602A of spacer 1602 are substantially aligned with a sloped sidewall 108A of memory device 108. In other embodiments, the spacer 1602 has a wider top portion adjacent to uppermost surface 108B and a narrower portion toward electrode structure 112 due to a deposition (for example PVD) and etch process (as indicated by dashed line 1604).

In some embodiments, instead of forming a sloped surface, portions of the electrode structure 112 are etched and removed during the process to etch the memory device as illustrated in FIG. 17A. In some such embodiments, sidewall 112A of electrode structure 112 may be substantially aligned with sidewall 108A of memory device 108. The etch process may form rounded sidewall portions in etch stop layer 113. For example, sidewall 113J may be curved as indicated by dashed lines 1701 due to etch erosion.

FIG. 17B is a cross-sectional illustration of the structure in FIG. 17A following the formation of an encapsulation layer 1702. In an embodiment, the encapsulation layer 1702 includes a material that is the same or substantially the same as the material of the encapsulation layer 1000 and deposited by a similar process. In the illustrative embodiment, the encapsulation layer 1702 is formed on memory device 108, sidewall 112A, etch stop layer 113 and on uppermost surface 136A between etch stop layer 113 and sidewall 112A. In some embodiments, the recess may leave some electrode structure 112 material on uppermost surface 136A. In the illustrative embodiment, portions of the electrode structure 112 not covered by memory device 108 are removed. Sidewall 113J may be exposed, as shown. In other embodiments, a thin spacer including material of the electrode structure 112 may be adjacent to sidewall 113J.

Figure 17C:
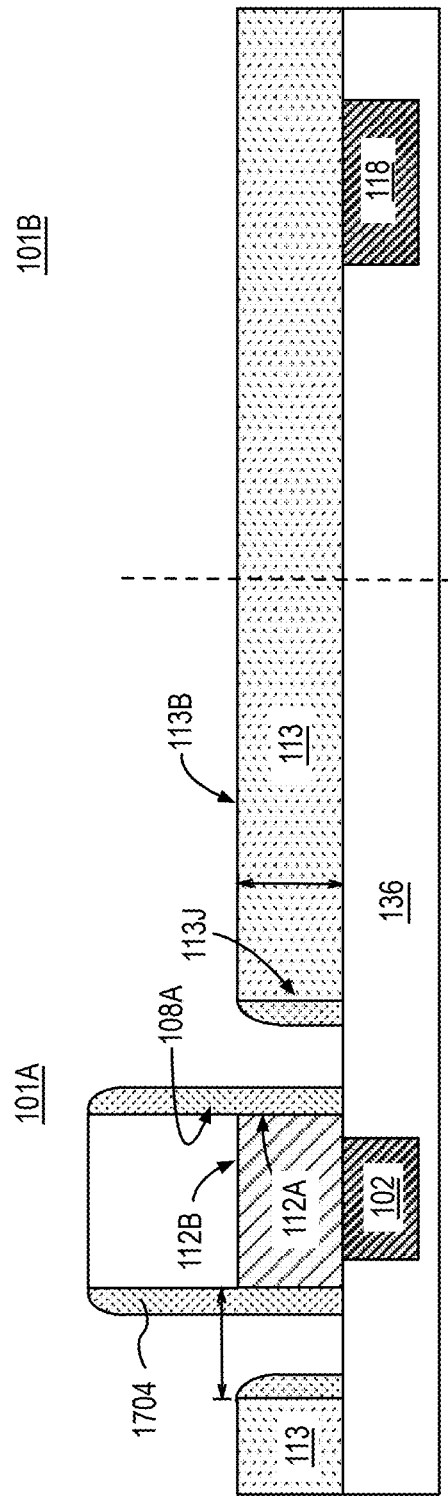
FIG. 17C is a cross-sectional illustration of the structure in FIG. 17B following the process to etch the encapsulation layer to form a spacer.

FIG. 17C is a cross-sectional illustration of the structure in FIG. 17B following the process to etch the encapsulation layer to form spacer 1704. In the illustrative embodiment, the spacer 1704 is formed by a plasma etch process. The etch process leaves various portions of spacer 1704 adjacent to sidewall 108A, sidewall 112A as well as on sidewall 113J of etch stop layer 113. In some embodiments, the spacer is removed from uppermost surface 136A as shown.

Figure 18A:
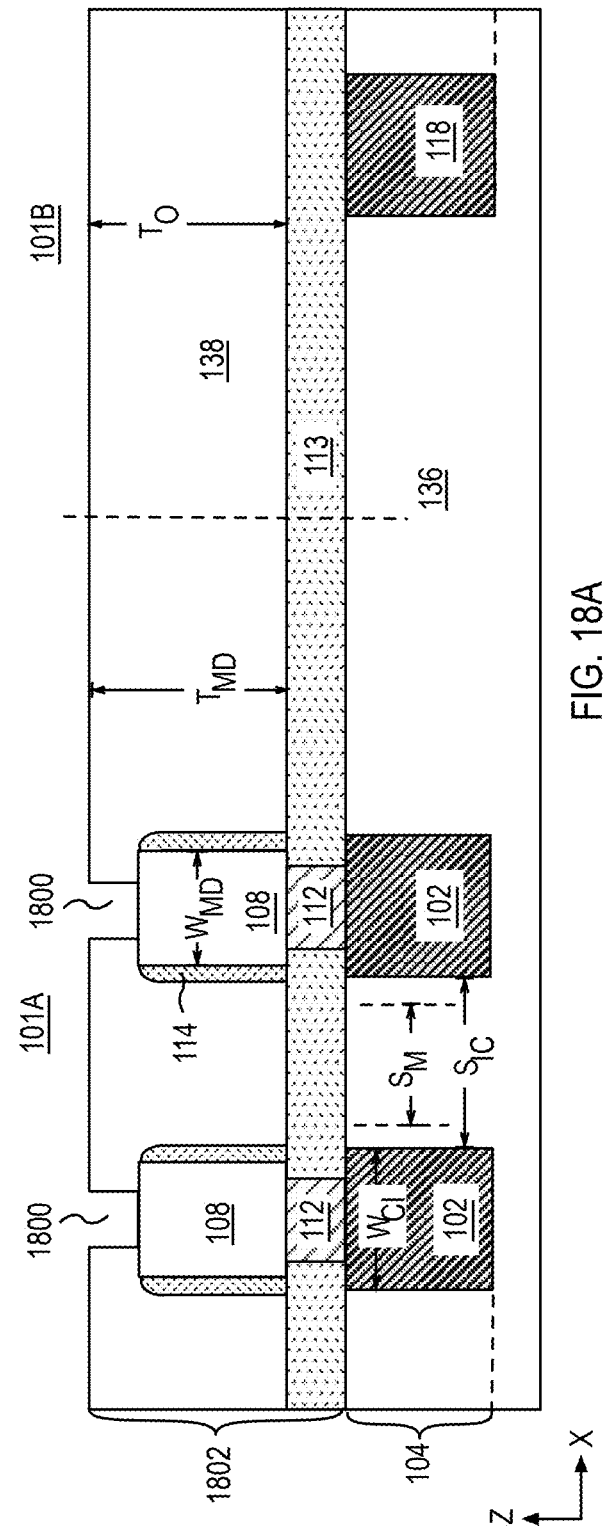
FIG. 18A is an embodiment of the cross-sectional illustration of the structure in FIG. 10C following the formation of via openings in a first level, in accordance with an embodiment of the present disclosure.

FIG. 18A is an embodiment of the cross-sectional illustration of the structure in FIG. 10C following the formation of via openings 1800. The electrode structure 112, memory device 108 is within a level 1802. Level 1802 is substantially similar to level 402 in FIG. 4A. The dielectric 136 has a thickness $T_O$, that is sufficient to form a via in the logic region 101B. The via openings 1800 may be formed by a method that is similar to the openings 1004. In the illustrative embodiment, the via openings 1800 are substantially vertical.

FIG. 18B is a cross-sectional illustration of the structure in FIG. 18A following the process to form via electrodes 1804. In an embodiment, the method to form via electrodes includes a method that is the same or substantially the same as the method described to form via electrodes 116. In the illustrative embodiment, a liner layer 1804A is deposited on the memory devices 108 and a fill metal 1804B is then deposited on the liner layer 1804A. In an embodiment, liner layer 1804A includes a material, such as but not limited to, ruthenium, cobalt or tantalum and the fill metal 1804B includes copper, molybdenum, or tungsten. The liner layer 1804A may be formed by an ALD process. The fill metal 1804B may be formed by an ALD, PVD or an electroplating method. After formation of via electrodes 1804, an opening 1806 is formed in the dielectric 138.

FIG. 18C is a cross-sectional illustration of the structure in FIG. 18B following the process to form via 1808. The method includes depositing a liner layer 1808A in the opening 1806, on the conductive interconnect 118, on sidewalls of dielectric 138 and of sidewalls of etch stop layer 113, and a fill metal 1808B on the liner layer 1808A. A planarization is performed after the fill process. In some embodiments, liner layer 1808A includes a material that is the same or substantially the same as the material of the liner layer 1804A. In some embodiments, liner layer 1808A includes a material that is the same or substantially the same as the material of the fill metal 1808B. Liner layer 1808A and fill metal 1808B may be formed by a substantially identical process utilized to form liner layer 1804A and fill metal 1808B.

Figure 18D:
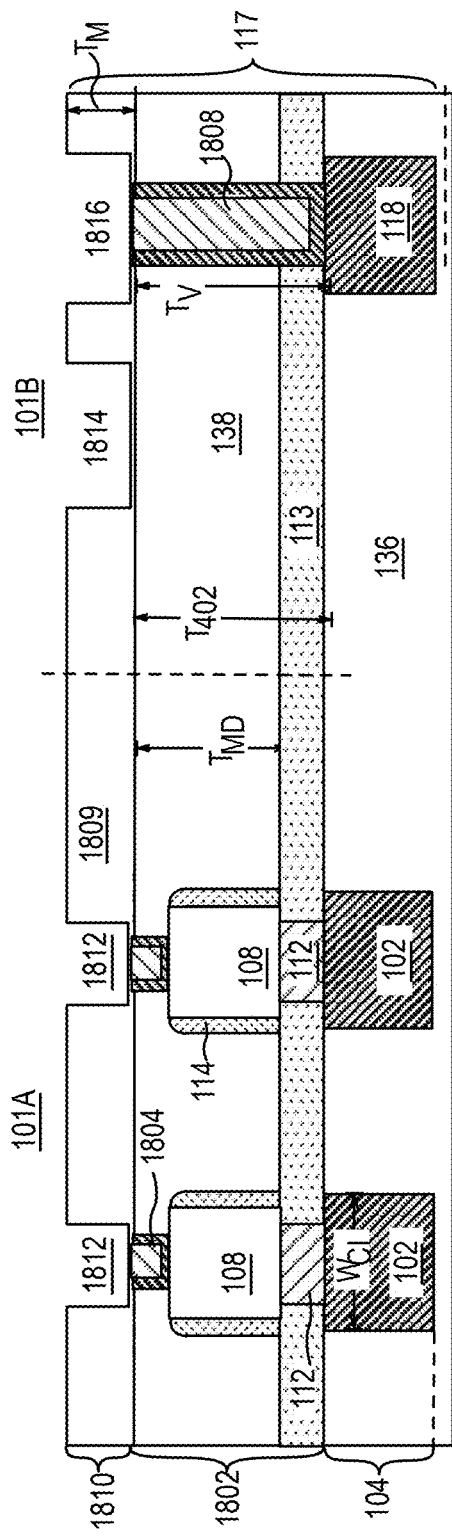
FIG. 18D is a cross-sectional illustration of the structure in FIG. 18C following the process to deposit a dielectric to form a second level above the first level.

FIG. 18D is a cross-sectional illustration of the structure in FIG. 18C following the process to deposit a dielectric 1809 to form a level 1810. The level 1810 is the same as level 404 in FIG. 4A. In an embodiment, the dielectric 1809 includes a material that is the same or substantially the same as the material of the dielectric 138 and is deposited to a thickness desirable to form via electrodes and metal lines. In an embodiment, a plurality of openings 1812, 1814 and 1816 are formed simultaneously in the dielectric 1809. In an embodiment, the openings 1812 expose the via electrodes 1804.

Figure 18E:
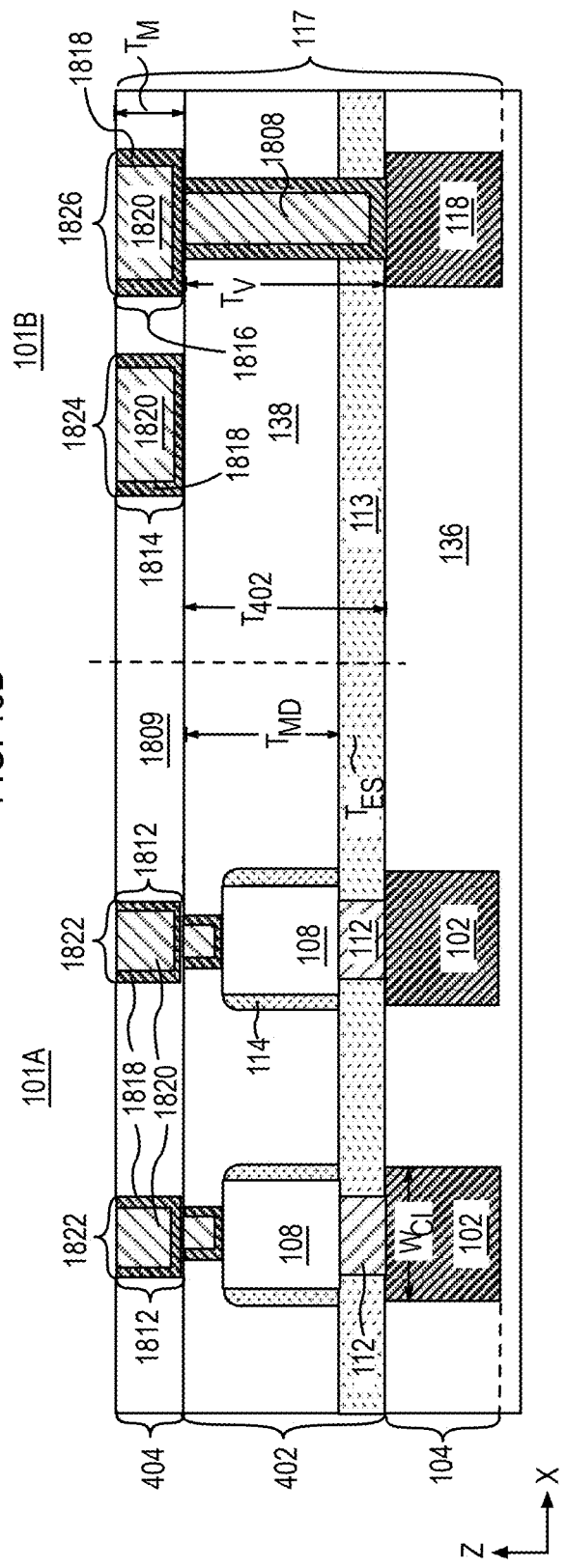
FIG. 18E is a cross-sectional illustration of the structure in FIG. 18D following the process to form via electrodes in the memory region and metal lines in the logic region within the second level.

FIG. 18E is a cross-sectional illustration of the structure in FIG. 18D following the process to form via electrodes in the memory region 101A and metal lines in the logic region 101B. In the illustrative embodiment, a liner layer 1818 is deposited into the openings 1812, 1814 and 1816. A fill metal 1820 is then deposited on the liner layer 1818 into each of the openings 1812, 1814 and 1816. A planarization process is performed to remove any liner material deposited on the dielectric 1809 and any fill metal not within the openings 1812, 1814 and 1816. In an embodiment, a CMP process forms a respective via electrode 1822 on each via electrode 1804, a metal line 1824 and a metal line 1826 on the via 1808. The metal lines 1826 1824 and 1826 are fabricated independently of a thickness requirement for the memory device and offers process flexibility.

Figure 19:
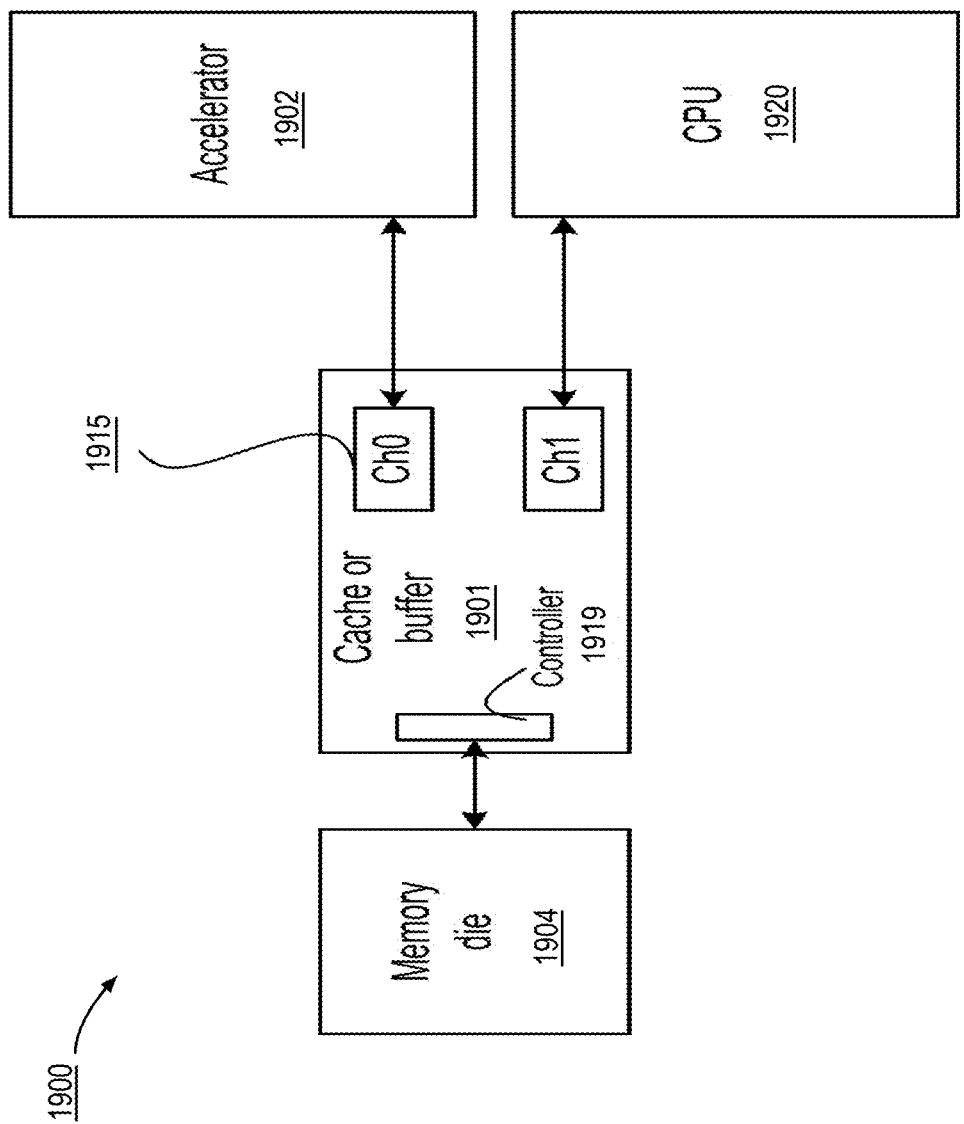
FIG. 19 illustrates a computing architecture with a coherent cache or memory-side buffer chiplet that includes a memory controller, wherein the coherent cache or memory-side buffer chiplet is coupled to an accelerator, a processor, and a memory, in accordance with some embodiments.

FIG. 19 illustrates computing architecture 1900 with a coherent cache or memory-side buffer chiplet that includes a memory controller, wherein the coherent cache or memory-side buffer chiplet is coupled to an accelerator, a processor, and a memory, in accordance with some embodiments. Computing architecture 1900 comprises coherent cache or memory-side buffer chiplet 1901, accelerator 1902 (e.g., inference chip), processor (e.g., central processing unit 1920), and memory die 1904. In some embodiments, coherent cache, or memory-side buffer chiplet 1901 comprises at least two channels 1915 which are configured to connect with accelerator 1902 and processor 1920. In some embodiments, coherent cache, or memory-side buffer chiplet 1901 comprises I/O and controller 1919 to manage data traffic with memory die 2004. By moving controller 1919 from processor 1920 to coherent cache or memory-side buffer chiplet 1901, cost in terms of power and die area for processor 1920 is reduced. In some embodiments, coherent cache, or memory-side buffer chiplet 1901 is a cache memory that comprises ferroelectric memory cells. For example, coherent cache, or memory-side buffer chiplet 1901 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 20:
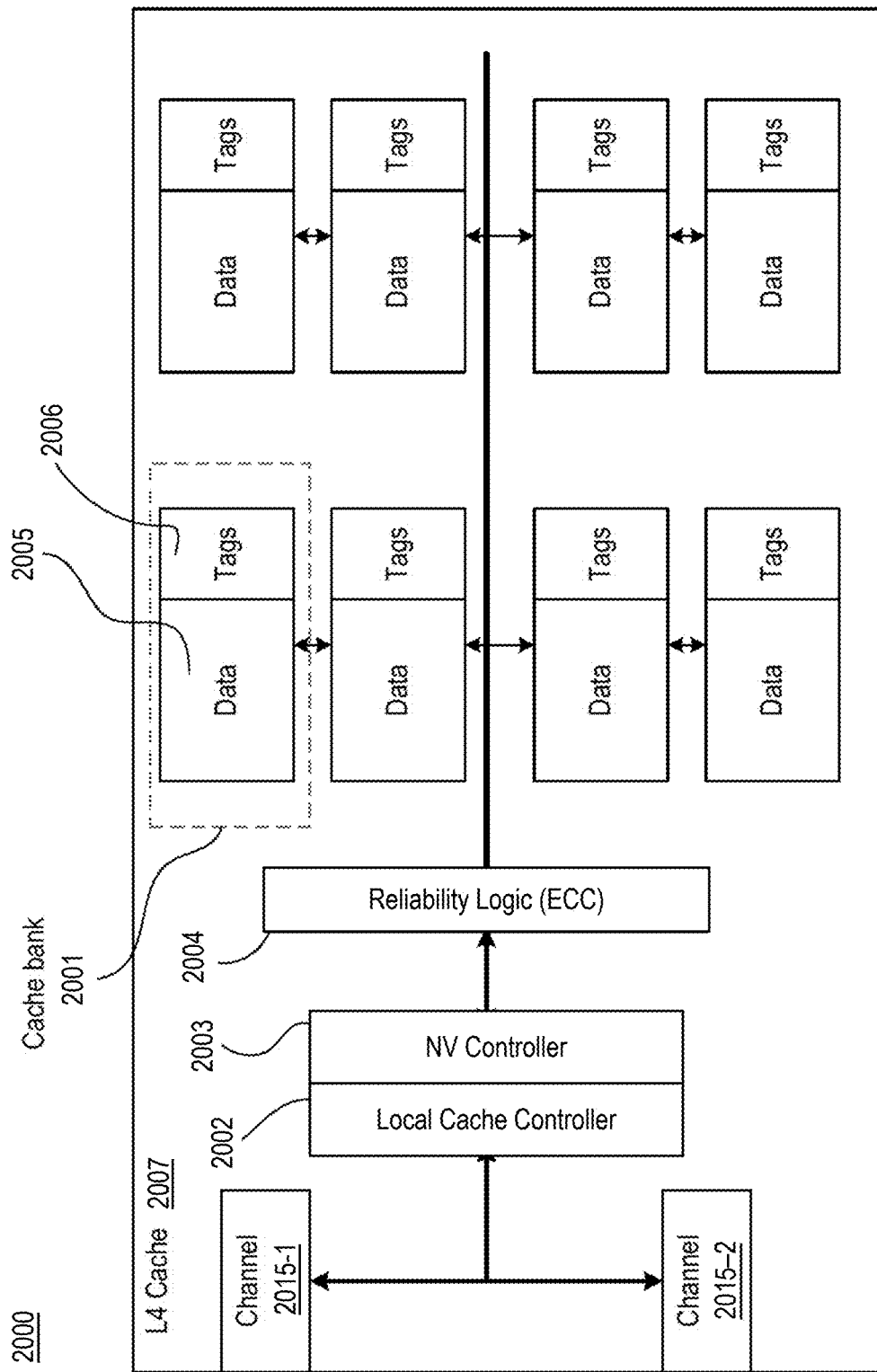
FIG. 20 illustrates an architecture of the coherent cache or memory-side buffer chiplet with multiple controllers and multiple cache banks, in accordance with some embodiments.

FIG. 20 illustrates architecture 2000 of the coherent cache or memory-side buffer chiplet (e.g., 2007) with multiple controllers and multiple cache banks, in accordance with some embodiments. In some embodiments, architecture 2000 comprises channels (e.g., ch0 2015-1 and ch1 2015-2), cache banks 2001, local cache controller 2002, non-volatile (NV) controller 2003, and reliability logic 2004. Coherent cache or memory-side buffer chiplet 2007 may function as a cache or memory buffer. In some embodiments, cache lookups can map a large physical memory into a small physical cache using indirection via tags. Here, indirection refers to the use of tags to specify which address maps to which physical location. If multiple addresses can map to a single physical location, a tag is used to figure out which address is currently mapped.

In some embodiments, each cache bank 2001 includes data bank 2005 (e.g., comprising memory cells) and associated tags 2006. In some embodiments, data bank 2005 comprises ferroelectric memory cells. In some embodiments, data bank 2005 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In some embodiments, when data bank 2005 includes ferroelectric memory, it uses NV controller 2003 and a stronger reliability logic (e.g., error correction code) for security compared to non-ferroelectric memory for data bank 2005.

When data bank 2005 is used to implement a cache, tags may be used to identify which addresses map to which physical locations in the bank. The cache may be set associative in which a particular address can map to several physical locations. The specific physical location a newly allocated address is mapped to may be determined by a replacement algorithm such as LRU (least recently used) or pseudo-LRU, or even random. On the other hand, the cache might be direct mapped, with each address mapping to merely a single physical cache line. In both set associative and direct mapped caches, several addresses map to a single physical cache line. To identify the address currently occupying the physical cache line, a tag 2006 may be coupled with each physical line. Tag 2006 may comprise some address bits, sufficient to uniquely identify which address currently occupies the physical line coupled with the tag.

In some embodiments, cache controller 2002 could be used to control state transitions required for cache look ups such as comparing requested addresses with tags stored in the tags 2006 and identifying a candidate for replacement (replacement algorithm) when a cache miss occurs. In addition, the cache controller could be tasked with initializing the cache when the cache powers on. When FE memory of data bank 2005, which retains state across power cycles, is used, cache controller 2002 could write 0s to all memory locations to ensure that data associated with previously executed programs is erased, thus preventing any data leakage to subsequently executed programs. The non-volatile memory may also include an NV bit, which could indicate that cache data is meant to be non-volatile and remain across power cycles. Cache controller 2002 would skip locations marked thus when initializing memory.

In some embodiments, reliability logic 2004 performs error correction to the data. Any suitable error correction scheme (e.g., with error correction code (ECC)) may be used by reliability logic 2004. In some embodiments, NV controller 2003 is provided to explicitly clear the cache when using a non-volatile memory, such as FM memory for data bank 2005. NV controller 2003 may include an NV bit which indicates cache lines that should not be cleared but are expected to retain their contents across power cycles. The functions of NV controller 2003 can be combined in cache controller 2002, or vice versa.

Figure 21:
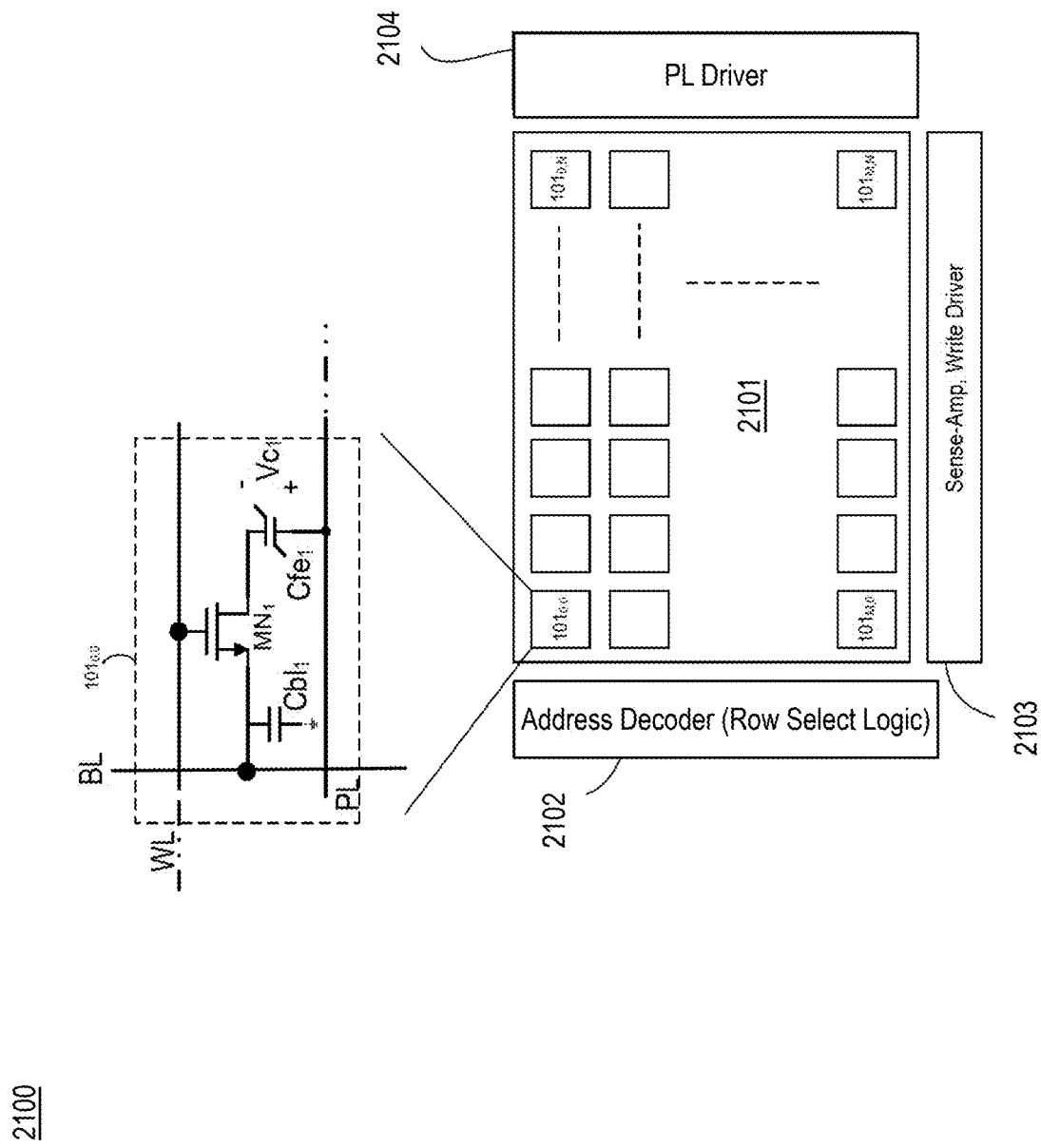
FIG. 21 illustrates an apparatus comprising memory and corresponding logic, wherein the memory comprises ferroelectric (FE) memory bit-cells, in accordance with some embodiments.

FIG. 21 illustrates apparatus 2100 comprising memory and corresponding logic, wherein the memory comprises ferroelectric (FE) memory bit-cells, in accordance with some embodiments. Apparatus 2100 comprises M×N memory array 2101 of bit-cells, logic circuitry 2102 for address decoding, sense amplifier and write drivers 2103, and plate-line (PL) driver 2104. Logic circuitry 2102 comprises address decoders for selecting a row of bit-cells and/or a particular bit-cell from M×N memory array 2101, where M and N are integers of same or different values. Logic circuitry 2102 comprises sense-amplifiers for reading the values from the selected bit-cell, while write drivers are used to write a particular value to a selected bit-cell. Here, a schematic of FE bit-cell $2101_{0,0}$ is illustrated. The same embodiments apply to other bit-cells of the M×N array. In this example, a one-transistor one-capacitor (1T1C) bit cell is shown, but the embodiments are applicable to 1TnC bit-cell and multi-element FE gain bit-cell as described herein.

In some embodiments, bit-cell $2101_{0,0}$ comprises a word-line (WL), a plate-line (PL), a bit-line (BL), a complementary bit-line (BLB), and two half bit-cells $2101_{0,0\_A}$ and $2101_{0,0\_B}$. In some embodiments, bit-cell $2101_{0,0}$ comprises an n-type transistor $MN_1$, and FE capacitive structure $Cfe_1$. The gates of transistor $MN_1$ are coupled to a common WL. In various embodiments, one terminal of the FE capacitive structure $Cfe_1$ is coupled to a PL. The second terminal of the FE capacitive structure is coupled to source or drain terminal of the transistor $MN_1$. In various embodiments, BL is coupled to the source or drain terminal of first transistor $MN_1$. In some embodiments, a BL capacitor $CBl_1$ is coupled to the source or drain terminal of first transistor $MN_1$ and to a reference node (e.g., ground such that the FE capacitor is not coupled to the same source or drain terminal. In some embodiments, the PL is parallel to the BL and orthogonal to the WL. In some embodiments, the PL is parallel to the WL and orthogonal to the BL.

In some embodiments, the FE capacitor is a planar capacitor. In some embodiments, the FE capacitor is a pillar or non-planar capacitor. In some embodiments, when the bit-cell is a 1TnC bit-cell, the FE capacitors are configured in a tower structure allowing the x-y foot-print to remain the same as for a 1T1C bit-cell but with taller bit-cell in the z-direction. In some embodiments, when the bit-cell is a multi-element FE gain bit-cell, the bit-cell allows for decoupling of the storage node from BL, allows for reducing the thickness scaling requirement for pillar capacitors, and allows for reducing polarization density requirements. Further, by stacking the 'n' capacitors in the z-direction (forming a tower), the area increases in the x-y direction due to the two transistors. The increase in area (due to the two transistors per bit-cell) allows for expanding the sizes (or radius) of the capacitors in the x-y direction.

Figure 22:
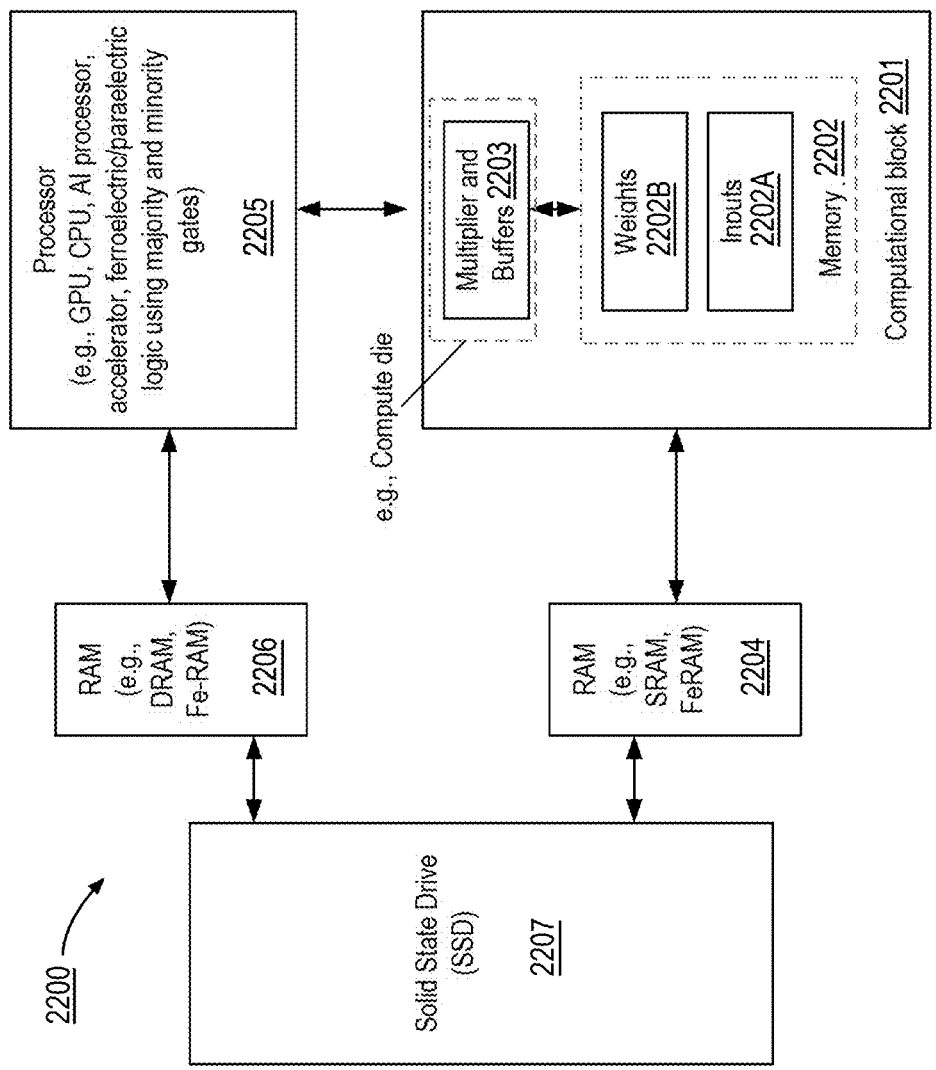
FIG. 22 illustrates a high-level architecture of an artificial intelligence (AI) machine comprising a compute die positioned on top of a memory die, in accordance with some embodiments.

FIG. 22 illustrates a high-level architecture of an artificial intelligence (AI) machine 2200 comprising a compute die positioned on top of a memory die, in accordance with some embodiments. AI machine 2200 comprises computational block 2201 or processor having random-access memory (RAM) 2202 and computational logic 2203; first random-access memory 2204 (e.g., static RAM (SRAM), ferroelectric or paraelectric RAM (FeRAM), ferroelectric or paraelectric static random-access memory (FeSRAM)), main processor 2205, second random-access memory 2206 (dynamic RAM (DRAM), FeRAM), and solid-state memory or drive (SSD) 2207. In some embodiments, some or all components of AI machine 2200 are packaged in a single package forming a system-on-chip (SoC). The SoC can be configured as a logic-on-logic configuration, which can be in a 3D configuration or a 2.5D configuration.

In some embodiments, computational block 2201 is packaged in a single package and then coupled to main processor 2205 and memories 2204, 2206, and 2207 on a printed circuit board (PCB). In some embodiments, computational block 2201 is configured as a logic-on-logic configuration, which can be in a 3D configuration or a 2.5D configuration. In some embodiments, computational block 2201 comprises a special purpose compute die 2203 or microprocessor. For example, compute die 2203 is a compute chiplet that performs a function of an accelerator or inference. In some embodiments, RAM 2202 is DRAM which forms a special memory/cache for the special purpose compute die 2203. The DRAM can be embedded DRAM (eDRAM) such as 1T-1C (one transistor and one capacitor) based memories. In some embodiments, RAM 2202 is ferroelectric or paraelectric RAM (Fe-RAM).

In some embodiments, compute die 2203 is specialized for applications such as Artificial Intelligence, graph processing, and algorithms for data processing. In some embodiments, compute die 2203 further has logic computational blocks, for example, for multipliers and buffers, a special data memory block (e.g., buffers) comprising DRAM, FeRAM, or a combination of them. In some embodiments, RAM 2202 has weights and inputs stored in order to improve the computational efficiency. The interconnects between main processor 2205 (also referred to as special purpose processor), first RAM 2204 and compute die 2203 are optimized for high bandwidth and low latency. The architecture of FIG. 22 allows efficient packaging to lower the energy, power, or cost and provides for ultra-high bandwidth between RAM 2202 and compute chiplet 2203 of computational block 2201.

In some embodiments, RAM 2202 is partitioned to store input data (or data to be processed) 2202A and weights 2202B. In some embodiments, input data 2202A is stored in a separate memory (e.g., a separate memory die) and weights 2202B are stored in a separate memory (e.g., separate memory die).

In some embodiments, computational logic, or compute chiplet 2203 comprises matrix multiplier, adder, concatenation logic, buffers, and combinational logic. In various embodiments, compute chiplet 2203 performs multiplication operation on input data 2202A and weight 2202B. In some embodiments, weights 2202B are fixed weights. For example, main processor 2205 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 2202. In various embodiments, the input data 2202A, that is to be analyzed using a trained model, is processed by computational block 2201 with computed weights 2202B to generate an output (e.g., a classification result).

In some embodiments, First RAM 2204 is ferroelectric or paraelectric based SRAM. For example, a six transistor (6T) SRAM bit-cells having ferroelectric or paraelectric transistors are used to implement a non-volatile FeSRAM. In some embodiments, SSD 2207 comprises NAND flash cells. In some embodiments, SSD 2207 comprises NOR flash cells. In some embodiments, SSD 2207 comprises multi-threshold NAND flash cells.

In various embodiments, the non-volatility of FeRAM is used to introduce new features such as security, functional safety, and faster reboot time of AI machine 2200. The non-volatile FeRAM is a low power RAM that provides fast access to data and weights. First RAM 2204 can also serve as a fast storage for inference die (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 2200 mV). Threshold in the FE material has a highly non-linear transfer function in the polarization versus voltage response. The threshold is related to: a) non-linearity of switching transfer function; and b) to the squareness of the FE switching. The non-linearity of switching transfer function is the width of the derivative of the polarization versus voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material comprises a perovskite of the type ABO$_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or lanthanides). In various embodiments, when the FE material is a perovskite, the conductive oxides are of the type AA'BB'O$_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc., may be used for FE material. Perovskites can be suitably doped to achieve a spontaneous distortion in a range of 0.3% to 2%. For chemically substituted BiFeO3, BrCrO3, BuCoO3 class of materials, La or rare earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between conductive oxides. In various embodiments, when the FE material is a perovskite, the conductive oxides are of the type $AA'BB'O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: $IrO_2$, $RuO_2$, $PdO_2$, $OsO_2$, or $ReO_3$. In some embodiments, the perovskite is doped with La or lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O.

In some embodiments, the FE material comprises one or more of: hafnium (Hf), zirconium (Zr), aluminum (Al), silicon (Si), their oxides or their alloyed oxides. In some embodiments, the FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes one or more of: bismuth ferrite (BFO), or BFO with a first doping material.

In some embodiments, the FE material includes bismuth ferrite (BFO) or BFO with a first doping material where in the first doping material is one of lanthanum, or any element from the lanthanide series of the periodic table. In some embodiments, the FE material includes a relaxor ferroelectric which includes one of barium titanium-bismuth zinc niobium tantalum (BT-BZNT) or barium titanium-barium strontium titanium (BT-BST).

In some embodiments, the FE material includes hafnium oxides of the form, Hf(1-x) ExOy where E can be Al, Ca, Ce, Dy, Er, Gd, Ge, La, Sc, Si, Sr, Sn, or Y. In some embodiments, the FE material includes niobate type compounds LiNbO3, LiTaO3, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, the FE material comprises organic material. For example, polyvinylidene fluoride or polyvinylidene difluoride (PVDF).

In some embodiments, the FE material comprises hexagonal ferroelectrics of the type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, $Fe_2O_3$) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials SnTiO3 (STO), respectively, and LaAlO3 (LAO) and STO, respectively. For example, a super lattice of [PTO/STO]n or [LAO/STO]n, where 'n' is between 1 and 2200. While various embodiments here are described with reference to ferroelectric material for storing the charge state, the embodiments are also applicable for paraelectric material. In some embodiments, paraelectric material includes one of: SrTiO3, Ba(x)Sr(y)TiO3 (where x is −0.5, and y is 0.95), HfZrO2, and Hf—Si—O.

The method of forming the structures described herein is applicable to various logic embodiments. For example, the FeRAM devices or capacitive structures formed herein can be used to form other ferroelectric/paraelectric circuits. These circuits can be implemented as a majority gate, a minority gate and/or a threshold gate.

Figure 23:
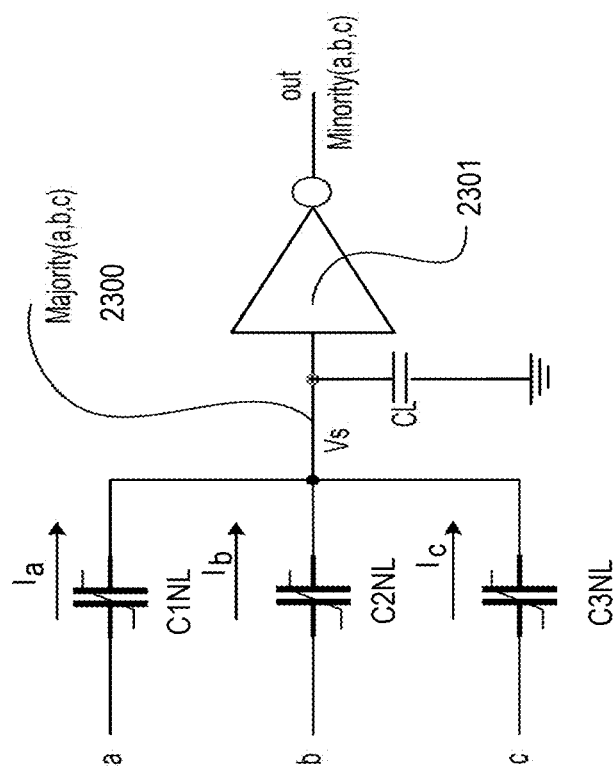
FIG. 23 illustrates a 3-input majority gate using non-linear input capacitors, in accordance with some embodiments.

FIG. 23 illustrates 3-input majority gate 2300 using non-linear input capacitors, in accordance with some embodiments. In some embodiments, 3-input majority gate 2300 comprises non-linear input capacitors C1n1, C2n1, and C3n1 that receives digital signals a, b, and c, respectively. Here, signal names and node names are interchangeably used. For example, 'a' refers to node 'a' or signal 'a' depending on the context of the sentence. One end or terminal of capacitor C1n1 is coupled to node a while the other end of capacitor C1n1 is coupled to summing node $V_S$. The same is true for other non-linear capacitors C2n1 and C3n1 as shown. In some embodiments, 3-input majority gate 2300 comprises a driver circuitry 2301. In this example, driver circuitry 2301 is an inverter. In other embodiments, other types of driver circuitries can be used such as an NAND gate, an NOR gate, a multiplexer, a buffer, and other logic gates. The majority function is performed at summing node Vs as Majority (a,b,c). In this example, since driver circuitry 2301 is an inverter, minority function is performed at output "out" as Minority (a,b,c).

In some embodiments, in addition to the gate capacitance of driver circuitry 2301, an additional linear capacitor CL is coupled to summing node Vs and ground as shown. In some embodiments, this linear capacitor CL is a non-ferroelectric capacitor. In some embodiments, the non-ferroelectric capacitor includes one of: a dielectric capacitor, a paraelectric capacitor, or a non-linear dielectric capacitor. A dielectric capacitor comprises first and second metal plates with a dielectric between them. Examples of such dielectrics are: HfOX, ABO3 perovskites, nitrides, oxy-fluorides, oxides, etc. A paraelectric capacitor comprises first and second metal plates with a paraelectric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitors. The capacitor CL can be implemented as an MIM (metal-insulator-metal) capacitor technology, a transistor gate capacitor, a hybrid of metal capacitors or a transistor capacitor.

In some embodiments, the non-linear input capacitors C1$n$1, C2$n$1, and C3$n$1 comprise non-linear polar material. In some embodiments, the non-linear polar material includes one of: a ferroelectric (FE) material, a paraelectric material, a relaxor ferroelectric, or a non-linear dielectric. In various embodiments, a paraelectric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as paraelectric materials, relaxors, and dipolar glasses.

In some embodiments, f-orbital materials (e.g., lanthanides) are doped to the ferroelectric material to make paraelectric material. Examples of room temperature paraelectric material include: SrTiO3, Ba(x)Sr(y)TiO3 (where x is −0.5, and y is 0.95), HfZrO2, Hf—Si—O.

In various embodiments, the FE material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by La or lanthanides). Perovskites can be suitably doped to achieve a spontaneous distortion in a range of 0.3% to 2%. For example, for chemically substituted lead titanate such as Zr in Ti site; La or Nb in Ti site, the concentration of these substitutes is such that it achieves the spontaneous distortion in the range of 0.3% to 2%. For chemically substituted BiFeO3, BiCrO3, BiCoO3 class of materials, La or rare earth substitution into the Bi site can tune the spontaneous distortion. In some embodiments, perovskite includes one of: BaTiO3, KNbO3, or NaTaO3.

Threshold in the FE material has a highly non-linear transfer function in the polarization versus voltage response. The threshold is related to: a) non-linearity of switching transfer function; and b) the squareness of the FE switching. The non-linearity of switching transfer function is the width of the derivative of the polarization versus voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O2O3, LaNiO3, and ReO3.

In some embodiments, the FE material comprises a stack of layers including low voltage FE material between conductive oxides. In various embodiments, when FE material is a perovskite, the conductive oxides are of the type AA'BB'$O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials. While various embodiments here are described with reference to ferroelectric material for storing the charge state, the embodiments are also applicable for paraelectric material. For example, the capacitors of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, FE material includes one of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes bismuth ferrite (BFO) or BFO with a first doping material.

In some embodiments, the FE material includes bismuth ferrite (BFO) or BFO with a first doping material wherein the first doping material is one of lanthanum, or any element from the lanthanide series of the periodic table. In some embodiments, the FE material includes a relaxor ferroelectric which includes one of: barium titanium-bismuth zinc niobium tantalum (BT-BZNT), or barium titanium-barium strontium titanium (BT-BST).

In some embodiments, the FE material includes hafnium oxides of the form, Hf(1-x) ExOy where E can be Al, Ca, Ce, Dy, Er, Gd, Ge, La, Sc, Si, Sr, Sn, or Y. In some embodiments, FE material includes niobate type compounds LiNbO3, LiTaO3, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, polyvinylidene fluoride or polyvinylidene difluoride (PVDF). The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include indium tin oxide (ITO) such as Sn-doped In2O3.

The charge developed on node Vs produces a voltage and current that is the output of the majority gate 2300. Any suitable driver circuitry 2301 can drive this output. For example, a non-FE logic, an FE logic, a CMOS logic, a BJT logic, etc., can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

The majority function is performed at the summing node Vs, and the resulting voltage is projected on to capacitance of driver circuitry 2301. For example, the majority function of the currents ($I_a$, $I_b$, and $I_c$) on node Vs results in a resultant current that charges capacitor. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

While FIG. 23 illustrates a 3-input majority gate, the same concept can be extended to more than 3 inputs to make an N-input majority gate, where N is greater than 2. In various embodiments, 'N' is an odd number. For example, a 5-input majority gate is like an input majority gate 2300 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configure the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 2301 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion:

$f(x_1, x_2, \ldots x_n) = V_{C_1, C_2, \ldots C_n} f(x_1, x_2, \ldots x_n) \wedge x_1^{C_1} \wedge x_2^{C_2} \wedge x_3^{C_3} \ldots \wedge x_n^{C_n}$ where $C_i$ is either 0 or 1. When $C_i$ is 1, $x_i^{C_i} = x_i$ (the input is used in its original form). When $C_i$ is 0, $x_i^{C_i} = \overline{x_i}$ (the input is used in its inverted form). The first level of logic is represented by at most $2^n$ AND gates ($\Delta$), one for each of the $2^n$ possible combinations of 0 and 1 for $C_1, C_2, \ldots C_n$. The second level of logic is represented by a single OR gate (V). Each operand of the OR gate is a representation of a row in the truth table for $f(x_1, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 24:
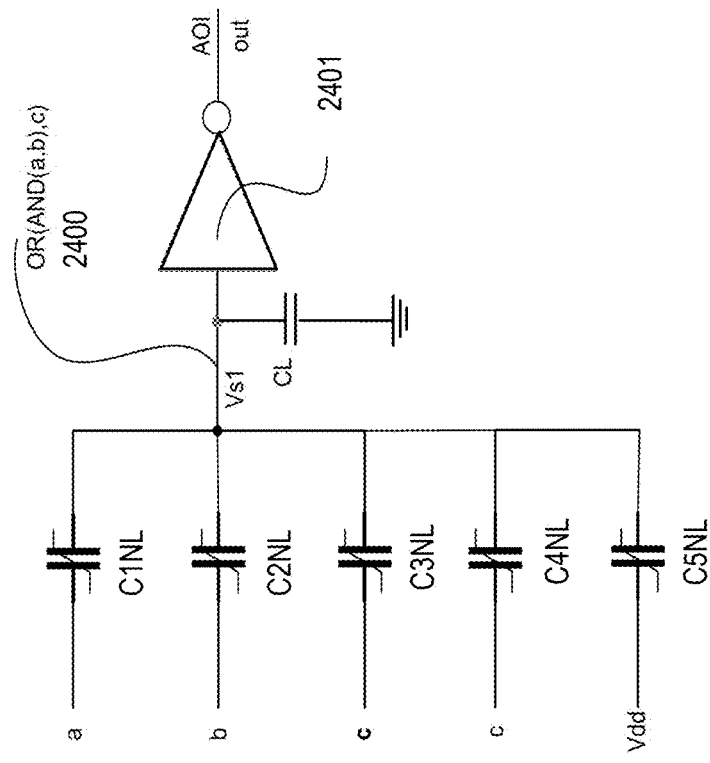
FIG. 24 illustrates a complex logic gate implemented using a 5-input majority gate, in accordance with some embodiments.

FIG. 24 illustrates complex logic gate 2400 implemented using a 5-input majority gate, in accordance with some embodiments. In some embodiments, an AOI (and-or-invert) logic comprises a 5-input majority gate. The 5-input majority gate includes non-linear capacitors C1$n$1, C2$n$1, C3$n$1, C4$n$1, and C5$n$1 and driving circuitry 2401 coupled as shown. In various embodiments, two of the non-linear capacitors receive the same input. Here, capacitors C3$n$1 and C4$n$1 receive input 'c'. In various embodiments, C5$n$1 is coupled to Vdd to produce an OR function at node Vs, where the OR function is OR (AND (a,b),c). In some embodiments, other logic gates can be realized by changing Vdd to ground for capacitor C5$n$1, and/or changing other inputs.

Following examples are provided that illustrate the various embodiments. The examples can be combined with other examples. As such, various embodiments can be combined with other embodiments without changing the scope of the invention.

Example 1: A device comprising: a first region comprising: a first conductive interconnect within a first level, the first conductive interconnect comprising a first lateral thickness; a second level above the first level, the second level comprising: a memory device above the first conductive interconnect, the memory device comprising ferroelectric material or paraelectric material, wherein the memory device comprises a second lateral thickness; an electrode structure coupled between the memory device and the first conductive interconnect, the electrode structure comprising a third lateral thickness, wherein the first lateral thickness and the third lateral thickness are respectively less than the second lateral thickness; an etch stop layer comprising a dielectric material, the etch stop layer laterally surrounding the electrode structure; a spacer on a sidewall of the memory device and on a portion of the electrode structure; a via electrode on the memory device; and a second region adjacent to the first region, the second region comprising an interconnect structure, the interconnect structure comprising: a second conductive interconnect within the first level; a metal line within the second level; and a via structure within the second level, the via structure coupling the metal line with the second conductive interconnect, wherein at least a first portion of the via structure is adjacent to the etch stop layer, and wherein the etch stop layer is on at least a portion of the second conductive interconnect.

Example 2: The device of example 1, wherein the memory device comprises: a first conductive layer comprising a non-Pb based perovskite metal oxide, the first conductive layer comprising a first sidewall having a first slope; a ferroelectric dielectric layer comprising a non-Pb based perovskite material on the first conductive layer, the ferroelectric dielectric layer comprising a second sidewall having a second slope; and a second conductive layer comprising non-Pb based perovskite metal oxide on the ferroelectric dielectric layer, the second conductive layer comprising a third sidewall having a third slope, wherein the first slope, the second slope and the third slope are less than ninety degrees relative to a lowermost surface of the first conductive layer.

Example 3: The device of example 2, wherein the first slope is substantially equal to the third slope, wherein the second slope is less than the first slope or the third slope.

Example 4: The device of example 2, wherein the first slope, the second slope and the third slope are substantially same.

Example 5: The device of example 1, wherein the first conductive interconnect comprises one or more of: copper, cobalt, tungsten, ruthenium, molybdenum, tantalum, or titanium.

Example 6: The device of example 1, wherein the electrode structure comprises a first vertical thickness under the memory device and a second vertical thickness under the spacer.

Example 7: The device of example 6, wherein the memory device comprises a fourth sidewall and the electrode structure comprises a fifth sidewall, wherein the fourth sidewall and the fifth sidewall are substantially aligned to each other.

Example 8: The device of example 7, wherein a lowermost conductive layer of the memory device comprises the fourth sidewall and wherein a slope of the fifth sidewall is substantially vertical.

Example 9: The device of example 7, wherein the fourth sidewall and the fifth sidewall are substantially sloped and colinear.

Example 10: The device of example 1, wherein the electrode structure comprises an uppermost surface under the memory device, and an adjoining surface not under the memory device, wherein the adjoining surface comprises a slope and the spacer laterally extends on a third portion of the adjoining surface.

Example 11: The device of example 10, wherein a magnitude of the slope decreases with distance away from the memory device.

Example 12: The device of example 2, wherein the spacer has a lateral thickness that varies with height, wherein the height is measured from a lowermost surface of the memory device.

Example 13: The device of example 1, where in the etch stop layer and the memory device have a combined vertical thickness that is between 10% and-80% of a vertical thickness of the second level.

Example 14: The device of example 1, wherein the electrode structure is a first electrode structure, wherein the spacer is a first spacer, wherein the via electrode is a first via electrode, wherein the conductive interconnect is a trench extending along a direction orthogonal to a measurement of the first lateral thickness, wherein the memory device is a first memory device, wherein the first memory device is on a fourth portion of the trench and wherein the device further comprises: a second memory device above a fifth portion of the trench, the fifth portion laterally distant from the fourth portion; a second electrode structure coupled between the second memory device and the trench; a second spacer on a sixth sidewall of the second memory device; and a second via electrode on the second memory device.

Example 15: A device comprising: a first region comprising: a first conductive interconnect within a first level, the first conductive interconnect comprising a first lateral thickness; a second level above the first level, the second level comprising: a memory device above the first conductive interconnect, the memory device comprising ferroelectric material or paraelectric material, wherein the memory device comprises a second lateral thickness; an electrode structure coupled between the memory device and the first conductive interconnect, the electrode structure comprising a third lateral thickness, wherein the first lateral thickness and the third lateral thickness are respectively greater than the second lateral thickness; an etch stop layer comprising a dielectric material, the etch stop layer laterally surrounding the electrode structure; a spacer on a sidewall of the memory device and on a first portion of the electrode structure; and a via electrode on the memory device; and a second region adjacent to the first region, the second region comprising an interconnect structure, the interconnect structure comprising: a second conductive interconnect within the first level; a metal line within the second level; and a via structure within the second level, the via structure coupling the metal line with the second conductive interconnect, wherein at least a first portion of the via structure is adjacent to the etch stop layer, and wherein the etch stop layer is on at least a portion of the second conductive interconnect.

Example 16: The device of example 15, wherein the etch stop layer has a first vertical thickness under the memory device, a second vertical thickness under the spacer.

Example 17: The device of example 16, wherein the etch stop layer further comprises a third vertical thickness away from the spacer.

Example 18: The device of example 15, wherein the memory device is a first memory device, wherein the electrode structure is a first electrode structure, wherein the spacer is a first spacer, wherein the via electrode is a first via electrode, and wherein the device further comprises: a third conductive interconnect laterally distant from the first conductive interconnect, wherein the third conductive interconnect is behind the first conductive interconnect; a second memory device above the second conductive interconnect; a second electrode structure coupled between the second memory device and the second conductive interconnect; a second spacer on a sixth sidewall of the second memory device; and a second via electrode on the second memory device.

Example 19: A system comprising: a processor; a communication interface communicatively coupled to the processor; and a memory coupled to the processor, wherein the memory comprises: bit-cells, wherein one of the bit-cells includes: a first region comprising: a first conductive interconnect within a first level, the first conductive interconnect comprising a first lateral thickness; a second level above the first level, the second level comprising: a memory device above the first conductive interconnect, the memory device comprising ferroelectric material or paraelectric material, wherein the memory device comprises a second lateral thickness; an electrode structure coupled between the memory device and the first conductive interconnect, the electrode structure comprising a third lateral thickness, wherein the first lateral thickness and the third lateral thickness are respectively less than the second lateral thickness; an etch stop layer comprising a dielectric material, the etch stop layer laterally surrounding the electrode structure; an spacer on a sidewall of the memory device and on a first portion of the electrode structure; and a via electrode on the memory device; and a second region adjacent to the first region, the second region comprising an interconnect structure, the interconnect structure comprising: a second conductive interconnect within the first level; a metal line within the second level; and a via structure within the second level, the via structure coupling the metal line with the second conductive interconnect, wherein at least a first portion of the via structure is adjacent to the etch stop layer, and wherein the etch stop layer is on at least a portion of the second conductive interconnect.

Example 20: The system of example 19, wherein the memory device comprises: a ferroelectric material which includes one of bismuth ferrite (BFO) or BFO with a first doping material wherein the first doping material is one of lanthanum or elements from lanthanide series of periodic table; lead zirconium titanate (PZT) or PZT with a second doping material, wherein the second doping material is one of La or Nb; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite material which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides as Hf(1-x)ExOy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; and niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 and 100.

Example 21: The device of example 16, wherein the memory device comprises a paraelectric material which includes: SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

Example 1a: A method of fabricating a device structure, the method comprising: forming a first conductive interconnect in a dielectric in a memory region and a second conductive interconnect in a logic region; depositing an etch stop layer on the dielectric and on the first conductive interconnect and on the second conductive interconnect; forming an electrode structure on the first conductive interconnect by etching an opening in the etch stop layer and depositing a first conductive material; forming a memory device by depositing a material layer stack comprising a ferroelectric material or a paraelectric material on the electrode structure and etching the material layer stack; forming a spacer on a sidewall of the memory device by depositing an encapsulation layer and etching the encapsulation layer; depositing a dielectric layer on the memory device; forming a via electrode on the memory device by forming a first opening in the dielectric layer and depositing a second conductive material in the first opening; and forming a via structure on the second conductive interconnect and a metal line on the via structure by patterning a second opening in the dielectric and in the etch stop layer.

Example 2a: The method of example 1a, wherein depositing the material layer stack comprises depositing at least two layers comprising the ferroelectric material.

Example 3a: The method of example 2a, wherein etching the material layer stack to form the memory device comprises utilizing a reactive ion etching process, wherein the reactive ion etching process forms the memory device having sidewalls that are tapered relative to a lowermost surface of the memory device.

Example 4a: The method of example 3a, wherein the reactive ion etching process etches layers within the material layer stack, wherein a respective layer in the layers each comprise a respective sidewall with a different slope.

Example 5a: The method of example 2a, wherein etching the material layer stack to form the memory device comprises utilizing a reactive ion etching process, where the reactive ion etching process is selective to the electrode structure and/or the etch stop layer.

Example 6a: The method of example 1a, wherein the electrode structure is wider than the memory device and etching the material layer stack further comprises recessing portions of the electrode structure not under the memory device, wherein the recessing forms a first surface of the electrode structure adjacent the memory device that is below an uppermost surface of the electrode structure.

Example 7a: The method of example 6a, wherein forming the spacer further comprises depositing the encapsulation layer on the first surface and below an interface between the memory device and the electrode structure.

Example 8a: The method of example 1a, wherein the electrode structure is narrower than the memory device and etching the material layer stack further comprises recessing portions of the etch stop layer not under the memory device, wherein the recessing forms a first surface of the etch stop layer adjacent the memory device that is below an uppermost surface of the etch stop layer.

Example 9a: The method of example 8a, wherein forming the spacer further comprises depositing the encapsulation layer on the first surface and below an interface between the memory device and the electrode structure, prior to etching the encapsulation layer.

Example 10a: The method of example 9a, wherein etching the encapsulation layer further comprises recessing a portion of the etch stop layer below the first surface.

Example 11a: The method of example 1a, wherein the electrode structure is wider than the first conductive interconnect, and wherein etching the opening in the etch stop layer comprises recessing a portion of the dielectric adjacent to the first conductive interconnect and depositing the first conductive material on a sidewall of the first conductive interconnect.

Example 12a: A method of fabricating a device structure, the method comprising: forming a first conductive interconnect in a dielectric in a memory region and a second conductive interconnect in a logic region; depositing an etch stop layer on the dielectric and on the first conductive interconnect and on the second conductive interconnect; forming an electrode structure on the first conductive interconnect by etching an opening in the etch stop layer and depositing a conductive material; forming a memory device by depositing a material layer stack on the electrode structure and patterning the material layer stack; forming a spacer on a sidewall of the memory device by depositing an encapsulation layer and etching the encapsulation layer; depositing a dielectric layer on the memory device; forming a first opening in the dielectric layer above the memory device and simultaneously forming a second opening in the dielectric layer above the second conductive interconnect; completely masking the first opening and partially masking the second opening to form a via opening within the second opening; etching the dielectric layer and the etch stop layer through the via opening and exposing the second conductive interconnect; and forming a via electrode in the first opening, a via structure in the via opening and a metal line in the second opening by depositing a conductive material in the first opening, in the via opening and in the second opening.

Example 13a: The method of example 12a, wherein etching the first opening further comprises over etching to expose an uppermost surface of the memory device, wherein the over etching recesses the second opening below a level of the uppermost surface of the memory device.

Example 14a: The method of example 13a, wherein the over etching recesses the second opening below the uppermost surface of the memory device by up to 10% of a total depth of the first opening.

Example 15a: The method of example 14a, wherein the via opening comprises a first lateral width that is between 25%-and 75% of a second lateral width of the second opening.

Example 16a: A method of fabricating a device structure, the method comprising: forming a first trench interconnect in a dielectric in a memory region and a second trench interconnect in a logic region; depositing an etch stop layer on the dielectric and on the first trench interconnect and on the second trench interconnect; forming an electrode structure on the first trench interconnect by etching an opening in the etch stop layer and depositing a conductive material; forming a memory device by depositing a material layer stack on the electrode structure and etching the material layer stack to form the memory device directly above the first trench interconnect; forming a spacer on a sidewall of the memory device by depositing an encapsulation layer and etching the encapsulation layer; blanket depositing a dielectric layer; forming a first opening in the dielectric layer above the memory device and simultaneously forming a second opening in the dielectric layer above the second trench interconnect; completely masking the first opening and partially masking the second opening to form a via opening within the second opening; etching the dielectric layer and the etch stop layer through the via opening and exposing the second trench interconnect; and forming a via electrode in the first opening, a via structure in the via opening and a metal line in the second opening by depositing a conductive material in the first opening, in the via opening and in the second opening.

Example 17a: The method of example 16a, wherein etching the opening to form the electrode structure comprises removing the etch stop layer from above a first portion of the first trench interconnect.

Example 18a: The method of example 17a, wherein etching the opening further comprises exposing an uppermost surface of the dielectric adjacent to the first trench interconnect and forming the electrode structure having at least one dimension that is greater than a first width of the first trench interconnect.

Example 19a: The method of example 16a, wherein etching the opening to form the electrode structure comprises forming the electrode structure having a second width that is greater than a third width of the first trench interconnect and removing the etch stop layer from directly above an entire length of the first trench interconnect.

Example 20a: The method of example 17a, wherein the electrode structure is a first electrode structure, wherein the method further comprises forming a second electrode structure above a second portion of the first trench interconnect, the second portion laterally distant from the first portion, wherein the memory device is a first memory device, wherein the first memory device is formed above the first portion and wherein etching the material layer stack forms a second memory device above the second portion of the first trench interconnect.

Example 1b: A device comprising: a first region comprising: a first conductive interconnect within a first level, the first conductive interconnect comprising a first lateral thickness; and a second level above the first level, the second level comprising: a memory device above the first conductive interconnect, the memory device comprising ferroelectric material or paraelectric material, wherein the memory device comprises a second lateral thickness and cylindrical shape; an electrode structure coupled between the memory device and the first conductive interconnect, the electrode structure comprising a third lateral thickness, wherein the first lateral thickness and the third lateral thickness are respectively less than the second lateral thickness; an etch stop layer comprising a dielectric material, the etch stop layer laterally surrounding the electrode structure; an spacer on a sidewall of the memory device and on a portion of the electrode structure; and a via electrode on the memory device; and a second region adjacent to the first region, the second region comprising an interconnect structure, the interconnect structure comprising: a second conductive interconnect within the first level; a metal line within the second level; and a via structure coupling the metal line with the second conductive interconnect, wherein at least a first portion of the via structure is adjacent to the etch stop layer, and wherein at least a second portion of the etch stop layer is on the second conductive interconnect, wherein the electrode structure has a first vertical thickness, the memory device has a second vertical thickness, the via electrode has a third vertical thickness, the via structure has a fourth vertical thickness, and the metal line has a fifth vertical thickness, wherein a sum of the first vertical thickness, the second vertical thickness and the third vertical thickness is substantially equal to a sum of the fourth vertical thickness and the fifth vertical thickness.

Example 2b: The device of example 1b, wherein the memory device comprises: a first conductive layer comprising a non-Pb based perovskite metal oxide, the first conductive layer comprising a first sidewall having a first slope; a ferroelectric dielectric layer comprising a non-Pb based perovskite material on the first conductive layer, the ferroelectric dielectric layer comprising a second sidewall having a second slope; and a second conductive layer comprising non-Pb based perovskite metal oxide on the ferroelectric dielectric layer, the second conductive layer comprising a third sidewall having a third slope, wherein the first slope, the second slope, and the third slope are substantially close to ninety degrees relative to a lowermost surface of the memory device.

Example 3b: The device of example 1b, wherein the electrode structure comprises a cylindrical shape, and the first conductive interconnect comprises a cylindrical shape, wherein the first lateral thickness is a first diameter, and the second lateral thickness is a second diameter, and the third lateral thickness is a third diameter, wherein the third diameter is greater than the first diameter and the second diameter.

Example 4b: The device of example 3b, wherein a first vertical axis of the electrode structure is offset from a second vertical axis of the first conductive interconnect.

Example 5b: The device of example 4b, wherein a third vertical axis of the memory device is offset from the first vertical axis of the electrode structure.

Example 6b: The device of example 1b, wherein a sum of the first vertical thickness and the second vertical thickness is substantially equal to the fourth vertical thickness, and wherein the third vertical thickness is substantially equal to the fifth vertical thickness.

Example 7b: The device of example 1b, wherein a sum of the first vertical thickness and the second vertical thickness is substantially equal to the third vertical thickness, wherein the third vertical thickness is substantially equal to the fifth vertical thickness, and wherein the second vertical thickness is less than 20 nm, and the third vertical thickness is greater than 30 nm but less than 200 nm.

Example 8b: The device of example 1b, wherein the electrode structure extends below an uppermost surface of the first conductive interconnect.

Example 9b: The device of example 1b, wherein the memory device is a first memory device, wherein the electrode structure is a first electrode structure, wherein the spacer is a first spacer, wherein the via electrode is a first via electrode, and wherein the device further comprises: a third conductive interconnect laterally distant from the first conductive interconnect, wherein the third conductive interconnect is behind the first conductive interconnect; a second memory device above the second conductive interconnect; a second electrode structure coupled between the second memory device and the second conductive interconnect; a second spacer on a fourth sidewall of the second memory device; and a second via electrode on the second memory device.

Example 10b: The device of example 9b, wherein the device further comprises a conductive plate coupling the first via electrode and the second via electrode.

Example 11b: The device of example 9b, wherein the first memory device is separated from the second memory device by a spacing of less than 30 nm, where the spacing is measured from a shortest distance between a fifth sidewall of the first electrode structure and a sixth sidewall of the second electrode structure.

Example 12b: The device of example 1b, wherein the etch stop layer has a sixth vertical thickness under the memory device and a seventh vertical thickness adjacent to the via structure, wherein the sixth vertical thickness is greater than the seventh vertical thickness.

Example 13b: The device of example 12b, wherein the first vertical thickness is at least two times greater than the second vertical thickness.

Example 14b: A device comprising: a first region comprising: a first conductive interconnect within a first level, the first conductive interconnect comprising a first sidewall; and a second level above the first level, the second level comprising: a memory device above the first conductive interconnect, the memory device comprising ferroelectric material or paraelectric material, wherein the memory device comprises a second sidewall; an electrode structure coupled between the memory device and the first conductive interconnect, the electrode structure comprising a third sidewall, wherein the first sidewall and the second sidewall extend laterally beyond the third sidewall; an etch stop layer comprising a dielectric material, the etch stop layer laterally surrounding the electrode structure, the etch stop layer further comprising a first portion under the memory device and a second portion adjacent the first portion, wherein the first portion comprises a first vertical thickness the second portion comprises a second vertical thickness and a fourth sidewall; a spacer on a fifth sidewall of the memory device and on the second portion of the etch stop layer; a via electrode on the memory device; and an encapsulation layer on the memory device, adjacent to the spacer and adjacent to the first sidewall; and a second region adjacent to the first region, the second region comprising an interconnect structure, the interconnect structure comprising: a second conductive interconnect within the first level; a metal line within the second level; and a via structure coupling the metal line with the second conductive interconnect, wherein at least a third portion of the via structure is adjacent to the encapsulation layer, and wherein the encapsulation layer is on at least a fourth portion of the second conductive interconnect.

Example 15b: The device of example 14b, wherein the first vertical thickness is greater than the second vertical thickness by at least 2 nm.

Example 16b: The device of example 14b, wherein the spacer comprises a sixth sidewall opposite to the fifth sidewall, wherein the sixth sidewall is substantially aligned with the fourth sidewall.

Example 17b: The device of example 14b, wherein the via electrode is adjacent to a portion of the encapsulation layer on the memory device.

Example 18b: A system comprising: a processor; a communication interface communicatively coupled to the processor; and a memory coupled to the processor, wherein the memory comprises: bit-cells, wherein one of the bit-cells includes: a first region comprising: a first conductive interconnect within a first level, the first conductive interconnect comprising a first sidewall; and a second level above the first level, the second level comprising: a memory device above the first conductive interconnect, the memory device comprising ferroelectric material or paraelectric material, wherein the memory device comprises a second sidewall; an electrode structure coupled between the memory device and the first conductive interconnect, the electrode structure comprising a third sidewall, wherein the first sidewall and the second sidewall extend laterally beyond the third sidewall; an etch stop layer comprising a dielectric material, the etch stop layer laterally surrounding the electrode structure, the etch stop layer further comprising a first portion under the memory device and a second portion adjacent the first portion, wherein the first portion comprises a first vertical thickness the second portion comprises a second vertical thickness and a fourth sidewall; a spacer on a fifth sidewall of the memory device and on the second portion of the etch stop layer; a via electrode on the memory device; and an encapsulation layer on the memory device, adjacent to the spacer and adjacent to the first sidewall; and a second region adjacent to the first region, the second region comprising an interconnect structure, the interconnect structure comprising: a second conductive interconnect within the first level; a metal line within the second level; and a via structure coupling the metal line with the second conductive interconnect, wherein at least a third portion of the via structure is adjacent to the encapsulation layer, and wherein the encapsulation layer is on at least a fourth portion of the second conductive interconnect.

Example 19b: The system of example 18b, wherein the memory device comprises a ferroelectric material.

Example 20b: The system of example 18b, wherein the memory device comprises a paraelectric material.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A method of fabricating a device structure, the method comprising:
    forming a first conductive interconnect in a dielectric in a memory region and a second conductive interconnect in a logic region;
    depositing an etch stop layer on the dielectric and on the first conductive interconnect and on the second conductive interconnect;
    forming an electrode structure on the first conductive interconnect by etching an opening in the etch stop layer and depositing a first conductive material;
    forming a memory device by depositing a material layer stack comprising a ferroelectric material or a paraelectric material on the electrode structure and etching the material layer stack, wherein the electrode structure is wider than the memory device and etching the material layer stack further comprises recessing portions of the electrode structure not under the memory device, and wherein the recessing forms a first surface of the electrode structure adjacent the memory device that is below an uppermost surface of the electrode structure;
    forming a spacer on a sidewall of the memory device by depositing an encapsulation layer and etching the encapsulation layer;
    depositing a dielectric layer on the memory device;
    forming a via electrode on the memory device by forming a first opening in the dielectric layer and depositing a second conductive material in the first opening; and
    forming a via structure on the second conductive interconnect and a metal line on the via structure by patterning a second opening in the dielectric layer and in the etch stop layer.

2. The method of claim 1, wherein depositing the material layer stack comprises depositing at least two layers comprising the ferroelectric material, and wherein the ferroelectric material comprises one of:
    bismuth ferrite (BFO) or BFO with a first doping material where in the first doping material is one of lanthanum or elements from lanthanide series of periodic table;
    lead zirconium titanate (PZT) or PZT with a second doping material, wherein the second doping material is one of La or Nb;
    a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST);
    a perovskite material which includes one of: $BaTiO_3$, $PbTiO_3$, $KNbO_3$, or $NaTaO_3$; a hexagonal ferroelectric which includes one of: $YMnO_3$ or $LuFeO_3$;
        hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); and
    hafnium (Hf), zirconium (Zr), aluminum (Al), silicon (Si), their oxides, or their alloyed oxides; hafnium oxides such as $Hf_{(1-x)}E_xO_y$, where E can be Al, Ca, Ce, Dy, Er, Gd, Ge, La, Sc, Si, Sr, Sn, Zr, or Y; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, y doped $HfO_2$, where x includes one of: Al, Ca, Ce, Dy, Er, Gd, Ge, La, Sc, Si, Sr, Sn, or Y, wherein 'x' is a fraction;

niobate type compounds LiNbO$_3$, LiTaO$_3$, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 and 100, wherein the paraelectric material comprises: SrTiO$_3$, Ba$_{(x)}$Sr$_{(y)}$TiO$_3$ (where x is −0.05, and y is 0.95), HfZrO$_2$, Hf—Si—O, La-substituted PbTiO$_3$, or a PMN-PT based relaxor ferroelectric.

3. The method of claim 2, wherein etching the material layer stack to form the memory device comprises utilizing a reactive ion etching process, and wherein the reactive ion etching process forms the memory device having sidewalls that are tapered relative to a lowermost surface of the memory device.

4. The method of claim 3, wherein the reactive ion etching process etches layers within the material layer stack, and wherein a respective layer in the layers each comprise a respective sidewall with a different slope.

5. The method of claim 2, wherein etching the material layer stack to form the memory device comprises utilizing a reactive ion etching process, and wherein the reactive ion etching process is selective to the etch stop layer.

6. The method of claim 1, wherein forming the spacer further comprises depositing the encapsulation layer on the first surface and below an interface between the memory device and the electrode structure.

7. The method of claim 1, wherein forming the spacer further comprises depositing the encapsulation layer on the first surface wherein the first surface is curved.

8. The method of claim 7, wherein etching the encapsulation layer further comprises recessing a portion of the etch stop layer is below the uppermost surface of the electrode structure.

9. The method of claim 1, wherein the electrode structure is wider than the first conductive interconnect, and wherein etching the opening in the etch stop layer comprises recessing a portion of the dielectric adjacent to the first conductive interconnect and depositing the first conductive material on a sidewall of the first conductive interconnect.

10. The method of claim 6, wherein etching the material layer stack to form the memory device comprises utilizing a reactive ion etching process, and wherein the reactive ion etching process forms the memory device having sidewalls that are vertical relative to a lowermost surface of the memory device.

11. The method of claim 10, wherein the spacer is conformal to the sidewalls that are vertical.

12. The method of claim 10, wherein the first surface is planar, and wherein the electrode structure comprises a vertical sidewall, and wherein the spacer extends onto the vertical sidewall.

13. The method of claim 1, wherein the first surface is sloped, the spacer comprises a lowermost portion that is on the first surface, and wherein the spacer comprises a non-uniform lateral thickness relative to the sidewalls that are vertical.

14. The method of claim 3, wherein the spacer formed by etching the encapsulation layer is conformal to the sidewalls that are tapered.

15. The method of claim 3, wherein forming the spacer comprises using a physical vapor deposition process to deposit the encapsulation layer, and wherein etching the encapsulation layer further comprises forming the spacer comprising a wider top portion adjacent to an uppermost surface of the memory device and a narrower portion adjacent to the electrode structure.

16. The method of claim 8, wherein etching the encapsulation layer further comprises recessing the etch stop layer to a level of the first surface.

17. The method of claim 1, wherein the memory device further comprises a hardmask, wherein the hardmask comprises dual layers comprising a second dielectric layer on a conductive layer, and wherein the via electrode extends through the second dielectric layer and is in contact with an uppermost surface of the conductive layer.

* * * * *